United States Patent
Huh et al.

(10) Patent No.: US 11,968,892 B2
(45) Date of Patent: Apr. 23, 2024

(54) ORGANIC LIGHT EMITTING DEVICE CONTAINING A LIGHT EMITTING LAYER AN ANTHRACENE DERIVATIVE, AND AN ORGANIC MATERIAL LAYER CONTAINING A COMPOUND INCLUDING AS SUSTITUENTS A CYANO GROUP AND A NITROGEN-CONTAINING HETERORING

(71) Applicant: LG CHEM, LTD., Seoul (KR)

(72) Inventors: Jungoh Huh, Daejeon (KR); Sung Kil Hong, Daejeon (KR); Miyeon Han, Daejeon (KR); Jae Tak Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 652 days.

(21) Appl. No.: 17/058,295

(22) PCT Filed: Sep. 20, 2019

(86) PCT No.: PCT/KR2019/012282
§ 371 (c)(1),
(2) Date: Nov. 24, 2020

(87) PCT Pub. No.: WO2020/060320
PCT Pub. Date: Mar. 26, 2020

(65) Prior Publication Data
US 2021/0210694 A1     Jul. 8, 2021

(30) Foreign Application Priority Data
Sep. 20, 2018   (KR) .................. 10-2018-0112963

(51) Int. Cl.
*H10K 85/60*    (2023.01)
*H10K 50/11*    (2023.01)
(Continued)

(52) U.S. Cl.
CPC ......... *H10K 85/654* (2023.02); *H10K 85/626* (2023.02); *H10K 85/6572* (2023.02);
(Continued)

(58) Field of Classification Search
CPC .............. H10K 85/654; H10K 85/626; H10K 85/6572; H10K 85/6574; H10K 50/11;
(Continued)

(56) References Cited

U.S. PATENT DOCUMENTS

| 2004/0251816 A1 | 12/2004 | Leo et al. |
| 2007/0267970 A1 | 11/2007 | Yamamoto et al. |

(Continued)

FOREIGN PATENT DOCUMENTS

| CN | 105980521 | 9/2016 |
| CN | 108003089 A | 5/2018 |

(Continued)

*Primary Examiner* — Caleb E Henry
(74) *Attorney, Agent, or Firm* — BRYAN CAVE LEIGHTON PAISNER LLP

(57) ABSTRACT

Provided is an organic light emitting device comprising: an anode; a cathode; a light emitting layer provided between the anode and the cathode; and an organic material layer provided between the cathode and the light emitting layer, wherein the light emitting layer comprises a compound of Chemical Formula 1, and the organic material layer provided between the cathode and the light emitting layer contains a compound of Chemical Formula 2.

16 Claims, 2 Drawing Sheets

(51) Int. Cl.
  *H10K 50/16* (2023.01)
  *H10K 50/17* (2023.01)
  *H10K 50/18* (2023.01)

(52) U.S. Cl.
  CPC ......... *H10K 85/6574* (2023.02); *H10K 50/11* (2023.02); *H10K 50/16* (2023.02); *H10K 50/171* (2023.02); *H10K 50/18* (2023.02)

(58) Field of Classification Search
  CPC ...... H10K 50/16; H10K 50/171; H10K 50/18; H10K 50/00; H10K 85/615; H10K 99/00; H10K 85/657
  See application file for complete search history.

(56) References Cited

U.S. PATENT DOCUMENTS

| | | | |
|---|---|---|---|
| 2011/0024725 A1 | 2/2011 | Lee et al. | |
| 2011/0121269 A1 | 5/2011 | Lecloux et al. | |
| 2012/0256172 A1 | 10/2012 | Ito et al. | |
| 2014/0001446 A1 | 1/2014 | Mizuki et al. | |
| 2016/0211454 A1* | 7/2016 | Kim | H10K 85/626 |
| 2016/0218297 A1 | 7/2016 | Ito et al. | |
| 2016/0233429 A1* | 8/2016 | Xia | C09K 11/025 |
| 2017/0012217 A1 | 1/2017 | Chun et al. | |
| 2017/0104167 A1 | 4/2017 | Sim et al. | |
| 2018/0066180 A1 | 3/2018 | Huh et al. | |
| 2018/0099986 A1* | 4/2018 | Mazaheripour | C07F 9/6561 |
| 2018/0248127 A1 | 8/2018 | Lee et al. | |
| 2018/0269402 A1* | 9/2018 | Huh | C09K 11/06 |
| 2019/0198766 A1 | 6/2019 | Suh et al. | |
| 2019/0214571 A1 | 7/2019 | Huh et al. | |
| 2019/0267554 A1* | 8/2019 | Yang | H10K 85/6574 |
| 2019/0296243 A1* | 9/2019 | Suh | H10K 85/615 |
| 2019/0337872 A1* | 11/2019 | Saito | C09K 11/06 |
| 2019/0393424 A1* | 12/2019 | Ihn | C09K 11/06 |
| 2019/0393425 A1* | 12/2019 | Ihn | H10K 85/622 |
| 2020/0203621 A1* | 6/2020 | Kim | H10K 85/322 |
| 2020/0235303 A1* | 7/2020 | Kim | H10K 85/653 |
| 2021/0009584 A1 | 1/2021 | Kase et al. | |
| 2021/0104689 A1* | 4/2021 | Kim | H10K 85/322 |
| 2021/0210694 A1* | 7/2021 | Huh | H10K 85/615 |

FOREIGN PATENT DOCUMENTS

| | | |
|---|---|---|
| EP | 3287446 A2 | 2/2018 |
| JP | 2013232521 A | 11/2013 |
| JP | 5898683 | 4/2016 |
| KR | 10-2008-0101793 | 11/2008 |
| KR | 10-2008-0105112 | 12/2008 |
| KR | 10-2011-0041726 | 4/2011 |
| KR | 10-2011-0106397 | 9/2011 |
| KR | 10-2012-0026095 | 3/2012 |
| KR | 10-2012-0104087 | 9/2012 |
| KR | 10-2015-0036725 | 4/2015 |
| KR | 10-2016-0090238 | 7/2016 |
| KR | 10-2016-0126862 | 11/2016 |
| KR | 10-2016-0141360 | 12/2016 |
| KR | 10-2017-0065711 | 6/2017 |
| KR | 20170127376 B1 | 11/2017 |
| KR | 10-2017-0134264 | 12/2017 |
| KR | 10-2018-0061075 | 6/2018 |
| KR | 10-2018-0098809 | 9/2018 |
| KR | 10-2018-0103738 | 9/2018 |
| KR | 10-2018-0111558 | 10/2018 |
| WO | 2003-012890 | 2/2003 |
| WO | 2011-028216 | 3/2011 |
| WO | 2018-164512 | 9/2018 |
| WO | 2019181997 A1 | 9/2019 |

* cited by examiner

【FIG. 1】
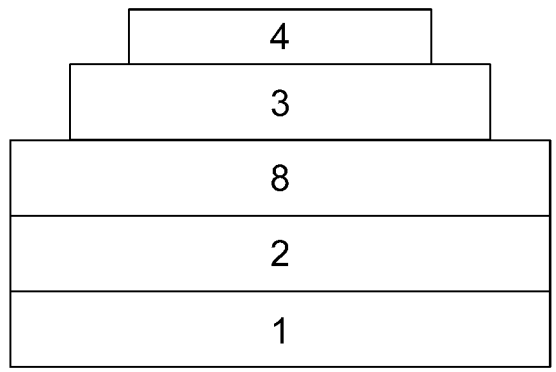
【FIG. 2】
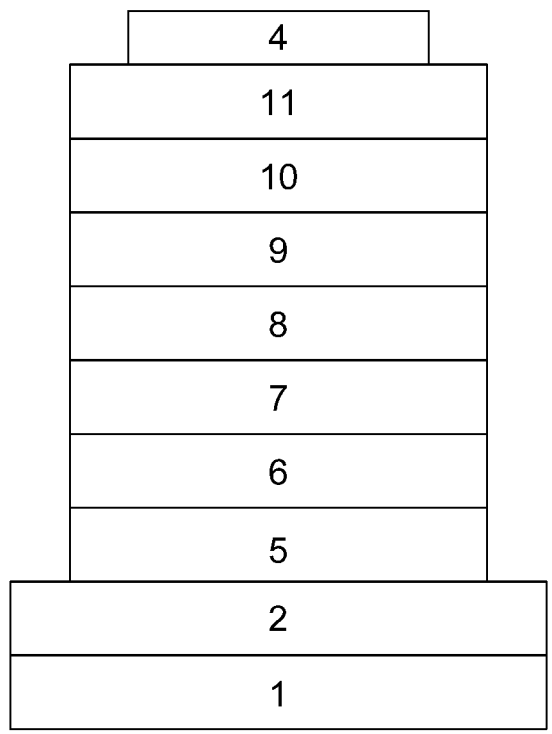

【FIG. 3】
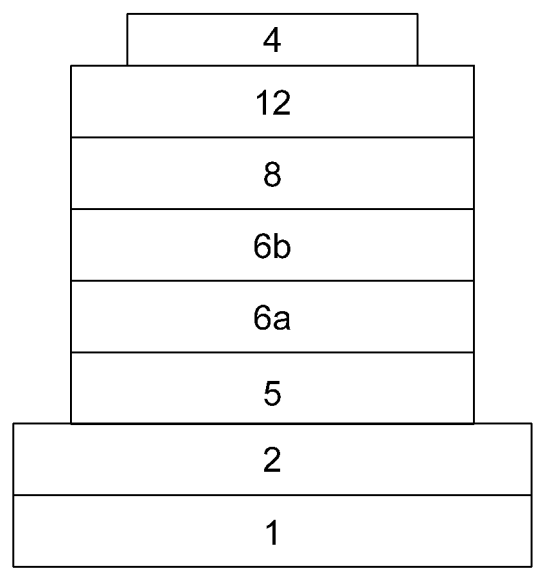

ORGANIC LIGHT EMITTING DEVICE CONTAINING A LIGHT EMITTING LAYER AN ANTHRACENE DERIVATIVE, AND AN ORGANIC MATERIAL LAYER CONTAINING A COMPOUND INCLUDING AS SUSTITUENTS A CYANO GROUP AND A NITROGEN-CONTAINING HETERORING

CROSS-REFERENCE TO RELATED APPLICATION(S)

This application is a National Stage Application of International Application No. PCT/KR2019/012282 filed on Sep. 20, 2019, which claims priority to and the benefits of Korean Patent Application No. 10-2018-0112963, filed with the Korean Intellectual Property Office on Sep. 20, 2018, the entire contents of which are incorporated herein by reference.

TECHNICAL FIELD

The present disclosure relates to an organic light emitting device comprising a compound of Chemical Formula 1 in a light emitting layer, and a compound of Chemical Formula 2 in an organic material layer provided between a cathode and the light emitting layer.

BACKGROUND

An organic light emission phenomenon generally refers to a phenomenon converting electrical energy to light energy using an organic material. An organic light emitting device using an organic light emission phenomenon normally has a structure comprising an anode, a cathode, and an organic material layer therebetween. Herein, the organic material layer is formed in a multilayer structure famed with different materials in order to increase efficiency and stability of the organic light emitting device, and for example, can be formed with a hole injection layer, a hole transfer layer, a light emitting layer, an electron transfer layer, an electron injection layer and the like. When a voltage is applied between the two electrodes in such an organic light emitting device structure, holes and electrons are injected to the organic material layer from the anode and the cathode, respectively, and when the injected holes and electrons meet, excitons are formed, and light emits when these excitons fall back to the ground state.
Development of new materials for such an organic light emitting device has been continuously required.

Prior Art Documents

Patent Documents Korean Patent Application Laid-Open Publication No. 10-2008-0101793

BRIEF DESCRIPTION

Technical Problem

The present disclosure is directed to providing an organic light emitting device having low driving voltage, high efficiency, excellent lifetime properties or high color purity by comprising a compound of Chemical Formula 1 in a light emitting layer, and a compound of Chemical Formula 2 in an organic material layer provided between a cathode and the light emitting layer.

Technical Solution

One embodiment of the present specification provides an organic light emitting device comprising an anode; a cathode; a light emitting layer provided between the anode and the cathode; and an organic material layer provided between the cathode and the light emitting layer, wherein the light emitting layer comprises a compound of the following Chemical Formula 1, and the organic material layer provided between the cathode and the light emitting layer comprises a compound of the following Chemical Formula 2:

Chemical Formula 1

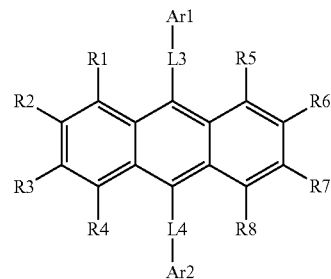

wherein in Chemical Formula 1:
L3 is a direct bond or a substituted or unsubstituted arylene group, or bonds to R1 to form a substituted or unsubstituted ring;
L4 is a direct bond or a substituted or unsubstituted arylene group;
Ar1 and Ar2 are the same as or different from each other, and each independently is hydrogen, deuterium, a substituted or unsubstituted aryl group, or a substituted or unsubstituted heteroaryl group;
R1 is hydrogen, deuterium, a substituted or unsubstituted alkyl group, —OR, —SiRaRbRc, —OSiRaRbRc, a substituted or unsubstituted aryl group, or —NRmRn, or bonds to L3 to form a substituted or unsubstituted ring;
R2 to R8 are the same as or different from each other, and each independently is hydrogen, deuterium, a substituted or unsubstituted alkyl group, —OR, —SiRaRbRc, —OSiRaRbRc, a substituted or unsubstituted aryl group, or —NRmRn;
R, Ra, Rb, Rc, Rm and Rn are the same as or different from each other, and each independently is hydrogen, deuterium, an alkyl group or an aryl group; and
the compound of Chemical Formula 1 comprises at least one deuterium;

Chemical Formula 2

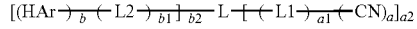

wherein in Chemical Formula 2:
HAr is a substituted or unsubstituted nitrogen-containing heterocyclic group;
L is a direct bond, —O—, a substituted or unsubstituted divalent to tetravalent aryl group, or a substituted or unsubstituted divalent to tetravalent heteroaryl group;
L1 and L2 are the same as or different from each other, and each independently a direct bond, a substituted or unsubstituted arylene group, or a substituted or unsubstituted heteroarylene group;

a1 is an integer of 0 to 3, and when a1 is 2 or greater, the L1s are the same as or different from each other;

b1 is an integer of 0 to 3, and when b1 is 2 or greater, the L2s are the same as or different from each other;

a is 1 or 2;

b is 1 or 2, and when b is 2, the HArs are the same as or different from each other;

a2 is 1 or 2, and b2 is 1 or 2, when a2 is 2, 0the $-[(L1)_{a1}-(CN)_a]$s are the same as or different from each other, and when b2 is 2, the $-[(L2)_{b1}-(HAr)_b]$s are the same as or different from each other.

Advantageous Effects

An organic light emitting device according to one embodiment of the present specification is effective in obtaining low driving voltage, high efficiency, excellent lifetime properties or high color purity.

DESCRIPTION OF DRAWINGS

FIG. 1 illustrates an example of an organic light emitting device formed with a substrate (1), an anode (2), a light emitting layer (8), an organic material layer (3) and a cathode (4).

FIG. 2 illustrates an example of an organic light emitting device famed with a substrate (1), an anode (2), a hole injection layer (5), a hole transfer layer (6), a hole control layer (7), a light emitting layer (8), an electron control layer (9), an electron transfer layer (10), an electron injection layer (11) and a cathode (4).

FIG. 3 illustrates an example of an organic light emitting device famed with a substrate (1), an anode (2), a hole injection layer (5), a first hole transfer layer (6a), a second hole transfer layer (6b), a light emitting layer (8), an electron injection and transfer layer (12) and a cathode (4).

REFERENCE NUMERALS

1: Substrate
2: Anode
3: Organic Material Layer
4: Cathode
5: Hole Injection Layer
6: Hole Transfer Layer
6a: First Hole Transfer Layer
6b: Second Hole Transfer Layer
7: Hole Control Layer
8: Light Emitting Layer
9: Electron Control Layer
10: Electron Transfer Layer
11: Electron Injection Layer
12: Electron Injection and Transfer Layer

DETAILED DESCRIPTION

Hereinafter, the present disclosure will be described in more detail. However, the following descriptions relate to one embodiment of the present disclosure, and comprises all substitutable ranges within the range of equivalents.

First, several terms in the present specification will be clarified.

In the present specification, -⧽- means a site bonding to other substituents or bonding sites.

In the present specification, a term such as "comprise" or "have" means features or constituents described in the specification being present, and does not exclude the possibility of adding one or more other features or constituents in advance.

In the present specification, a description of a part such as an area or a layer being provided above or on another part comprises not only a case of the part being directly above the another part, but also a case of other areas, layers or the like being provided therebetween.

In the present specification, "deuterated" means hydrogen being replaced by deuterium. A certain compound being "deuterated" means one or more hydrogens present in the compound being replaced by deuterium. An X % deuterated compound or group means X % of available hydrogen being replaced by deuterium.

In the present specification, a deuterated ratio of a certain compound means a ratio occupied by the number of deuteriums with respect to the sum of the number of hydrogens and the number of deuteriums present in the compound.

In the present specification, when all hydrogens that can be present in the compound are substituted with deuterium, this is expressed as being 100% deuterated.

In the present specification, examples of the halogen group can comprise fluorine, chlorine, bromine or iodine.

In the present specification, the alkyl group means linear or branched saturated hydrocarbon. The number of carbon atoms of the alkyl group is not particularly limited, but is preferably from 1 to 40. According to one embodiment, the number of carbon atoms of the alkyl group is from 1 to 20. According to another embodiment, the number of carbon atoms of the alkyl group is from 1 to 10. According to another embodiment, the number of carbon atoms of the alkyl group is from 1 to 6. The alkyl group can be a chain-type or a ring-type.

Specific examples of the chain-type alkyl group can comprise a methyl group, an ethyl group, an n-propyl group, an isopropyl group, an n-butyl group, a tert-butyl group, a sec-butyl group, a 1-methylbutyl group, a 1-ethylbutyl group, an n-pentyl group, an isopentyl group, a neopentyl group, an n-hexyl group, a 1-methylpentyl group, a 2-methylpentyl group, a 4-methylpentyl group, a 3,3-dimethylbutyl group, a 2-ethylbutyl group, an n-heptyl group, an n-octyl group, a tert-octyl group, a 1-methylheptyl group, a 2-ethylhexyl group, a 2-propylpentyl group, an n-nonyl group, a 2,2-dimethylheptyl group, a 1-ethylpropyl group, a 1,1-dimethylpropyl group, an isohexyl group, a 4-methylhexyl group, a 5-methylhexyl group and the like, but are not limited thereto.

The number of carbon atoms of the ring-type alkyl group (cycloalkyl group) is not particularly limited, but is preferably from 3 to 40. According to one embodiment, the number of carbon atoms of the cycloalkyl group is from 3 to 24. According to another embodiment, the number of carbon atoms of the cycloalkyl group is from 3 to 14. According to another embodiment, the number of carbon atoms of the cycloalkyl group is from 3 to 8. Specific examples of the cycloalkyl group can comprise a cyclopropyl group, a cyclobutyl group, a cyclopentyl group, a 3-methylcyclopentyl group, a 2,3-dimethylcyclopentyl group, a cyclohexyl group, a 3-methylcyclohexyl group, a 4-methylcyclohexyl group, a 2,3-dimethylcyclohexyl group, a 3,4,5-trimethylcyclohexyl group, a 4-tert-butylcyclohexyl group, a cycloheptyl group, a cyclooctyl group and the like, but are not limited thereto.

In the present specification, the aryl group means monovalent aromatic hydrocarbon or a monovalent group of an aromatic hydrocarbon derivative. In the present specification, the aromatic hydrocarbon means a compound comprising a planar ring having pi electrons completely conjugated, and the group derived from the aromatic hydrocarbon means a structure in which aromatic hydrocarbon or ring-type aliphatic hydrocarbon is fused to the aromatic hydrocarbon. In addition, in the present specification, the aryl group comprises a monovalent group in which two or more aromatic hydrocarbon or aromatic hydrocarbon derivatives are linked to each other. According to one embodiment, the number of carbon atoms of the aryl group is from 6 to 36, 6 to 30 or 6 to 25. According to one embodiment, the number of carbon atoms of the aryl group is from 6 to 18. According to one embodiment, the number of carbon atoms of the aryl group is from 6 to 13.

The aryl group can be monocyclic or polycyclic. Examples of the monocyclic aryl group can comprise a phenyl group, a biphenyl group, a terphenyl group, a quaterphenyl group and the like, but are not limited thereto. Examples of the polycyclic aryl group can comprise a naphthyl group, an anthracenyl group, a phenanthrenyl group, a perylenyl group, a fluoranthenyl group, a triphenylenyl group, a pyrenyl group, a tetracenyl group, a chrysenyl group, a fluorenyl group, an indenyl group, an acenaphthyl group, a benzofluorenyl group and the like, but are not limited thereto.

In the present specification, when it describes that the fluorenyl group can be substituted, the substituted fluorenyl group also comprises a compound in which substituents of the 5-membered ring of the fluorene Spiro bond to each other to form an aromatic hydrocarbon ring. The substituted fluorenyl group comprises a 9,9'-spirobifluorenyl group, a spiro[cyclopentane-1,9'-fluoren]yl group, a spiro[benzo[c]fluorene-7,9-fluoren]yl group and the like, but are not limited thereto.

In the present specification, the heterocyclic group means a monovalent heteroring. The heteroring can be an aromatic heteroring; or an aliphatic heteroring. In one embodiment, the number of carbon atoms of the heteroring is not particularly limited, but is preferably from 2 to 40. According to one embodiment, the number of carbon atoms of the heteroring is from 2 to 30. According to another embodiment, the number of carbon atoms of the heteroring is from 2 to 20.

In the present specification, the aliphatic heteroring means an aliphatic ring comprising one or more of heteroatoms. Examples of the aliphatic heteroring can comprise oxirane, tetrahydrofuran, 1,4-dioxane, pyrrolidine, piperidine, morpholine, oxepane, azokane, thiokane and the like, but are not limited thereto.

In the present specification, the aromatic heteroring means an aromatic ring comprising one or more of heteroatoms. Examples of the aromatic heteroring can comprise pyridine, pyrrole, pyrimidine, pyridazine, furan, thiophene, imidazole, parazole, oxazole, isoxazole, triazole, isothiazole, triazole, oxadiazole, thiadiazole, dithiazole, tetrazole, pyran, thiopyran, diazine, oxazine, triazine, dioxin, triazine, tetrazine, isoquinoline, quinoline, quinazoline, quinoxaline, naphthyridine, acridine, phenanthridine, diazanaphthalene, triazaindene, indole, indolizine, benzothiazole, benzoxazole, benzimidazole, benzothiophene, benzofuran, dibenzothiophene, dibenzofuran, carbazole, benzocarbazole, dibenzocarbazole, phenazine, imidazo-pyridine, phenoxazine, phenanthridine, indolocarbazole, indenocarbazole and the like, but are not limited thereto.

In the present specification, the heteroaryl group means a monovalent aromatic heteroring.

In the present specification, descriptions on the aryl group can be applied to the arylene group except for being divalent.

In the present specification, descriptions on the heteroaryl group can be applied to the heteroarylene group except for being divalent.

Hereinafter, an organic light emitting device according to one embodiment of the present specification, and a compound included therein will be described.

One embodiment of the present specification provides an organic light emitting device comprising an anode; a cathode; a light emitting layer provided between the anode and the cathode; and an organic material layer provided between the cathode and the light emitting layer, wherein the light emitting layer comprises a compound of Chemical Formula 1, and the organic material layer provided between the cathode and the light emitting layer comprises a compound of Chemical Formula 2.

In one embodiment, the compound of Chemical Formula 1 comprises at least one deuterium. When hydrogen is replaced by deuterium, chemical properties of a compound hardly change. However, since the atomic weight of deuterium is twice the atomic weight of hydrogen, physical properties of the deuterated compound can change. For example, a compound substituted with deuterium has a decreased vibration energy level. The decrease in the vibration energy level can prevent a decrease in the intermolecular van der Waals force or a decrease in the quantum efficiency caused by collision resulting from intermolecular vibration. As a result, device efficiency and lifetime can be improved by the compound of Chemical Formula 1 comprising deuterium.

The compound of Chemical Formula 2 comprises a nitrogen-containing heteroring and CN.

A nitrogen-containing heteroring widely used as an electron injection and transfer material generally has very superior electron injection and transfer abilities. This makes an excessive amount of electrons compared to holes pass to the light emitting layer causing an imbalance between the amounts of holes and electrons in the light emitting layer. In addition, in the light emitting area, this makes excitons produced by an electron-hole pair accumulate at an interface between the hole transfer layer and the light emitting layer causing a decrease in the efficiency and the lifetime of the device.

In the compound of Chemical Formula 2 of the present disclosure, a strong electron acceptor substituent such as CN is introduced to the nitrogen-containing heteroring, and therefore, a dipolar moment of the compound increases at the same time as the lowest unoccupied molecular orbital (LUMO) decreases. As a result, a migrating rate of the electrons passing to the light emitting layer is controlled, which can increase efficiency and lifetime of the device.

Hereinafter, one embodiment of the compound of Chemical Formula 1 will be described.

According to one embodiment of the present specification, Ar1 and Ar2 are the same as or different from each other, and each independently is hydrogen, deuterium, an aryl group unsubstituted or substituted with deuterium, or a heteroaryl group unsubstituted or substituted with deuterium, or an aryl group unsubstituted or substituted with deuterium.

According to one embodiment of the present specification, Ar1 and Ar2 are the same as or different from each other, and each independently is hydrogen, deuterium, a substituted or unsubstituted C6-C22 aryl group, or a substituted or unsubstituted C2-C22 heteroaryl group.

According to one embodiment of the present specification, Ar1 and Ar2 are the same as or different from each other, and each independently is hydrogen, deuterium, a substituted or unsubstituted C6-C18 aryl group, or a substituted or unsubstituted C2-C18 heteroaryl group.

According to one embodiment of the present specification, Ar1 and Ar2 are the same as or different from each other, and each independently is hydrogen, deuterium, an aryl group that is unsubstituted or substituted with $T_1$, or a heteroaryl group that is unsubstituted or substituted with $T_2$.

According to one embodiment of the present specification, Ar1 and Ar2 are the same as or different from each other, and each independently is hydrogen, deuterium, a C6-C18 aryl group that is unsubstituted or substituted with $T_1$, or a C2-C18 heteroaryl group that is unsubstituted or substituted with $T_2$.

According to one embodiment of the present specification, Ar1 and Ar2 are the same as or different from each other, and each independently is hydrogen, deuterium, a phenyl group that is unsubstituted or substituted with $T_1$, a biphenyl group that is unsubstituted or substituted with $T_1$, a naphthyl group that is unsubstituted or substituted with $T_1$, a phenanthrenyl group that is unsubstituted or substituted with $T_1$, a fluoranthenyl group that is unsubstituted or substituted with $T_1$, a pyridinyl group that is unsubstituted or substituted with $T_2$, a dibenzofuranyl group that is unsubstituted or substituted with $T_2$, a dibenzothiophenyl group that is unsubstituted or substituted with $T_2$, or a benzonaphthothiophenyl group that is unsubstituted or substituted with $T_2$.

According to one embodiment of the present specification, $T_1$ and $T_2$ are the same as or different from each other, and each independently is deuterium or an aryl group that is unsubstituted or substituted with deuterium.

According to one embodiment of the present specification, $T_1$ is deuterium.

According to one embodiment of the present specification, Ar1 and Ar2 are the same as or different from each other, and each independently is hydrogen, deuterium, a phenyl group that is unsubstituted or substituted with deuterium, a naphthylphenyl group that is unsubstituted or substituted with deuterium, a biphenyl group that is unsubstituted or substituted with deuterium, a naphthyl group that is unsubstituted or substituted with deuterium, a phenanthrenyl group that is unsubstituted or substituted with deuterium, a fluoranthenyl group that is unsubstituted or substituted with deuterium, a phenylpyridinyl group that is unsubstituted or substituted with deuterium, a dibenzofuranyl group that is unsubstituted or substituted with deuterium, a dibenzothiophenyl group that is unsubstituted or substituted with deuterium, or a benzonaphthothiophenyl group that is unsubstituted or substituted with deuterium.

According to one embodiment of the present specification, Ar1 and Ar2 are the same as or different from each other, and each independently is hydrogen, deuterium, a phenyl group that is unsubstituted or substituted with deuterium, a biphenyl group that is unsubstituted or substituted with deuterium, a naphthyl group that is unsubstituted or substituted with deuterium, a phenylpyridinyl group that is unsubstituted or substituted with deuterium, a dibenzofuranyl group that is unsubstituted or substituted with deuterium, a dibenzothiophenyl group that is unsubstituted or substituted with deuterium, or a benzonaphthothiophenyl group that is unsubstituted or substituted with deuterium.

According to one embodiment of the present specification, L3 is a direct bond or an arylene group that is unsubstituted or substituted with deuterium, or bonds to R1 to form a ring that is unsubstituted or substituted with deuterium.

According to one embodiment of the present specification, L3 is a direct bond or a phenylene group that is unsubstituted or substituted with deuterium, or bonds to R1 to form an indene ring that is unsubstituted or substituted with deuterium.

In the present specification, L3 bonding to R1 to form an indene ring means that the ring famed by L3 and R1 bonding to each other is an indene ring like the part expressed as a dotted line in the following Chemical Formula 1A. In the following Chemical Formula 1A, R1 to R8 are not shown.

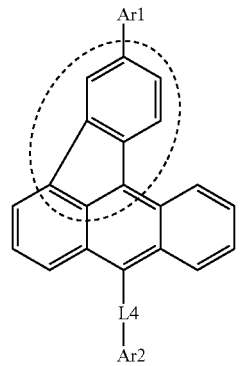

Chemical Formula 1A

According to one embodiment of the present specification, L3 is a direct bond, or bonds to L1 to form an indene ring that is unsubstituted or substituted with deuterium.

According to one embodiment of the present specification, L4 is a direct bond.

According to one embodiment of the present specification, L3 is a direct bond, or bonds to L1 to form an indene ring that is unsubstituted or substituted with deuterium, and Ar1 is a substituted or unsubstituted aryl group or a substituted or unsubstituted heteroaryl group.

According to one embodiment of the present specification, L3 is a direct bond, or bonds to L1 to form an indene ring that is unsubstituted or substituted with deuterium, and Ar1 is an aryl group that is unsubstituted or substituted with $T_1$, or a heteroaryl group that is unsubstituted or substituted with $T_2$.

According to one embodiment of the present specification, L3 is a direct bond, or bonds to L1 to form an indene ring that is unsubstituted or substituted with deuterium, and Ar1 is a C6-C18 aryl group that is unsubstituted or substituted with $T_1$, or a C2-C18 heteroaryl group that is unsubstituted or substituted with $T_2$.

According to one embodiment of the present specification, L4 is a direct bond, and Ar2 is a substituted or unsubstituted aryl group.

According to one embodiment of the present specification, L4 is a direct bond, Ar2 is an aryl group that is unsubstituted or substituted with $T_3$, and $T_3$ is deuterium, or an aryl group that is unsubstituted or substituted with deuterium.

According to one embodiment of the present specification, L4 is a direct bond, Ar2 is a C6-C18 aryl group that is unsubstituted or substituted with $T_3$, and $T_3$ is deuterium, or a C6-C12 aryl group that is unsubstituted or substituted with deuterium.

The compound of Chemical Formula 1 is 10% or more deuterated according to one embodiment, 20% or more deuterated according to one embodiment, 30% or more deuterated according to one embodiment, 40% or more deuterated according to one embodiment, 50% or more deuterated according to one embodiment, 60% or more deuterated according to one embodiment, 70% or more deuterated according to one embodiment, 80% or more deuterated according to one embodiment, 90% or more deuterated according to one embodiment, and 100% deuterated according to one embodiment.

According to one embodiment of the present specification, R1 is hydrogen, deuterium, an alkyl group that is unsubstituted or substituted with deuterium, or an aryl group that is unsubstituted or substituted with deuterium, or bonds to L3 to form a ring that is unsubstituted or substituted with deuterium.

According to one embodiment of the present specification, R1 is hydrogen or deuterium, or bonds to L3 to form a ring that is unsubstituted or substituted with deuterium.

According to one embodiment of the present specification, R1 is hydrogen or deuterium, or bonds to L3 to form an indene ring that is unsubstituted or substituted with deuterium.

According to one embodiment of the present specification, R2 to R8 are the same as or different from each other, and each independently is hydrogen, deuterium, an alkyl group that is unsubstituted or substituted with deuterium, or an aryl group that is unsubstituted or substituted with deuterium.

According to one embodiment of the present specification, R2 to R8 are the same as or different from each other, and each independently is hydrogen, deuterium, or an aryl group that is unsubstituted or substituted with deuterium.

According to one embodiment of the present specification, at least one of R1 to R8 is deuterium.

According to one embodiment of the present specification, at least one of R1 to R4 is deuterium. According to one embodiment of the present specification, R1 is deuterium.

According to one embodiment of the present specification, R2 is deuterium.

According to one embodiment of the present specification, R3 is deuterium.

According to one embodiment of the present specification, R4 is deuterium.

According to one embodiment of the present specification, R1 to R4 are each deuterium.

According to one embodiment of the present specification, R5 is deuterium.

According to one embodiment of the present specification, R6 is deuterium or an aryl group that is unsubstituted or substituted with deuterium.

According to one embodiment of the present specification, R7 is deuterium.

According to one embodiment of the present specification, R8 is deuterium.

According to one embodiment of the present specification, at least one of L3 and L4 is deuterated.

According to one embodiment of the present specification, at least one of Ar1 and Ar2 is deuterium or a deuterated aryl group.

In one embodiment of the present specification, the compound of Chemical Formula 1 is substituted with one or more deuteriums. Such a deuterated compound can be prepared using known deuteration reactions. According to one embodiment of the present specification, the compound of Chemical Formula 1 can be formed using a deuterated compound as a precursor, or can have deuterium introduced to a compound using a deuterated solvent through a hydrogen-deuterium exchange reaction under an acid catalyst.

In the present specification, the degree of deuteration can be identified using known methods such as nuclear magnetic resonance spectroscopy ($^1$H NMR) or GC/MS.

Hereinafter, one embodiment of the compound of Chemical Formula 2 will be described.

According to one embodiment of the present specification, HAr is a substituted or unsubstituted nitrogen-containing heterocyclic group.

According to one embodiment of the present specification, HAr is a substituted or unsubstituted C2-C42 nitrogen-containing heterocyclic group.

According to one embodiment of the present specification, HAr is a substituted or unsubstituted C2-C38 nitrogen-containing heterocyclic group.

According to one embodiment of the present specification, HAr is a substituted or unsubstituted C2-C34 nitrogen-containing heterocyclic group.

According to one embodiment of the present specification, HAr is a substituted or unsubstituted C2-C30 nitrogen-containing heterocyclic group.

According to one embodiment of the present specification, HAr is a heterocyclic group that is substituted or unsubstituted and containing two or more Ns.

According to one embodiment of the present specification, HAr is a substituted or unsubstituted nitrogen-containing heterocyclic group having 1 ring to 8 rings.

According to one embodiment of the present specification, HAr is a nitrogen-containing heterocyclic group that is unsubstituted or substituted with R51. According to one embodiment of the present specification, R51 is hydrogen, deuterium, a cyano group, an aryl group that is unsubstituted or substituted with a cyano group or an aryl group, or a heteroaryl group.

According to one embodiment of the present specification, R51 is hydrogen; deuterium; a cyano group; a phenyl group that is unsubstituted or substituted with a cyano group; a biphenyl group; a diphenylfluorenyl group; or a spiro[fluorene-9,9'-xanthenyl] group.

According to one embodiment of the present specification, HAr is a pyrrolyl group, an imidazolyl group, a pyridinyl group, a bipyridinyl group, a pyrimidinyl group, a triazinyl group, a triazolyl group, an acridinyl group, a spirofluoreneindoloacridinyl group, a pyridazinyl group, a pyrazinyl group, a quinolinyl group, a quinazolinyl group, a benzimidazoquinazolinyl group; a quinoxalinyl group, a phthalazinyl group, a pyridopyrimidyl group, a pyridopyrazinyl group, a pyrazinopyrazinyl group, an isoquinolinyl group, an indolyl group, a carbazolyl group, an imidazolyl group, a benzimidazolyl group, a benzothiazolyl group, a benzocarbazolyl group, a phenanthrolinyl group, a benzimidazophenanthridinyl group, an aziridinyl group, an azaindolyl group, an isoindolyl group, an indazolyl group, a purinyl group, a pteridinyl group, a beta-carbolyl group, a naphthyridinyl group, a tert-pyridyl group, a phenazinyl group, an imidazopyridinyl group, a pyropyridinyl group, an azepinyl group or a pyrazolyl group, and can be substituted with R51.

According to one embodiment of the present specification, HAr is a substituted or unsubstituted pyrimidinyl group; a substituted or unsubstituted pyridinyl group, a substituted or unsubstituted triazinyl group, a substituted or unsubstituted carbazolyl group, a substituted or unsubstituted imidazolyl group, a substituted or unsubstituted benzimidazolyl group, a substituted or unsubstituted phenanthrolinyl group, a substituted or unsubstituted benzo[4,5]imidazo[1,2-c]quinazolinyl group, a substituted or unsubstituted benzo[4,5]imidazo[1,2-f]phenanthridinyl group, or a substituted or unsubstituted spiro[fluorene-9,8'-indolo[3,2,1-di]acridinyl] group.

According to one embodiment of the present specification, L is a direct bond, a substituted or unsubstituted divalent to tetravalent aryl group, or a substituted or unsubstituted divalent to tetravalent heteroaryl group.

According to one embodiment of the present specification, L is a direct bond, —O—, a substituted or unsubstituted C6-C36 divalent to tetravalent aryl group, or a substituted or unsubstituted C2-C36 divalent to tetravalent heteroaryl group.

According to one embodiment of the present specification, L is a direct bond, —O—, a substituted or unsubstituted C6-C30 divalent to tetravalent aryl group, or a substituted or unsubstituted C2-C30 divalent to tetravalent heteroaryl group.

According to one embodiment of the present specification, L is a direct bond, —O—, a substituted or unsubstituted C6-C25 divalent to tetravalent aryl group, or a substituted or unsubstituted C2-C25 divalent to tetravalent heteroaryl group.

According to one embodiment of the present specification, L is a direct bond, —O—, a divalent to tetravalent aryl group unsubstituted or substituted with R52, or a divalent to tetravalent heteroaryl group unsubstituted or substituted with R53.

According to one embodiment of the present specification, R52 and R53 are the same as or different from each other, and each independently is deuterium, a cyano group, an alkyl group, an aryl group that is unsubstituted or substituted with a cyano group or an aryl group; or a heteroaryl group.

According to one embodiment of the present specification, R52 is hydrogen.

According to one embodiment of the present specification, R53 is hydrogen.

According to one embodiment of the present specification, L is a direct bond, —O—, a substituted or unsubstituted divalent to tetravalent phenyl group, a substituted or unsubstituted divalent to tetravalent biphenyl group; a substituted or unsubstituted divalent to tetravalent naphthyl group, a substituted or unsubstituted divalent to tetravalent fluorenyl group; a substituted or unsubstituted divalent to tetravalent anthracenyl group, a substituted or unsubstituted divalent to tetravalent spiro[fluorene-9,9'-xanthene] group; a substituted or unsubstituted divalent to tetravalent pyridinyl group, a substituted or unsubstituted divalent to tetravalent carbazolyl group, a substituted or unsubstituted divalent to tetravalent benzimidazole group, or a substituted or unsubstituted divalent to tetravalent dibenzofuranyl group.

In some embodiments of L, the substituent in the "substituted or unsubstituted" can be deuterium; a cyano group; an aryl group unsubstituted or substituted with deuterium, an alkyl group, a cyano group or a heteroaryl group; or a heteroaryl group unsubstituted or substituted with deuterium, a cyano group or an aryl group.

According to one embodiment of the present specification, L1 and L2 are the same as or different from each other, and each independently is a direct bond, a substituted or unsubstituted C6-C36 arylene group, or a substituted or unsubstituted C2-C36 heteroarylene group.

According to one embodiment of the present specification, L1 and L2 are the same as or different from each other, and each independently is a direct bond, a substituted or unsubstituted C6-C30 arylene group, or a substituted or unsubstituted C2-C30 heteroarylene group.

According to one embodiment of the present specification, L1 and L2 are the same as or different from each other, and each independently is a direct bond, a substituted or unsubstituted C6-C25 arylene group, or a substituted or unsubstituted C2-C5 heteroarylene group.

According to one embodiment of the present specification, L1 and L2 are the same as or different from each other, and each independently is a direct bond, a substituted or unsubstituted phenylene group, a substituted or unsubstituted biphenylene group, a substituted or unsubstituted naphthylenylene group; a substituted or unsubstituted fluorenylene group, a substituted or unsubstituted anthracenylene group; a substituted or unsubstituted divalent spiro[fluorene-9,9'-xanthene] group, a substituted or unsubstituted divalent pyridinyl group, a substituted or unsubstituted divalent carbazole group, a substituted or unsubstituted divalent benzimidazole group, or a substituted or unsubstituted divalent dibenzofuranyl group.

According to one embodiment of the present specification, L1 and L2 are the same as or different from each other, and each independently is a direct bond; a C6-C25 arylene group unsubstituted or substituted with deuterium, an alkyl group, a cyano group, an aryl group, an aryl group substituted with a cyano group, an aryl group substituted with an alkyl group, an aryl group substituted with an aryl group, an aryl group substituted with a heteroaryl group, or a heteroaryl group; or a C2-C5 heteroarylene group unsubstituted or substituted with deuterium, an alkyl group, a cyano group, an aryl group, an aryl group substituted with a cyano group, an aryl group substituted with an alkyl group, an aryl group substituted with an aryl group, an aryl group substituted with a heteroaryl group, or a heteroaryl group.

In some embodiments of L1 and L2, the substituent in the "substituted or unsubstituted" can be deuterium; a cyano group; an aryl group that is unsubstituted or substituted with deuterium, an alkyl group, a cyano group or a heteroaryl group; or a heteroaryl group that is unsubstituted or substituted with deuterium, a cyano group or an aryl group.

According to one embodiment of the present specification, not all of L, -(L1)$_{a1}$- and -(L2)$_{b1}$- are a direct bond.

According to one embodiment of the present specification, at least two of L, -(L1)$_{a1}$- and -(L2)$_{b1}$- are not a direct bond.

According to one embodiment of the present specification, at least one of L, -(L1)$_{a1}$- and -(L2)$_{b1}$- is a substituted or unsubstituted arylene group.

According to one embodiment of the present specification, L, L1 and L2 are the same as or different from each other, and each independently is a direct bond, a substituted or unsubstituted arylene group, or a substituted or unsubstituted heteroarylene group.

According to one embodiment of the present specification, L1 and L2 are the same as or different from each other, and each independently is a direct bond, an arylene group that is unsubstituted or substituted with R61, or a heteroarylene group that is unsubstituted or substituted with R62.

According to one embodiment of the present specification, R61 and R62 are the same as or different from each other, and each independently is deuterium, a cyano group, an alkyl group, an aryl group, or a heteroaryl group.

According to one embodiment of the present specification, R61 and R62 are the same as or different from each other, and each independently is deuterium, a cyano group, a methyl group, a phenyl group, a dibenzofuranyl group, or a pyridinyl group.

According to one embodiment of the present specification, a is 1.

According to one embodiment of the present specification, a is 2.

According to one embodiment of the present specification, b is 1.

According to one embodiment of the present specification, b is 2.

According to one embodiment of the present specification, a1 and b1 are each 0.

According to one embodiment of the present specification, a sum of a1 and b1 is 1 or greater.

According to one embodiment of the present specification, a sum of a1 and b1 is 2.

According to one embodiment of the present specification, a sum of a1 and b1 is 3.

According to one embodiment of the present specification, a sum of a1 and b1 is 4.

According to one embodiment of the present specification, a2 is 1.

According to one embodiment of the present specification, b2 is 1.

According to one embodiment of the present specification, L is a substituted or unsubstituted divalent to tetravalent heteroaryl group, or at least any one of L1 and L2 is a substituted or unsubstituted heteroarylene group.

According to one embodiment of the present specification, the compound of Chemical Formula 2 is any one compound selected from among the following compounds:

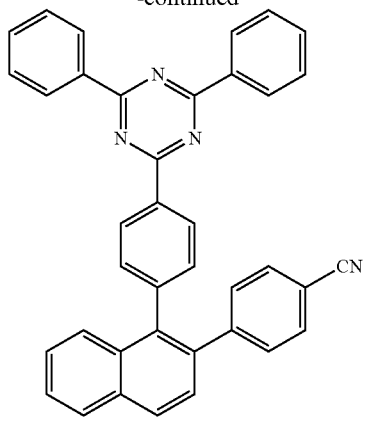

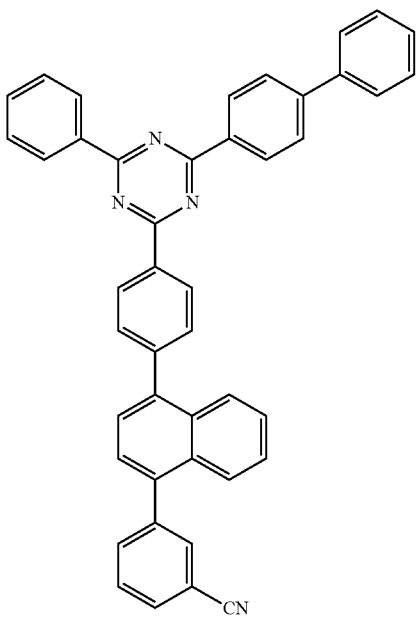

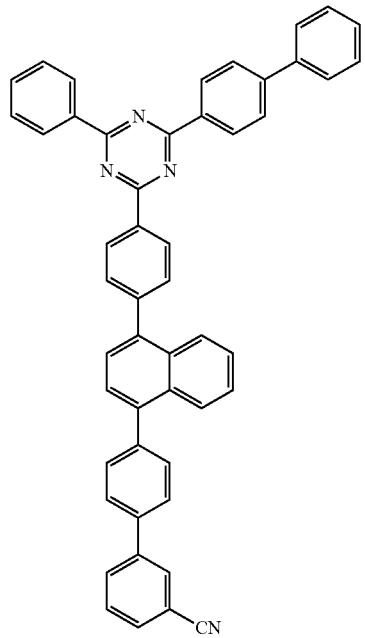

15
-continued
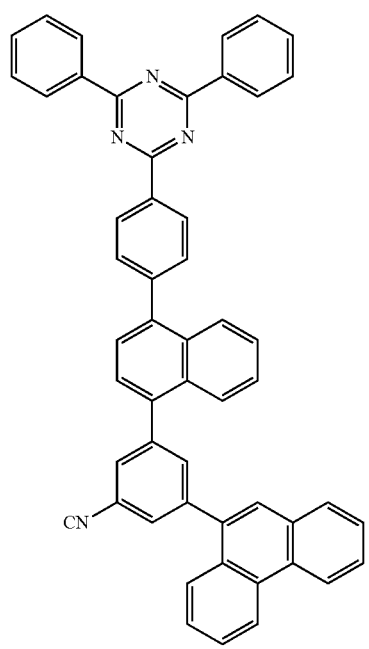
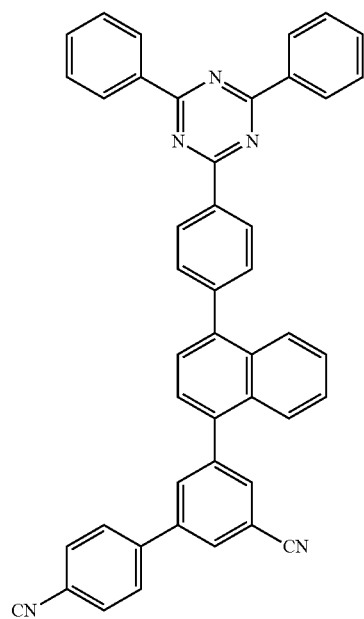
16
-continued
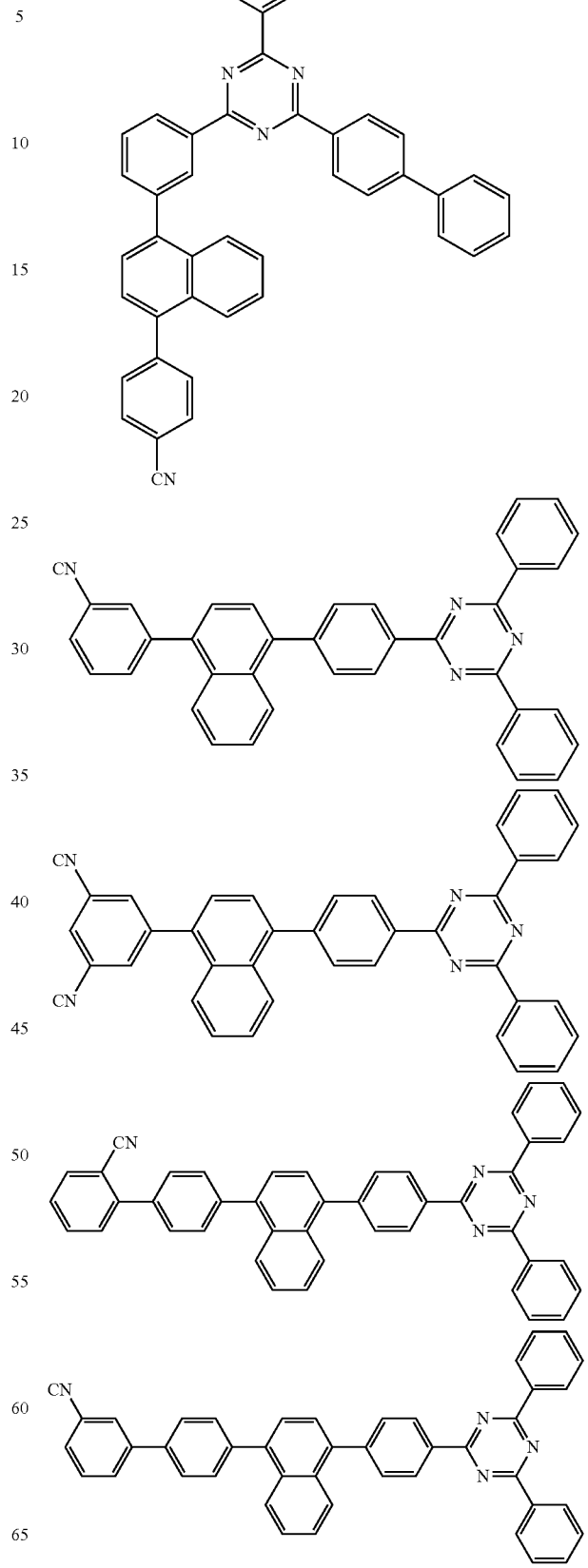

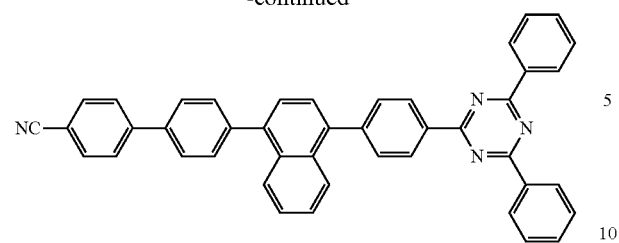
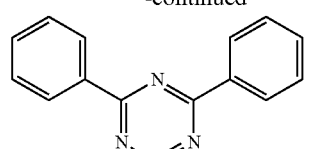
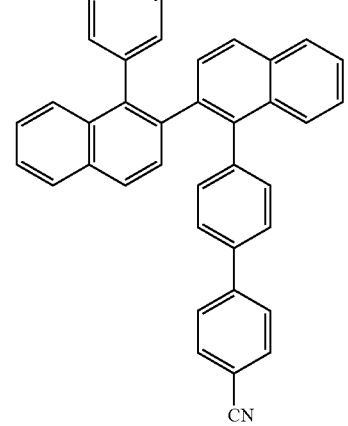
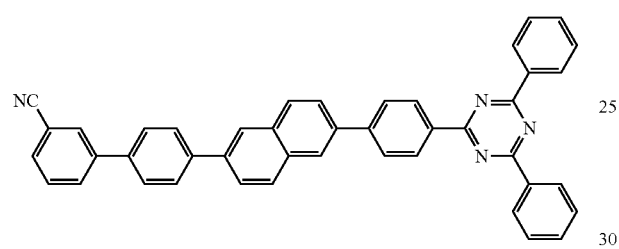
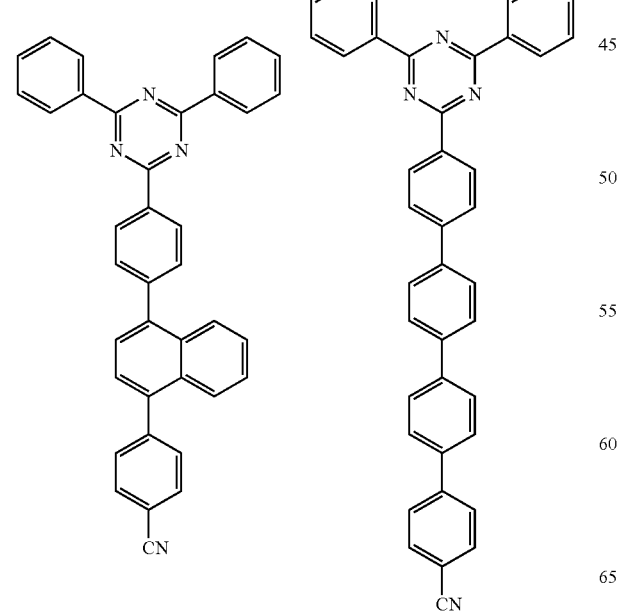

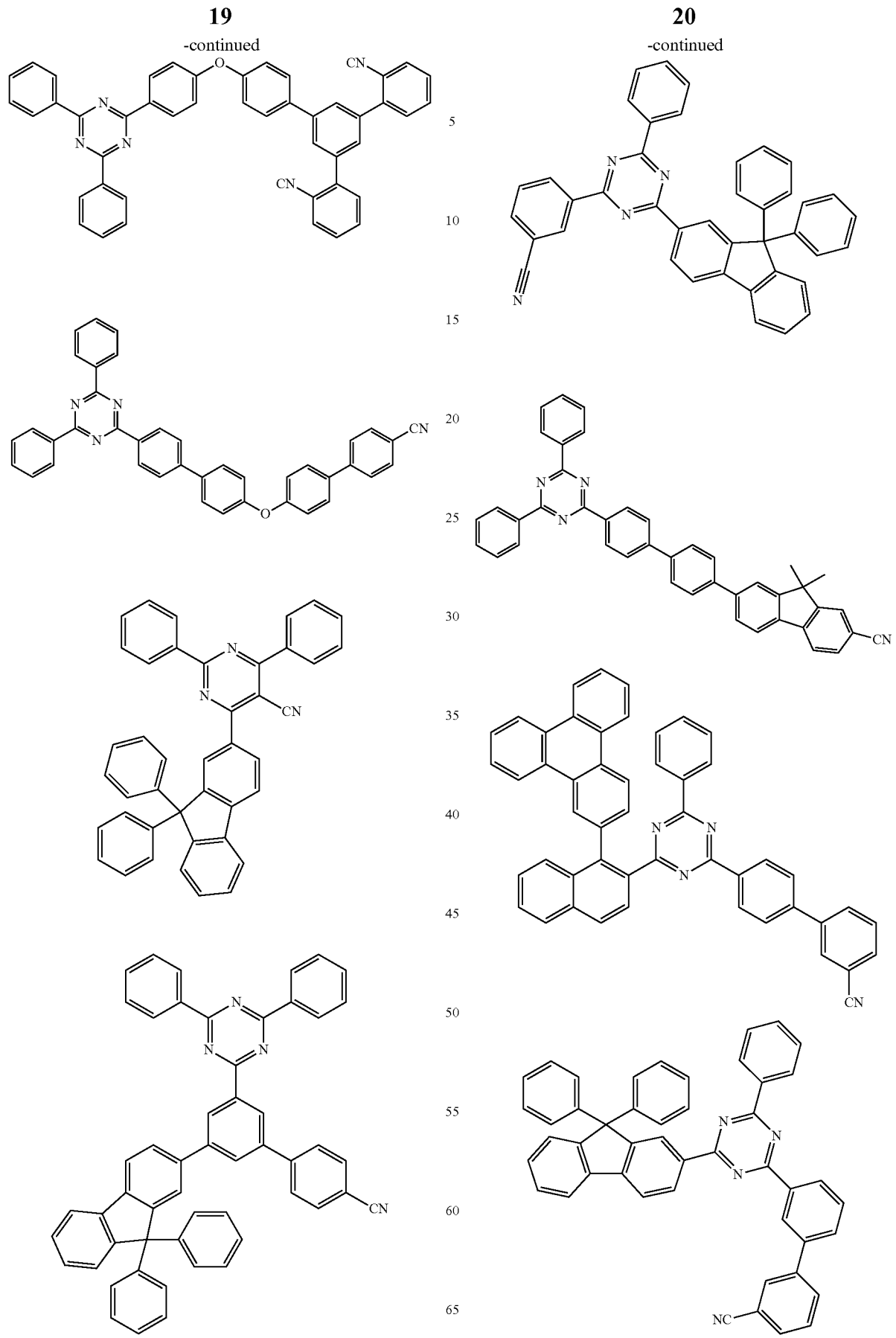

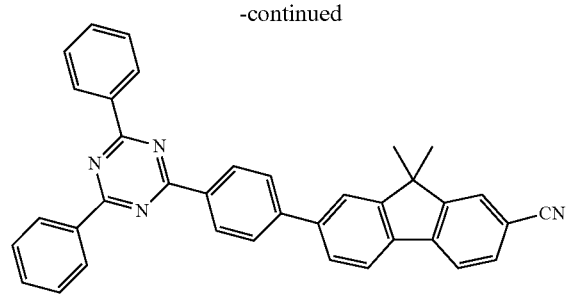
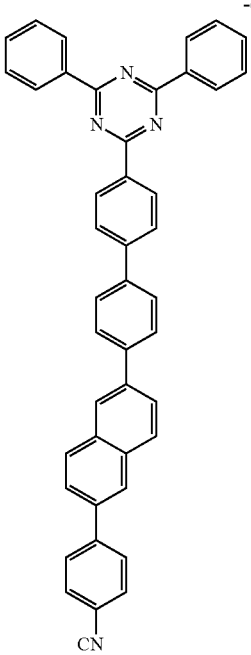
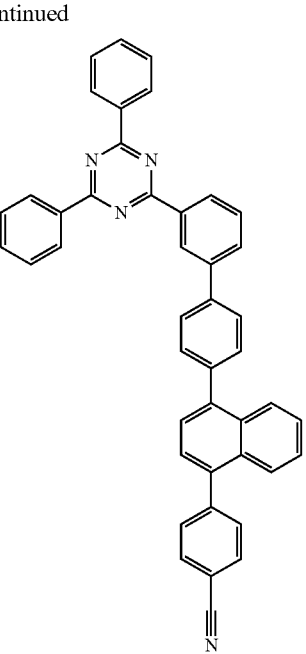
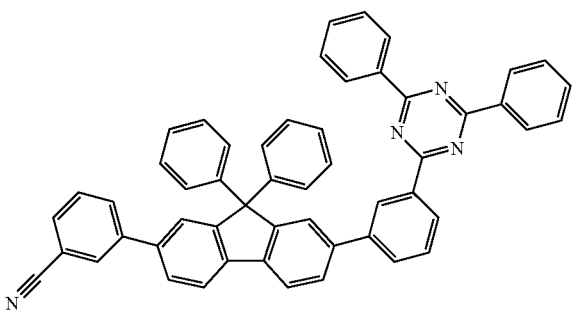 [SMILES: N#Cc1cccc(-c2ccc3c(c2)C(c2ccccc2)(c2ccccc2)c2cc(-c4cccc(-c5nc(-c6ccccc6)nc(-c6ccccc6)n5)c4)ccc2-3)c1]
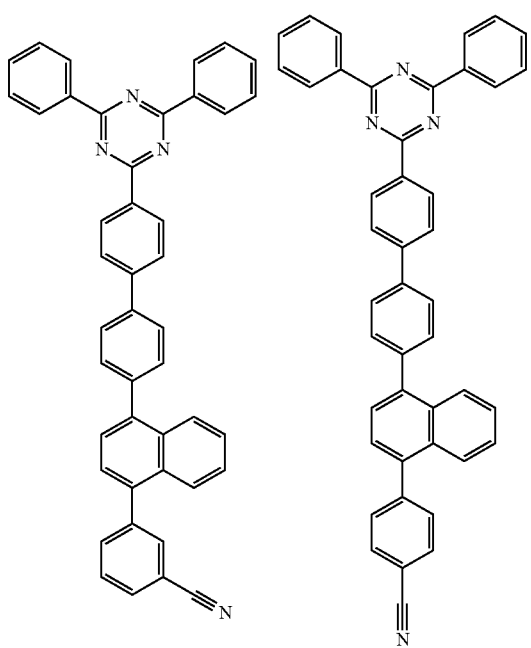
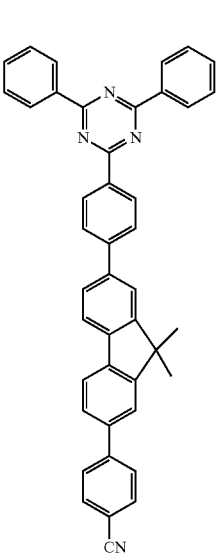
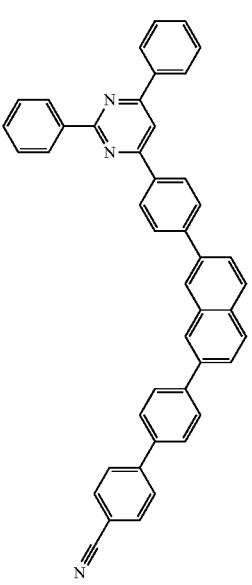

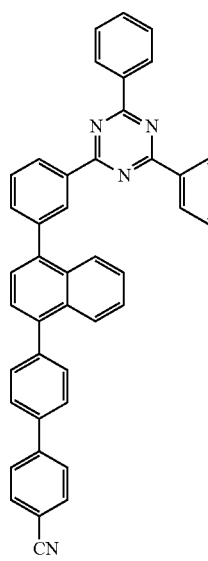
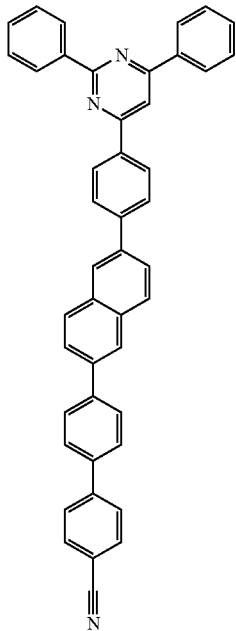
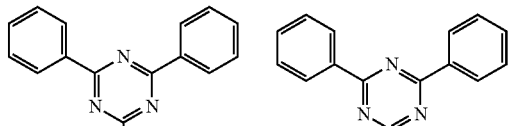
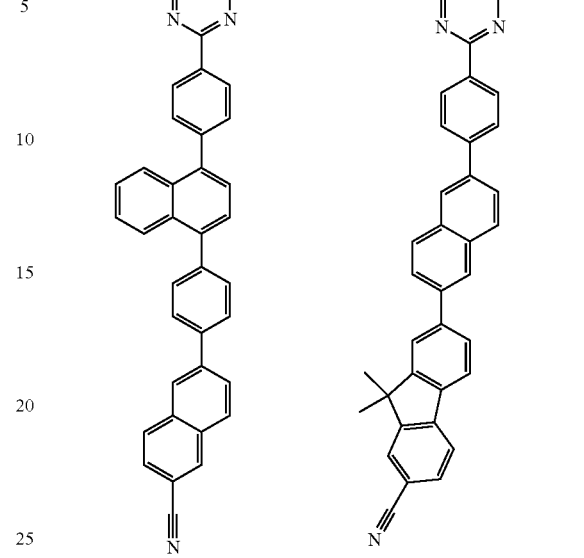
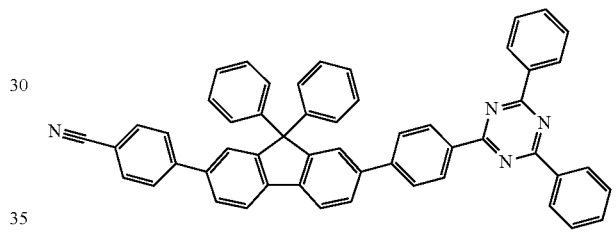
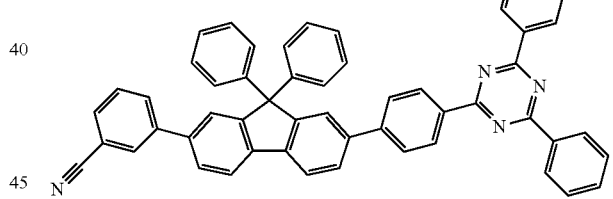
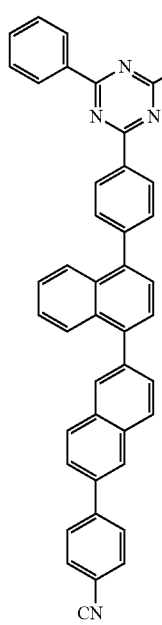
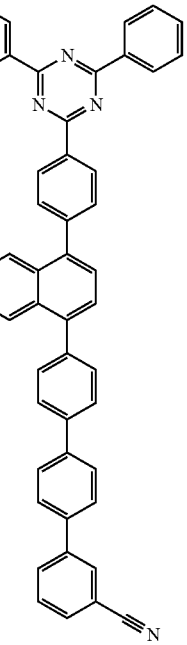
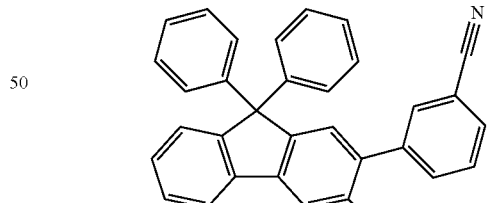
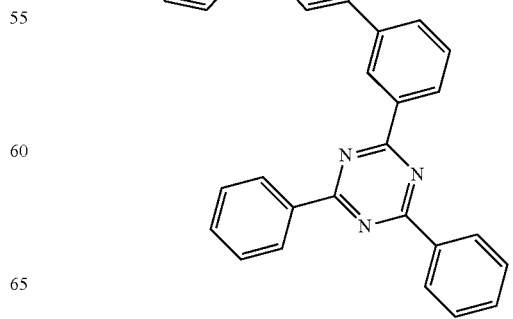

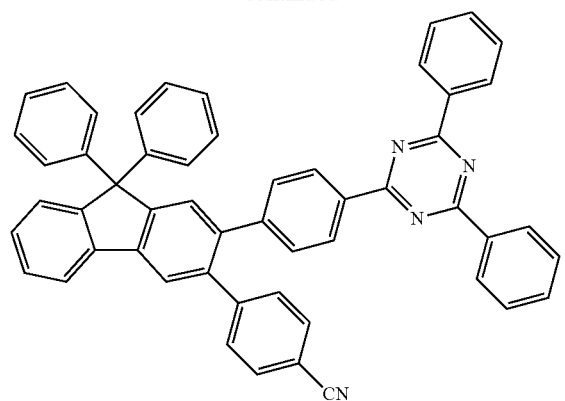
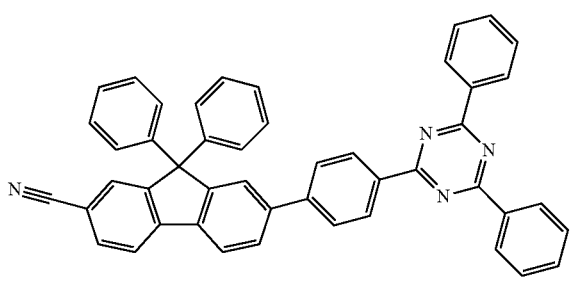
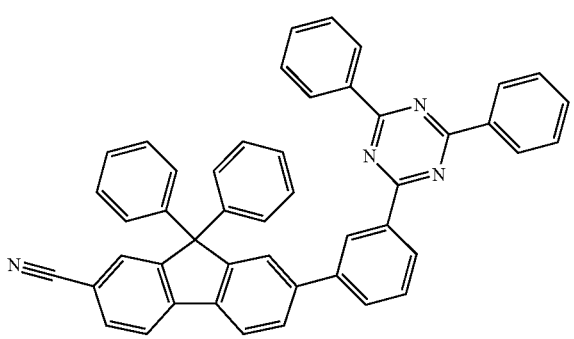
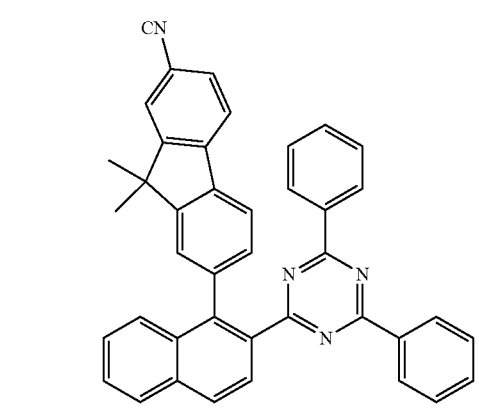
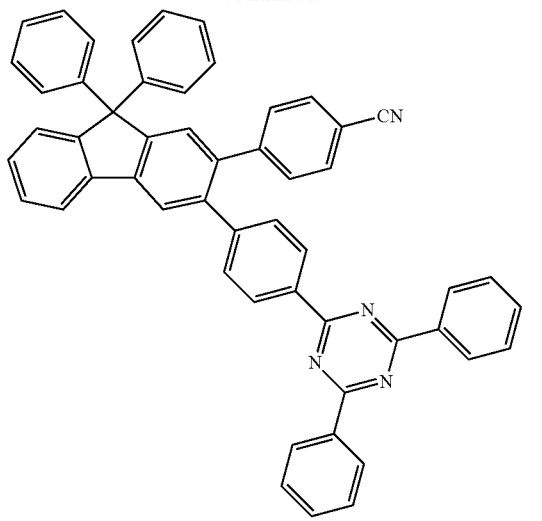 [SMILES: N#Cc1ccc(-c2cc3c(cc2-c2ccc(-c4nc(-c5ccccc5)nc(-c5ccccc5)n4)cc2)-c2ccccc2C3(c2ccccc2)c2ccccc2)cc1]
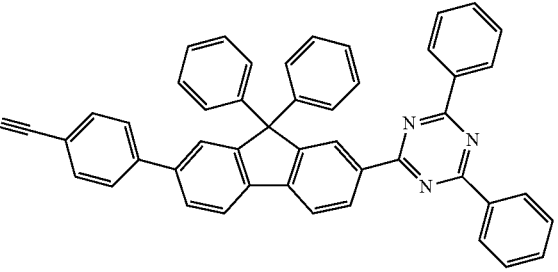
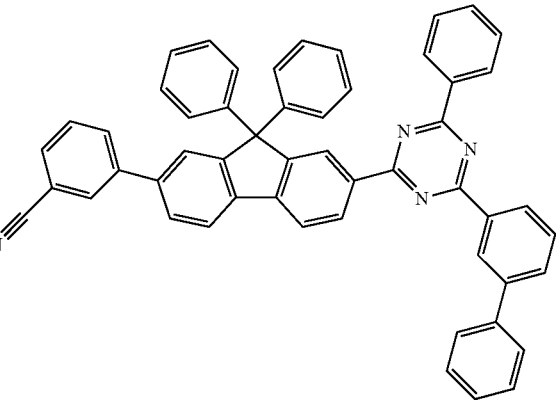
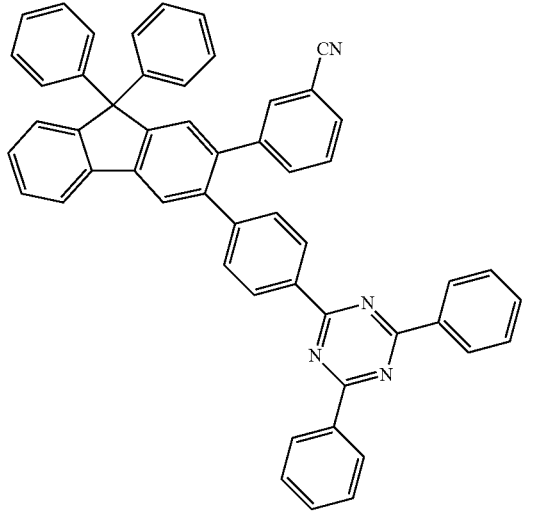

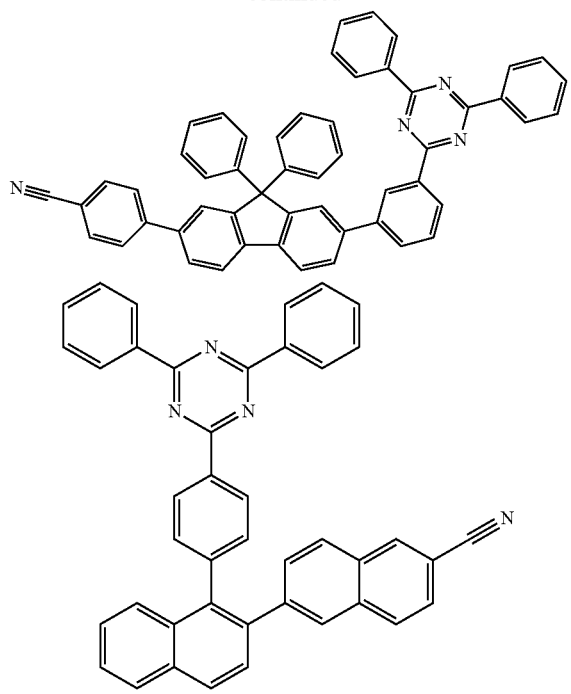
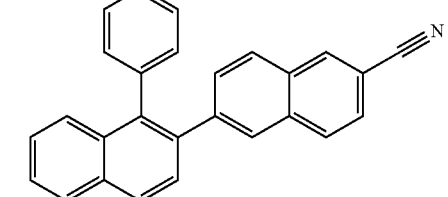
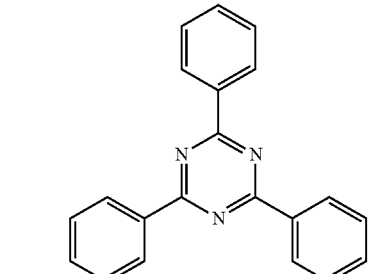
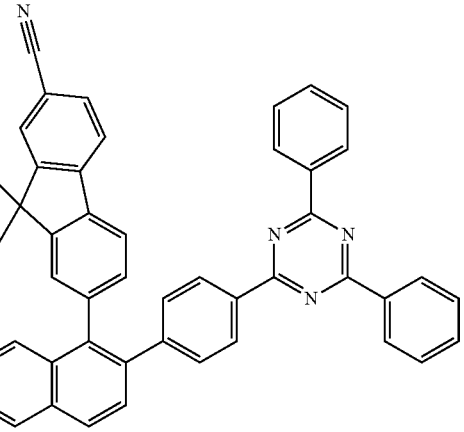
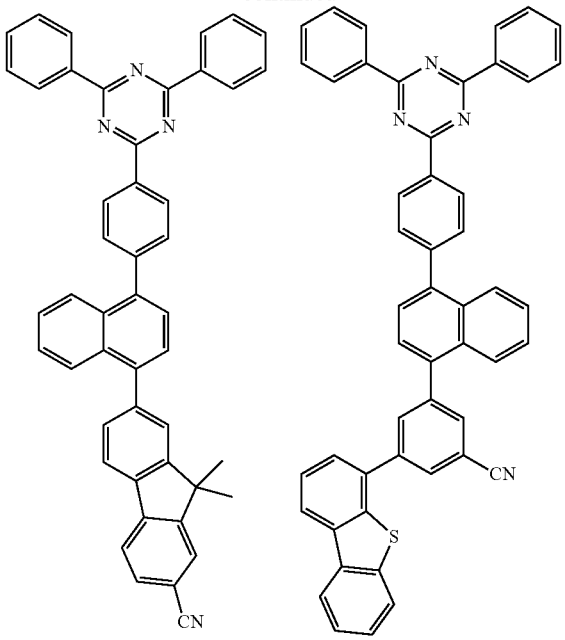
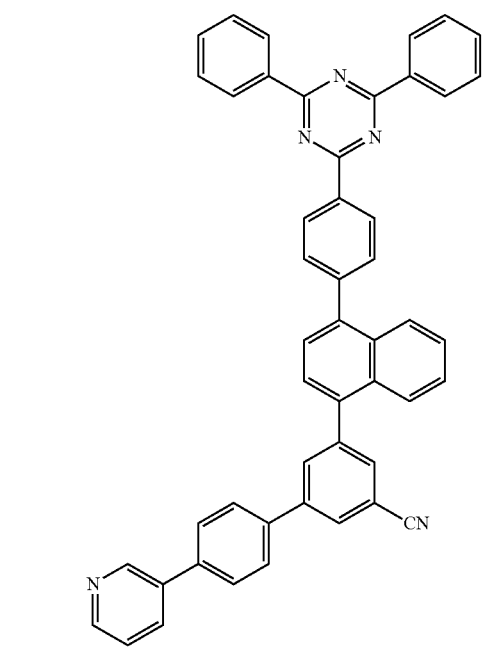

29
-continued
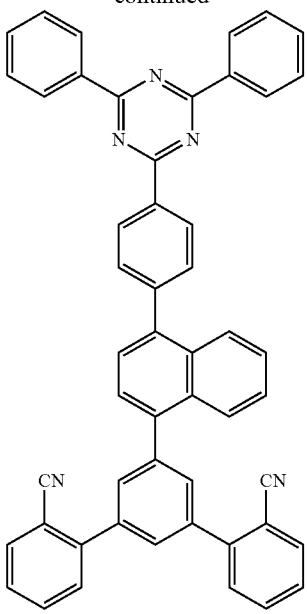
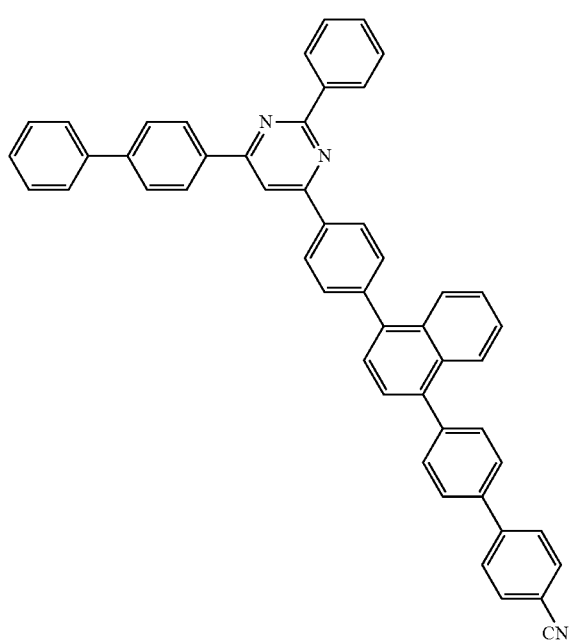
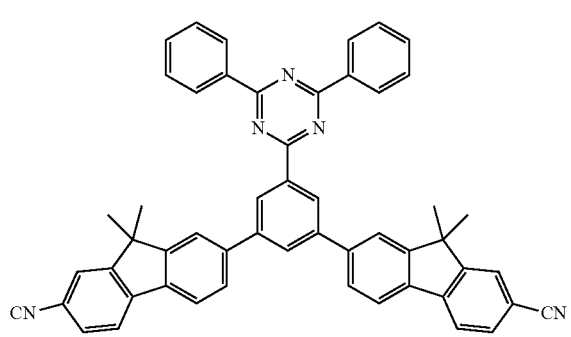
30
-continued
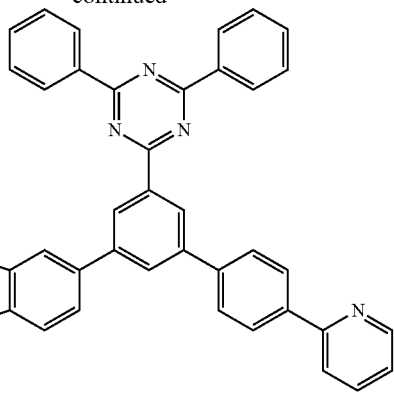
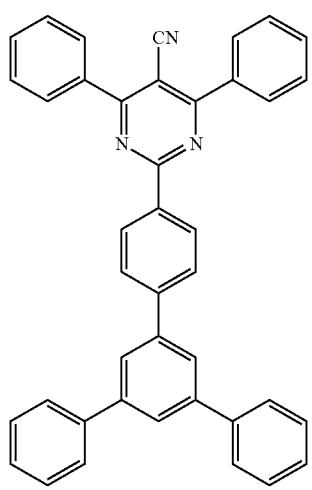
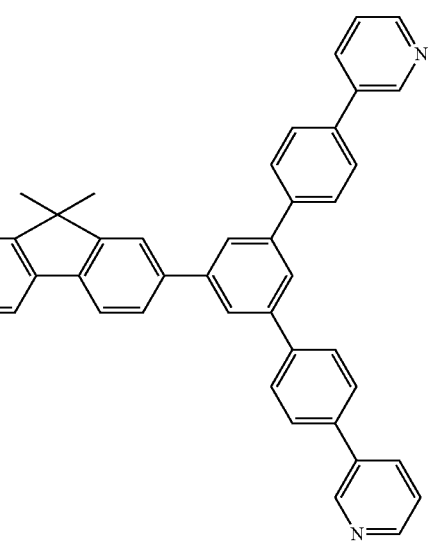

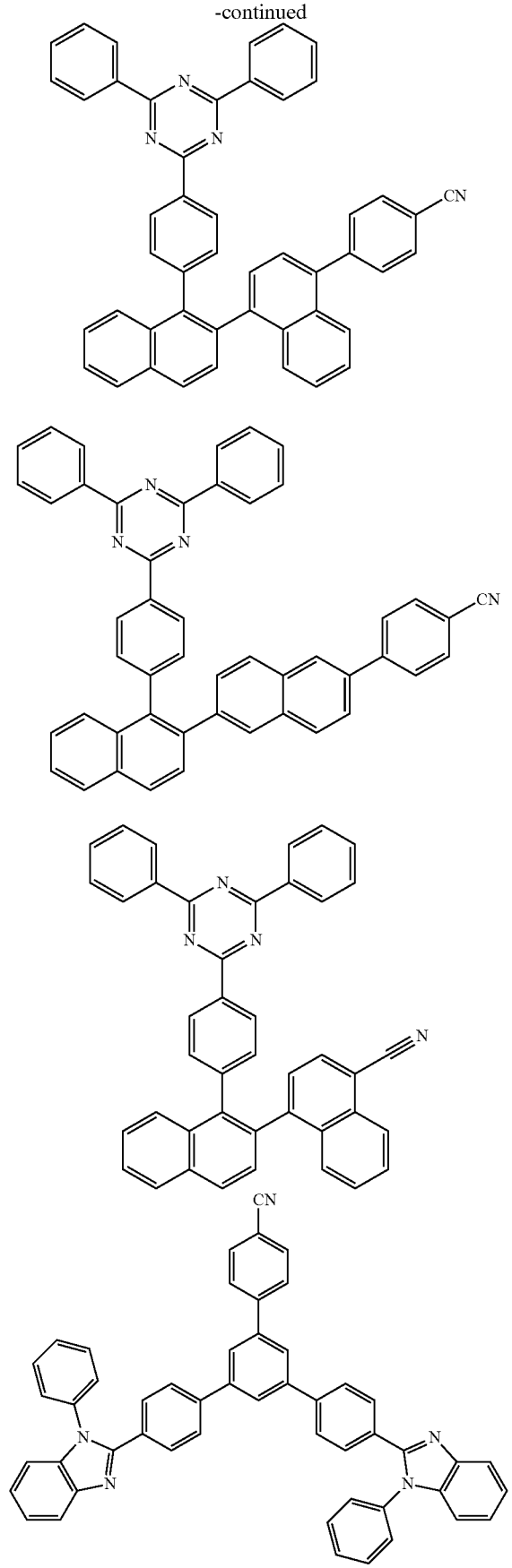

33
-continued
34
-continued
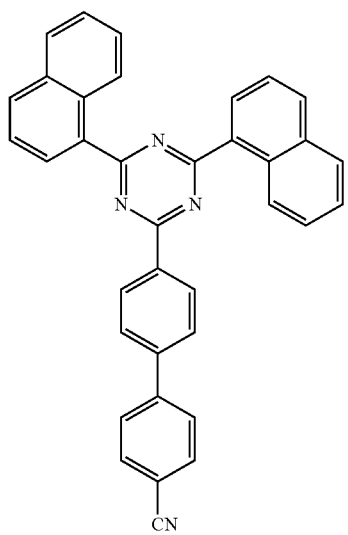
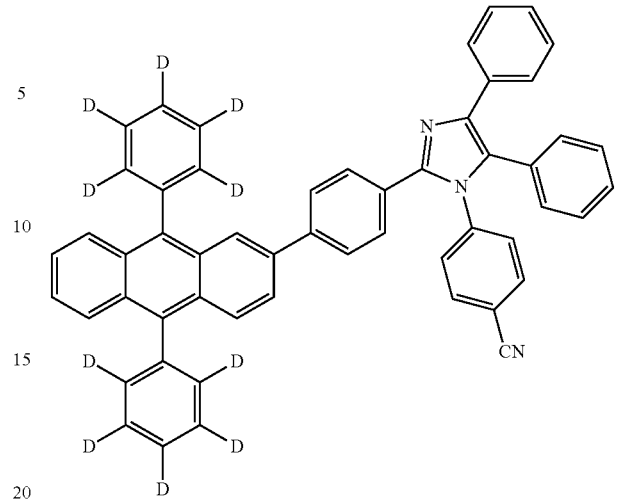
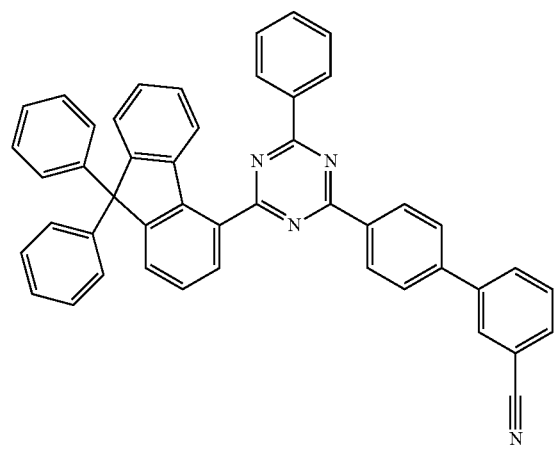
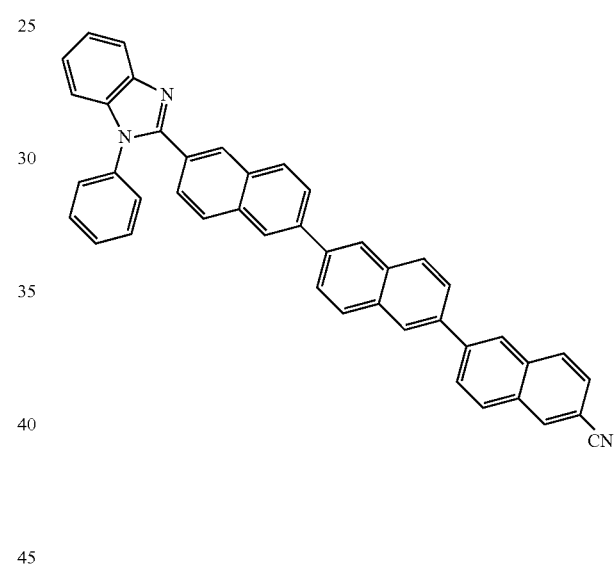
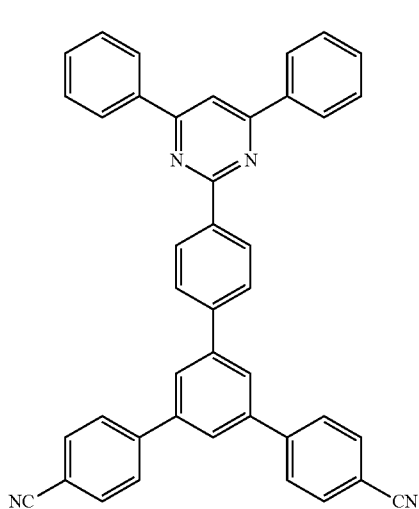
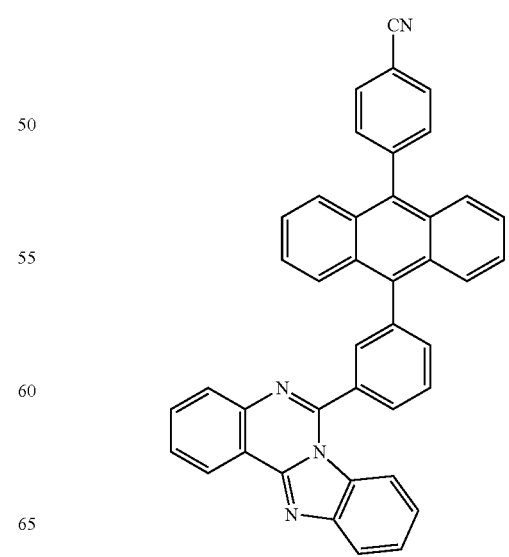

35
-continued
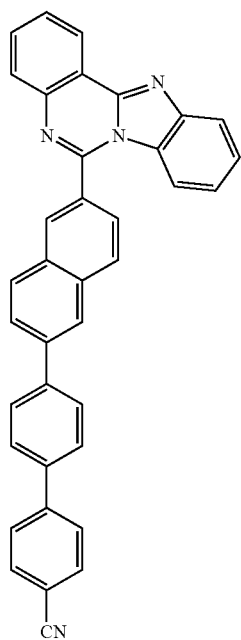 [SMILES: N#Cc1ccc(-c2ccc(-c3ccc4cc(-c5nc6ccccc6c6nc7ccccc7n56)ccc4c3)cc2)cc1]
36
-continued
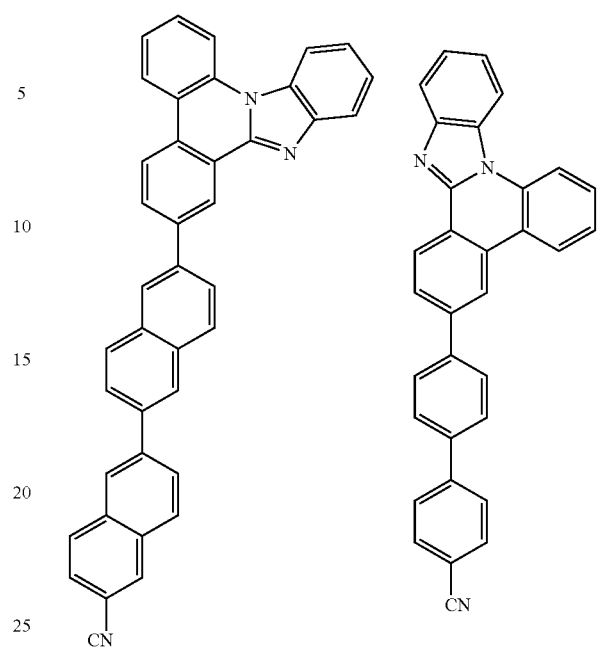
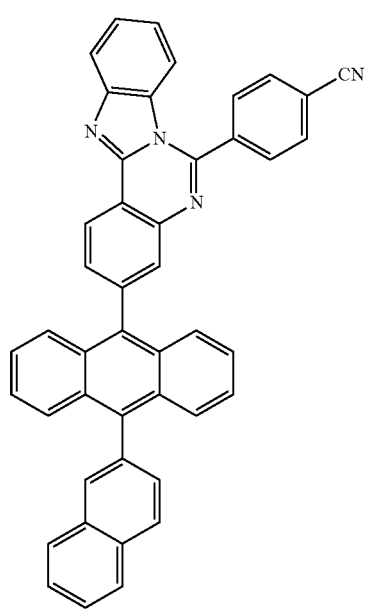
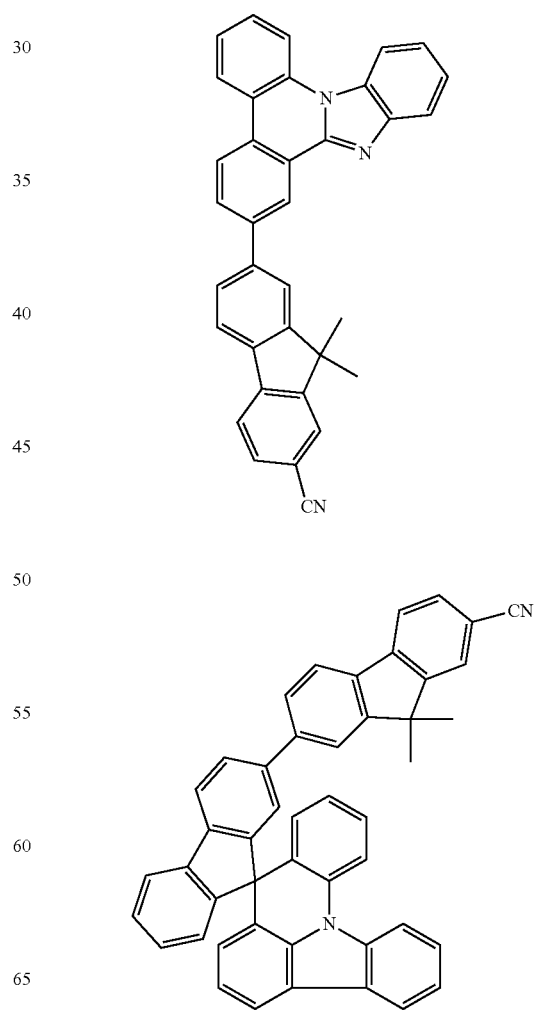

37
-continued
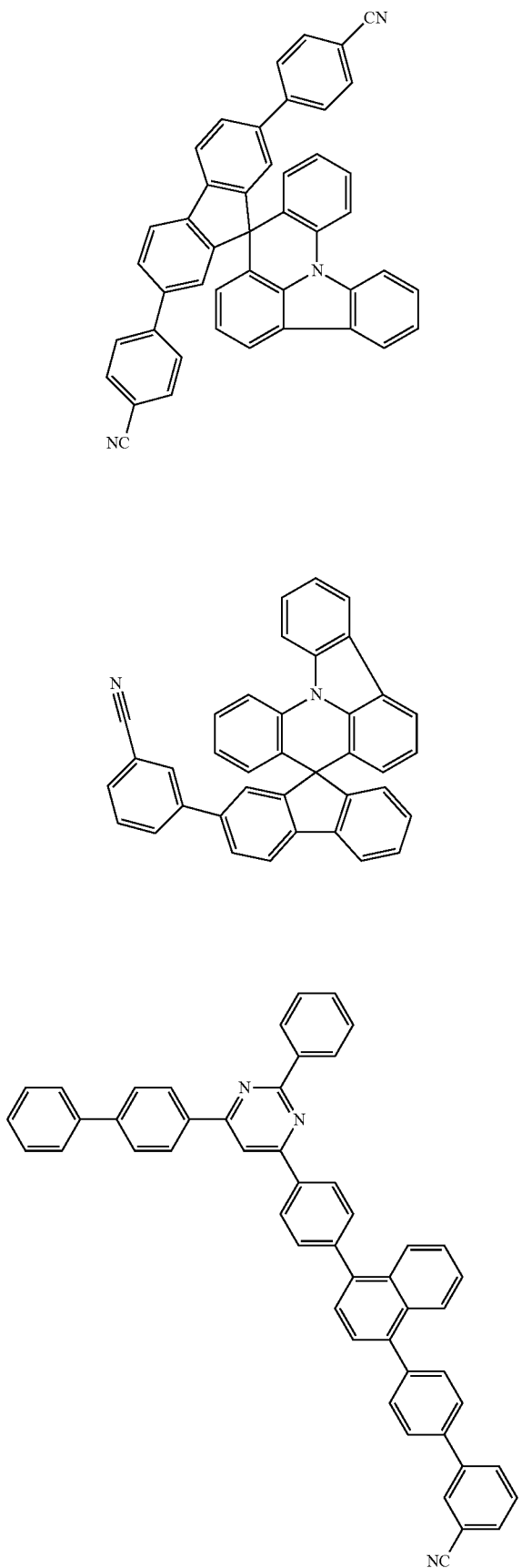
38
-continued
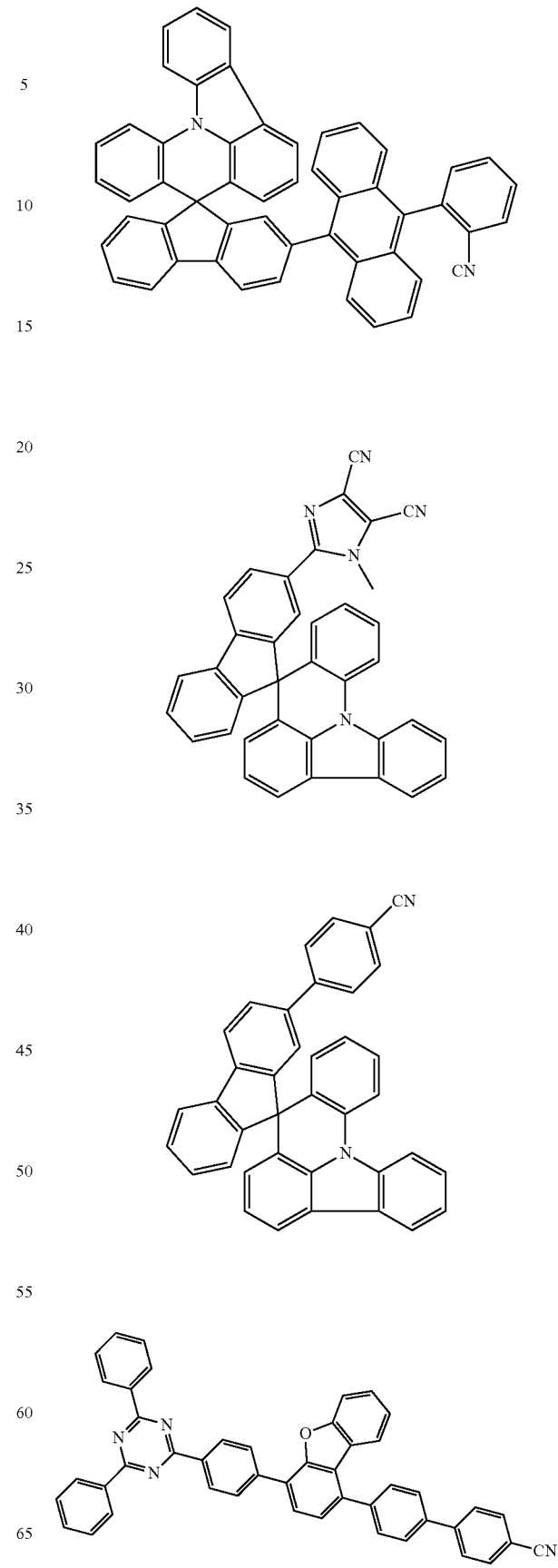

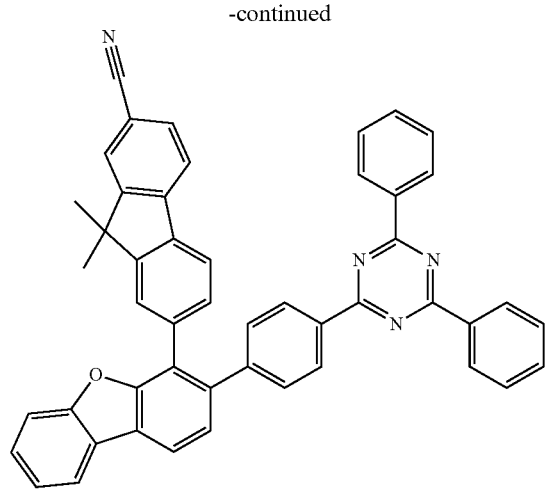
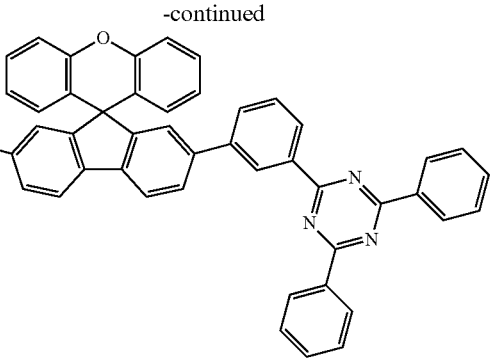
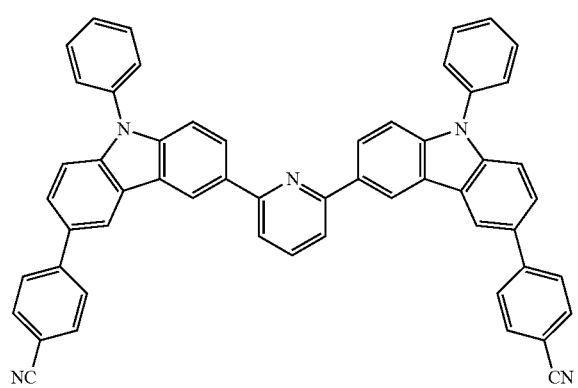 [SMILES: N#Cc1ccc(-c2ccc3c(c2)c2cc(-c4cccc(-c5ccc6c(c5)c5cc(-c7ccc(C#N)cc7)ccc5n6-c5ccccc5)n4)ccc2n3-c2ccccc2)cc1]
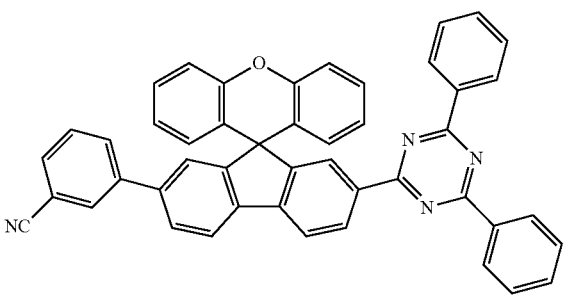
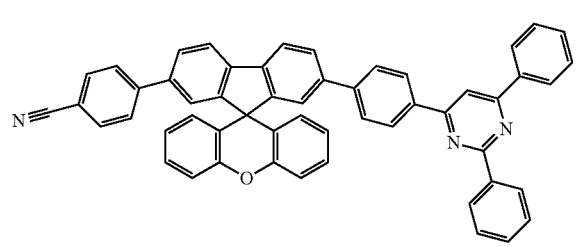
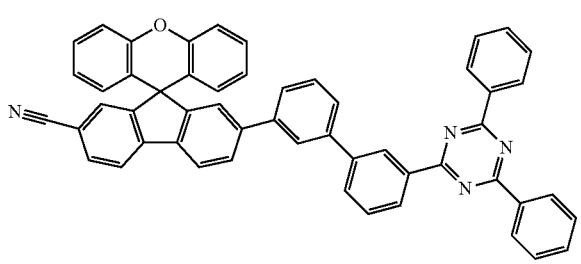
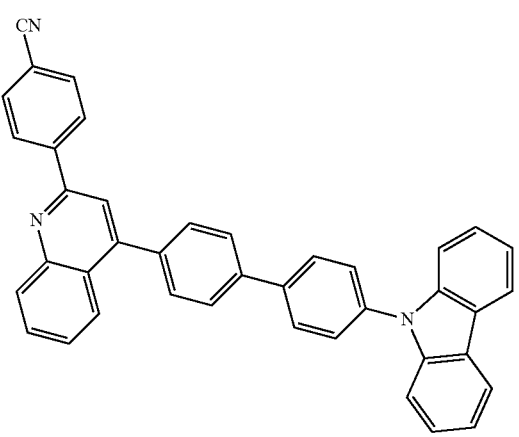

41
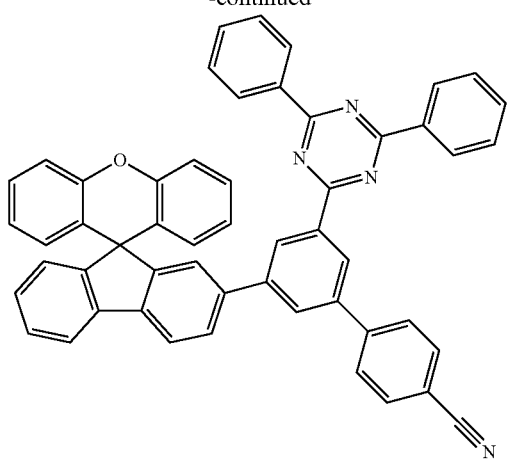
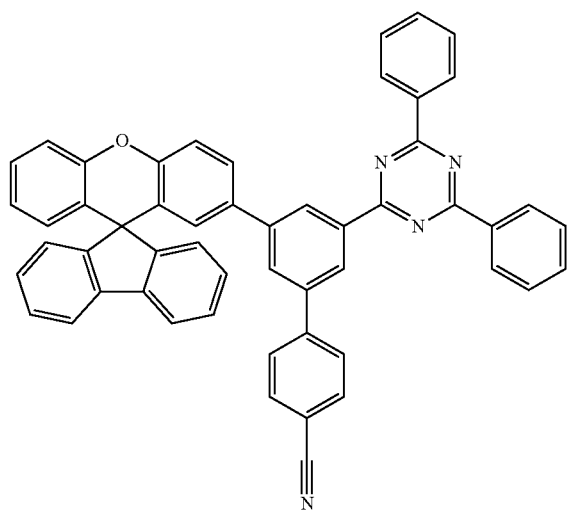
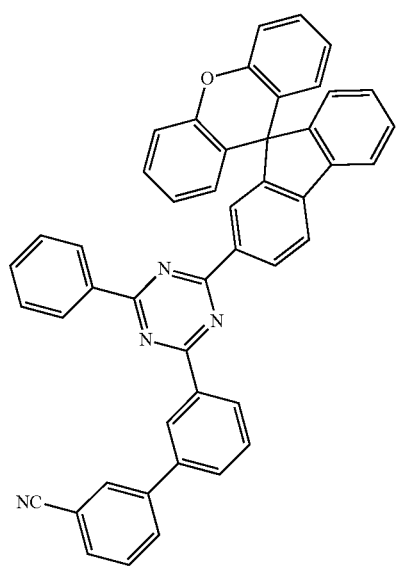
42
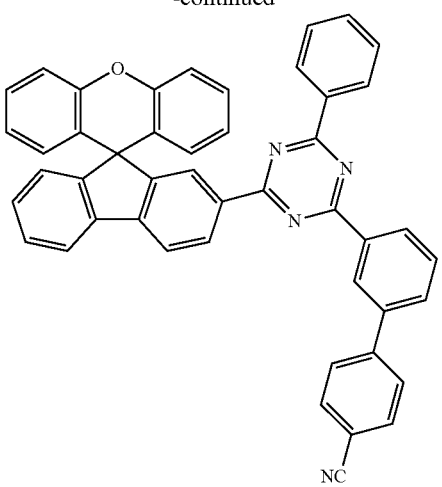
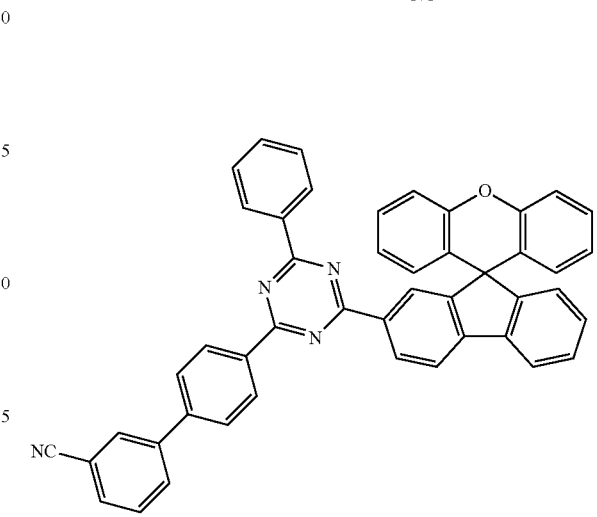
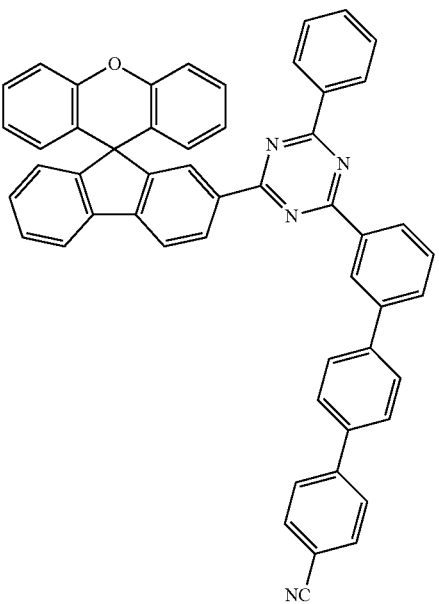

-continued
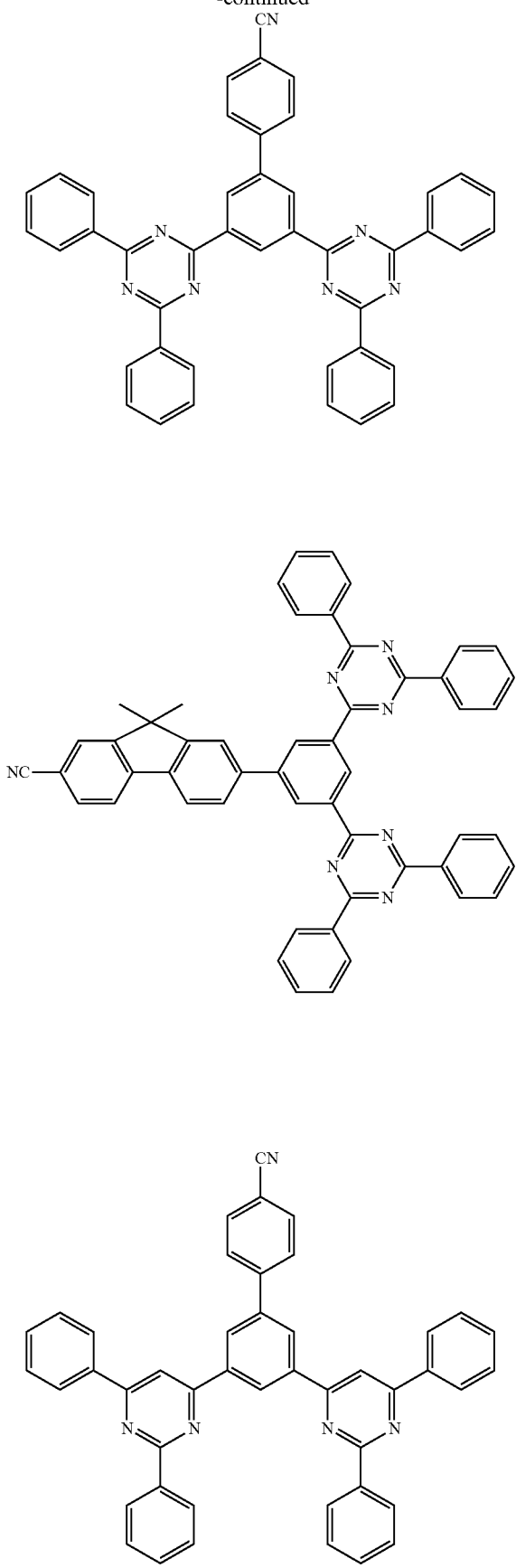
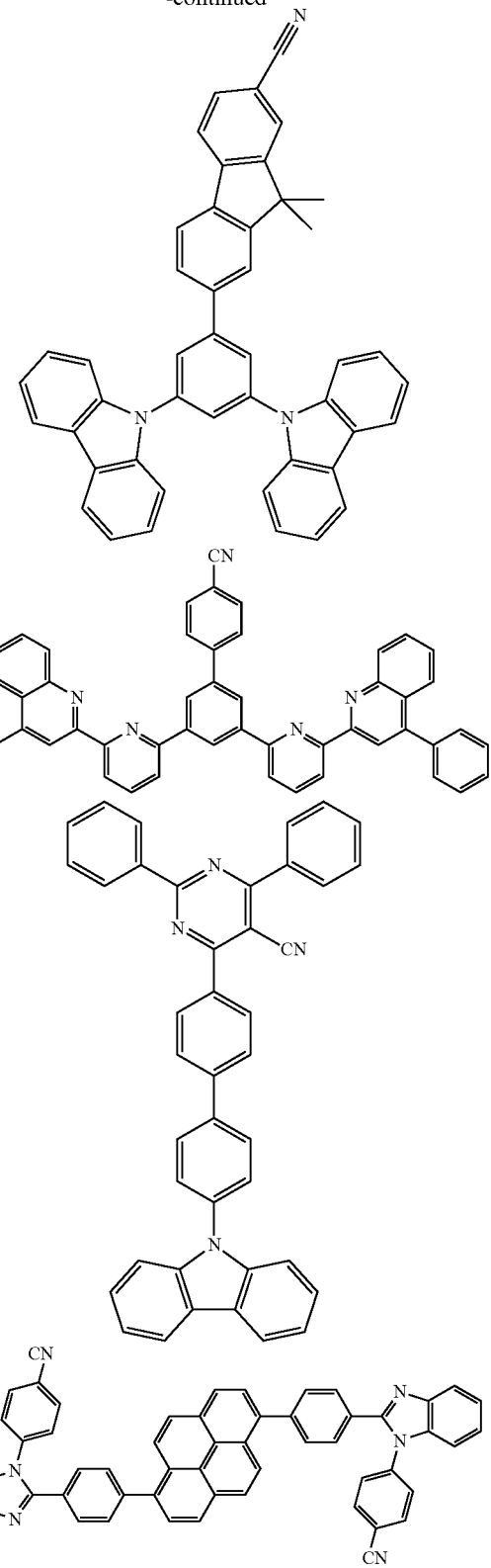
One embodiment of the present specification provides an organic light emitting device comprising an anode; a cathode; a light emitting layer provided between the anode and the cathode; and an organic material layer provided between the cathode and the light emitting layer, wherein the light emitting layer comprises the compound of Chemical Formula 1, and the organic material layer provided between the cathode and the light emitting layer comprises the compound of Chemical Formula 2.

In the present specification, the meaning of a specific A material being included in a B layer includes both 1) one or more types of A materials being included in one B layer and 2) a B layer is formed in one or more layers, and an A material being included in one or more layers of the multiple B layers.

In the present specification, the meaning of a specific A material being included in a C layer or a D layer includes all of: 1) being included in one or more layers among one or more C layers, 2) being included in one or more layers among one or more D layers, and 3) being included in one or more C layers and one or more D layers.

The organic material layer of the organic light emitting device of the present specification can be formed in a single layer structure, but can be formed in a multilayer structure in which two or more organic material layers are laminated. For example, the organic material layer provided between the anode and the light emitting layer can be a hole injection layer, a hole transfer layer, a layer carrying out hole transfer and injection at the same time, or a hole control layer. The organic material layer provided between the cathode and the light emitting layer can be an electron control layer, an electron transfer layer, an electron injection layer, or a layer carrying out electron transfer and injection at the same time. The organic light emitting device can comprise one or more layers having the same function.

In one embodiment of the present specification, the compound of Chemical Formula 1 is included in the light emitting layer. The organic light emitting device can further comprise other light emitting layers. In one embodiment, when two or more light emitting layers are included, each of the light emitting layers can comprise materials the same as or different from each other, and the color of light emission can also be the same as or different from each other.

In one embodiment of the present specification, the organic light emitting device comprises one light emitting layer.

In one embodiment of the present specification, the content of the compound of Chemical Formula 1 can be greater than or equal to 50 parts by weight and less than or equal to 100 parts by weight with respect to 100 parts by weight of the total weight of the light emitting layer.

In one embodiment of the present specification, the compound of Chemical Formula 1 can be included in greater than or equal to 50 parts by weight and less than or equal to 100 parts by weight with respect to 100 parts by weight of the total weight of the light emitting layer.

In one embodiment of the present specification, the light emitting layer comprising the compound of Chemical Formula 1 further comprises a dopant. The dopant can be included in greater than or equal to 1 parts by weight and less than 50 parts by weight with respect to 100 parts by weight of the total weight of the light emitting layer.

In one embodiment of the present specification, the compound of Chemical Formula 2 is included in the organic material layer provided between the cathode and the light emitting layer.

In one embodiment of the present specification, the compound of Chemical Formula 2 is included in an electron control layer, an electron transfer layer, an electron injection layer, or a layer carrying out electron transfer and injection at the same time.

In one embodiment of the present specification, the organic material layer comprising the compound of Chemical Formula 2 is an electron injection layer; an electron transfer layer; an electron injection and transfer layer; or an electron control layer.

In one embodiment of the present specification, the organic material layer comprising the compound of Chemical Formula 2 is an electron injection and transfer layer.

In one embodiment of the present specification, the organic material layer comprising the compound of Chemical Formula 2 is provided in contact with the light emitting layer.

In one embodiment of the present specification, the organic material layer comprising the compound of Chemical Formula 2 is provided in contact with the light emitting layer comprising the compound of Chemical Formula 1.

In the present specification, the "layer" has a meaning compatible with a "film" mainly used in the art, and means coating covering a target area. The size of the "layer" is not limited, and each "layer" can have an identical or different size. In one embodiment, the size of the "layer" can be the same as the whole device, can correspond to the size of a particular functional area, and can be as small as a single sub-pixel.

In one embodiment, the organic light emitting device of the present specification can be manufactured by consecutively laminating a first electrode, an organic material layer and a second electrode on a substrate. In one embodiment of the present specification, the first electrode is an anode, and the second electrode is a cathode. In another embodiment, the first electrode is a cathode, and the second electrode is an anode.

In one embodiment of the present specification, the organic light emitting device can be an organic light emitting device having a normal structure in which an anode, one or more organic material layers, and a cathode are consecutively laminated on a substrate (normal type).

In one embodiment of the present specification, the organic light emitting device can be an organic light emitting device having a structure in a reversed direction in which a cathode, one or more organic material layers and an anode are consecutively laminated on a substrate (inverted type).

Structures of the organic light emitting device according to one embodiment of the present specification are illustrated in FIG. 1 to FIG. 3.

The organic light emitting device according to one embodiment of the present disclosure can be formed with a substrate (1), an anode (2), a light emitting layer (8), an organic material layer (3) and a cathode (4) as illustrated in FIG. 1. In one embodiment, the compound of Chemical Formula 1 is included in the light emitting layer (8), and the compound of Chemical Formula 2 is included in the organic material layer (3).

The organic light emitting device according to one embodiment of the present disclosure can be formed with a substrate (1), an anode (2), a hole injection layer (5), a hole transfer layer (6), a hole control layer (7), a light emitting layer (8), an electron control layer (9), an electron transfer layer (10), an electron injection layer (11) and a cathode (4) as illustrated in FIG. 2. In one embodiment, the compound of Chemical Formula 1 is included in the light emitting layer (8). In one embodiment, the compound of Chemical Formula 2 is included in the electron control layer (9), the electron transfer layer (10) or the electron injection layer (11).

The organic light emitting device according to one embodiment of the present disclosure can be formed with a substrate (1), an anode (2), a hole injection layer (5), a first hole transfer layer (6a), a second hole transfer layer (6b), a light emitting layer (8), an electron injection and transfer layer (12) and a cathode (4) as illustrated in FIG. 3. In one embodiment, the compound of Chemical Formula 1 is included in the light emitting layer (8). In one embodiment, the compound of Chemical Formula 2 is included in the electron injection and transfer layer (12).

However, the structure of the organic light emitting device according to one embodiment of the present specification is not limited to FIG. 1 to FIG. 3, and can be any one of the following structures.

(1) an anode/a hole transfer layer/a light emitting layer/a cathode (2) an anode/a hole injection layer/a hole transfer layer/a light emitting layer/a cathode (3) an anode/a hole transfer layer/a light emitting layer/an electron transfer layer/a cathode (4) an anode/a hole transfer layer/a light emitting layer/an electron transfer layer/an electron injection layer/a cathode (5) an anode/a hole injection layer/a hole transfer layer/a light emitting layer/an electron transfer layer/a cathode (6) an anode/a hole injection layer/a hole transfer layer/a light emitting layer/an electron transfer layer/an electron injection layer/a cathode (7) an anode/a hole transfer layer/a hole control layer/a light emitting layer/an electron transfer layer/a cathode (8) an anode/a hole transfer layer/a hole control layer/a light emitting layer/an electron transfer layer/an electron injection layer/a cathode (9) an anode/a hole injection layer/a hole transfer layer/a hole control layer/a light emitting layer/an electron transfer layer/a cathode

(10) an anode/a hole injection layer/a hole transfer layer/a hole control layer/a light emitting layer/an electron transfer layer/an electron injection layer/a cathode

(11) an anode/a hole transfer layer/a light emitting layer/an electron control layer/an electron transfer layer/a cathode

(12) an anode/a hole transfer layer/a light emitting layer/an electron control layer/an electron transfer layer/an electron injection layer/a cathode

(13) an anode/a hole injection layer/a hole transfer layer/a light emitting layer/an electron control layer/an electron transfer layer/a cathode

(14) an anode/a hole injection layer/a hole transfer layer/a light emitting layer/an electron control layer/an electron transfer layer/an electron injection layer/a cathode When the organic light emitting device comprises a plurality of organic material layers, the organic material layers can be formed with materials the same as or different from each other.

The organic material layer of the organic light emitting device can be formed using various methods.

In one embodiment, the organic light emitting device can be manufactured by forming an anode on a substrate by depositing a metal, a metal oxide having conductivity, or an alloy thereof, forming an organic material layer comprising a hole injection layer, a hole transfer layer, a light emitting layer and an electron transfer layer thereon, and then depositing a material capable of being used as a cathode thereon.

In another embodiment, the organic light emitting device can also be manufactured by consecutively depositing a cathode material, an organic material layer and an anode material on a substrate (International Patent Application Laid-Open Publication No. WO2003/012890). However, the manufacturing method is not limited thereto.

Each of the organic material layers can be formed using any conventional deposition technology, for example, vapor deposition, liquid deposition (continuous and intermittent technology), and thermal transfer. The continuous deposition technology comprises spin coating, gravure coating, curtain coating, dip coating, slot-die coating, spray coating and continuous nozzle coating, but is not limited thereto. The intermittent deposition technology comprises ink jet printing, gravure printing and screen printing, but is not limited thereto.

In one embodiment of the present specification, the compound of Chemical Formula 1 is formed to the light emitting layer using a solution coating method when manufacturing the organic light emitting device.

In one embodiment of the present specification, the compound of Chemical Formula 2 is formed to the organic material layer provided between the cathode and the light emitting layer by deposition. Herein, a physical vapor deposition (PVD) method such as a sputtering method or an e-beam evaporation method can be used, however, the method is not limited thereto.

In one embodiment of the present specification, other layers in the organic light emitting device can be prepared using any known material as long as the materials are useful for each of the layers. Hereinafter, preferred materials favorable to be used in the organic material layers are described as an example, however, the materials are not limited thereto.

As the anode material, materials having large work function are normally preferred so that hole injection to an organic material layer is smooth. Specific examples of the anode material capable of being used in the present disclosure comprise metals such as vanadium, chromium, copper, zinc and gold, or alloys thereof; metal oxides such as zinc oxide, indium oxide, indium tin oxide (ITO) and indium zinc oxide (IZO); combinations of metals and oxides such as $ZnO:Al$ or $SnO_2:Sb$; conductive polymers such as poly(3-methylthiophene), poly[3,4-(ethylene-1,2-dioxy)thiophene] (PEDOT), polypyrrole and polyaniline, but are not limited thereto.

As the cathode material, materials having small work function are normally preferred so that electron injection to an organic material layer is smooth. Specific examples of the cathode material comprise metals such as magnesium, calcium, sodium, potassium, titanium, indium, yttrium, lithium, gadolinium, aluminum, silver, tin and lead, or alloys thereof; multilayer structure materials such as LiF/Al or $LiO_2/Al$, and the like, but are not limited thereto.

The hole injection layer is a layer injecting holes received from an electrode to a light emitting layer or an adjacent layer provided on a light emitting layer side. As the hole injection material, materials having an ability to transfer holes, therefore, having a hole injection effect in an anode, having an excellent hole injection effect for a light emitting layer or a light emitting material, preventing excitons generated in the light emitting layer from moving to an electron injection layer or an electron injection material, and in addition thereto, having an excellent thin film forming ability are preferably used. The highest occupied molecular orbital (HOMO) of the hole injection material is preferably in between the work function of an anode material and the HOMO of surrounding organic material layers. Specific examples of the hole injection material comprise metal porphyrins, oligothiophene, arylamine-based organic materials, hexanitrile hexaazatriphenylene-based organic materials, quinacridone-based organic materials, perylene-based organic materials, anthraquinone, and polyaniline- and polythiophene-based conductive polymers, and the like, but are not limited thereto.

The hole transfer layer is a layer receiving holes from a hole injection layer and transferring the holes to a light emitting layer. As the hole transfer material, materials capable of receiving holes from an anode or a hole injection layer, moving the holes to a light emitting layer, and having high mobility for the holes are suited. Specific examples of the hole transfer material comprise arylamine-based organic materials, conductive polymers, block copolymers having conjugated parts and non-conjugated parts together, and the like, but are not limited thereto.

The hole control layer is a layer controlling performance of the whole device by preventing electrons from flowing into an anode from a light emitting layer and controlling flow of holes flowing into the light emitting layer. As the hole control material, compounds having abilities to prevent electrons from flowing into an anode from a light emitting layer, and control flow of injected holes for the light emitting layer or light emitting material are preferred. In one embodiment, arylamine-based organic materials can be used as the hole control layer, however, the hole control layer is not limited thereto.

The light emitting material is a material capable of emitting light in a visible light region by receiving holes and electrons from a hole transfer layer and an electron transfer layer, respectively, and binding the holes and the electrons, and is preferably a material having favorable quantum efficiency for fluorescence or phosphorescence. Specific examples thereof comprise 8-hydroxyquinoline aluminum complexes ($Alq_3$); carbazole-based compounds; dimerized styryl compounds; BAlq; 10-hydroxybenzoquinoline-metal compounds; benzoxazole-, benzothiazole- and benzimidazole-based compounds; poly(p-phenylenevinylene) (PPV)-based polymers; spiro compounds; polyfluorene, rubrene, and the like, but are not limited thereto.

The light emitting layer can comprise a host material and a dopant material. The host material can comprise fused aromatic ring derivatives, heteroring-containing compounds or the like. Specifically, as the fused aromatic ring derivative, anthracene derivatives, pyrene derivatives, naphthalene derivatives, pentacene derivatives, phenanthrene compounds, fluoranthene compounds and the like can be included, and as the heteroring-containing compound, carbazole derivatives, dibenzofuran derivatives, ladder-type furan compounds, pyrimidine derivatives and the like can be included, however, the host material is not limited thereto.

The dopant material of the light emitting layer can comprise aromatic amine derivatives, styrylamine compounds, boron complexes, fluoranthene compounds, metal complexes and the like. Specifically, the aromatic amine derivative is a fused aromatic ring derivative having a substituted or unsubstituted arylamine group, and arylamine group-comprising pyrene, anthracene, chrysene, peryflanthene and the like can be used. As the styrylamine compound, compounds in which substituted or unsubstituted arylamine is substituted with at least one arylvinyl group can be used. Examples of the styrylamine compound can comprise styrylamine, styryldiamine, styryltriamine, styryltetraamine and the like, but are not limited thereto. As the metal complex, iridium complexes, platinum complexes and the like can be used, however, the metal complex is not limited thereto.

The electron control layer is a layer controlling performance of the whole device by preventing holes from flowing into a cathode from a light emitting layer and controlling flow of electrons flowing into the light emitting layer. As the electron control material, compounds having abilities to prevent holes from flowing into a cathode from a light emitting layer, and control flow of injected electrons for the light emitting layer or light emitting material are preferred. As the electron control material, proper materials can be used depending on the constitution of the organic material layer used in the device. The electron control layer is located between a light emitting layer and a cathode, and is preferably provided in direct contact with a light emitting layer.

The electron transfer layer is a layer receiving electrons from an electron injection layer and transferring the electrons to a light emitting layer. As the electron transfer material, materials capable of favorably receiving electrons from a cathode, moving the electrons to a light emitting layer, and having high mobility for the electrons are suited. Examples of the electron transfer material comprise Al complexes of 8-hydroxyquinoline; complexes comprising $Alq_3$; organic radical compounds; hydroxyflavon-metal complexes, and the like, but are not limited thereto. The electron transfer layer can be used together with any desired cathode material as used in the art. In one embodiment, as the cathode material, materials having low work function; and an aluminum layer or a silver layer can be used. Examples of the material having low work function can comprise cesium, barium, calcium, ytterbium, samarium and the like, and after forming a layer with the above-mentioned material, an aluminum layer or a silver layer can be formed on the layer.

The electron injection layer is a layer injecting electrons received from an electrode. As the electron injection material, compounds having an electron transferring ability, having an electron injection effect from a cathode, having an excellent electron injection effect for a light emitting layer or light emitting material, and preventing excitons generated in the light emitting layer from moving to a hole injection layer, and in addition thereto, having an excellent thin film forming ability are preferably used. Specific examples thereof can comprise fluorenone, anthraquinodimethane, diphenoquinone, thiopyran dioxide, oxazole, oxadiazole, triazole, imidazole, perylene tetracarboxylic acid, fluorenylidene methane, anthrone or the like, and derivatives thereof, metal complex compounds, nitrogen-containing 5-membered ring derivatives, and the like, but are not limited thereto.

The metal complex compound comprises 8-hydroxyquinolinato lithium, bis(8-hydroxyquinolinato)zinc, bis(8-hydroxy-quinolinato)copper, bis(8-hydroxyquinolinato)manganese, tris(8-hydroxyquinolinato)aluminum, tris(2-methyl-8-hydroxy-quinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)-chlorogallium, bis(2-methyl-8-quinolinato) (o-cresolato)-gallium, bis(2-methyl-8-quinolinato) (1-naphtholato)aluminum, bis(2-methyl-8-quinolinato) (2-naphtholato)gallium and the like, but is not limited thereto.

The organic light emitting device according to the present specification can be a top-emission type, a bottom-emission type or a dual-emission type depending on the materials used.

EXAMPLES

Hereinafter, the present specification will be described in detail with reference to examples. However, the examples according to the present specification can be modified to various other forms, and the scope of the present specification is not to be construed as being limited to the examples described below. Examples of the present specification are provided in order to more fully describe the present specification to those having average knowledge in the art.

<Synthesis of Compound of Chemical Formula 1>

In one embodiment, the compound of Chemical Formula 1 described above can be famed by linking deuterated substituents, or synthesized through a deuteration reaction after synthesizing a compound not substituted with deuterium.

In the compound of Chemical Formula 1 described above, the compound not substituted with deuterium only can be synthesized through, for example, a known reaction such as a reaction reacting and linking a compound comprising a halogen group and a compound linking boronic acid under a palladium catalyst.

In addition, in one embodiment, as for the method of deuterating a compound that is not deuterated, a method such as dissolving the compound in benzene-d6 under an inert environment, then stirring the result for 2 hours with trichlorobenzene, and terminating the reaction through D$_2$O quenching can be used.

However, the method described above is just one example of a method for synthesizing the compound of Chemical Formula 1, and other known synthesis methods can also be used.

<Synthesis of Compound 2-1>

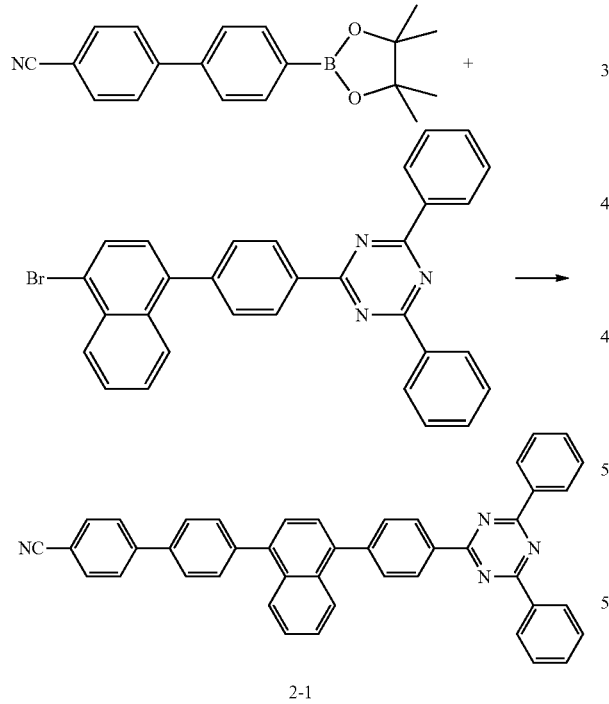

2-1

2-(4-(4-Bromonaphthalen-1-yl)phenyl)-4,6-diphenyl-1,3,5-triazine (30 g, 58.3 mmol) and 2-(4'-cyano-[1,1'-biphenyl]-4-yl)-4,4,5,5-tetramethyl-1,3,2-dioxaborolane (19.6 g, 64.1 mmol) were dissolved in tetrahydrofuran (300 mL), and stirred. An aqueous potassium carbonate (16.1 g, 116.6 mmol) solution was introduced thereto, and the temperature was raised. When the result started to reflux, a tetrakis (triphenylphosphine)palladium(0) (2.02 g, 1.75 mmol) catalyst was introduced thereto, and the result was stirred for 3 hours. After the reaction was terminated, Compound 2-1 (31 g, yield 87%) was prepared through cooling and ethanol slurry purification.

[M+H]$^+$=613

<Synthesis of Compound 2-2>

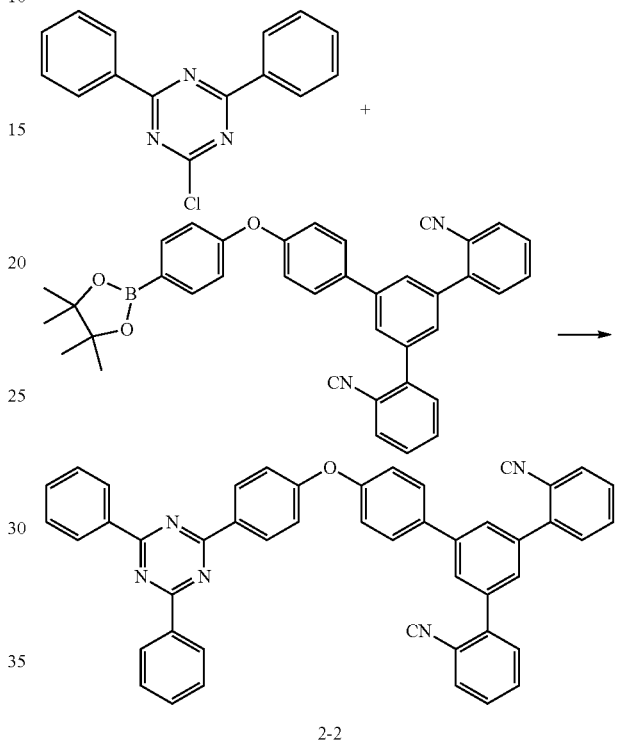

2-2

Compound 2-2 was prepared in the same manner as in Synthesis of Compound 2-1 except that 2-chloro-4,6-diphenyl-1,3,5-triazine was used instead of 2-(4-(4-bromonaphthalen-1-yl)phenyl)-4,6-diphenyl-1,3,5-triazine, and 5'-(4-(4-(4,4,5,5-tetramethyl-1,3,2-dioxaborolan-2-yl)phenoxy)-phenyl)-[1,1':3',1''-terphenyl]-2,2''-dicarbonitrile was used instead of 2-(4'-cyano-[1,1'-biphenyl]-4-yl)-4,4,5,5-tetramethyl-1,3,2-dioxaborolane.

[M+H]$^+$=680

<Synthesis of Compound 2-3>

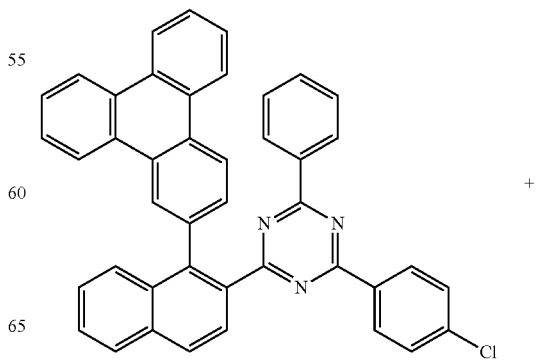

-continued

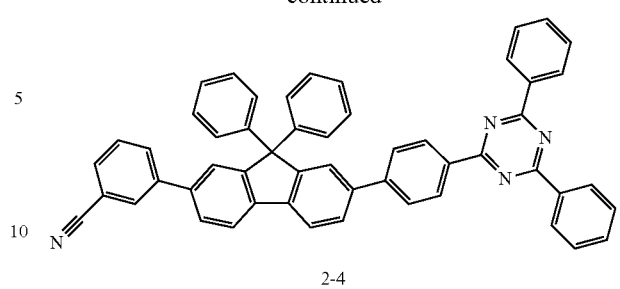

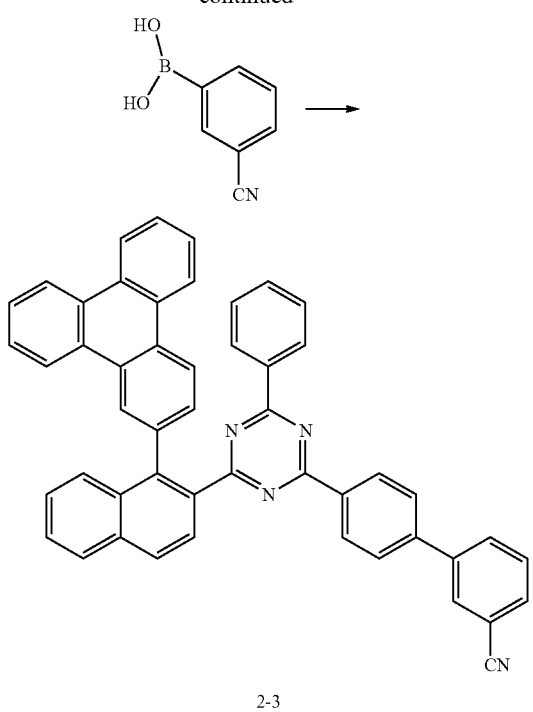

2-3

Compound 2-3 was prepared in the same manner as in Synthesis of Compound 2-1 except that 2-(4-chlorophenyl)-4-phenyl-6-(1-(triphenylen-2-yl)naphthalen-2-yl)-1,3,5-triazine was used instead of 2-(4-(4-bromonaphthalen-1-yl)phenyl)-4,6-diphenyl-1,3,5-triazine, and (3-cyanophenyl)boronic acid was used instead of 2-(4'-cyano-[1,1'-biphenyl]-4-yl)-4,4,5,5-tetramethyl-1,3,2-dioxaborolane.

[M+H]⁺=687

<Synthesis of Compound 2-4>

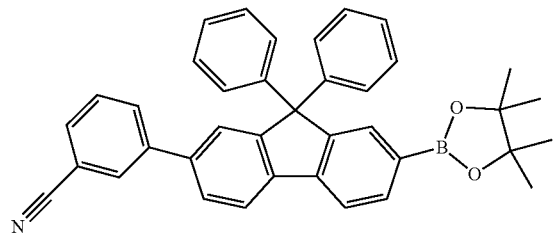

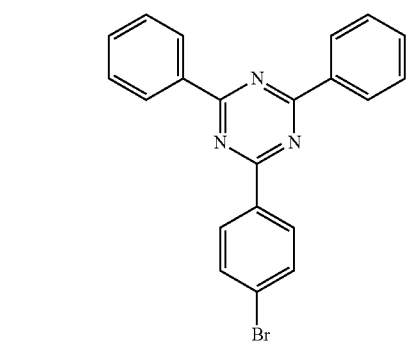

-continued

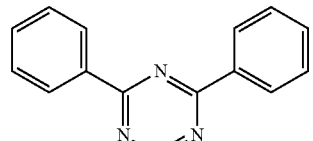

2-4

Compound 2-4 was prepared in the same manner as in Synthesis of Compound 2-1 except that 2-(4-bromophenyl)-4,6-diphenyl-1,3,5-triazine was used instead of 2-(4-(4-bromonaphthalen-1-yl)phenyl)-4,6-diphenyl-1,3,5-triazine, and 3-(9,9-diphenyl-7-(4,4,5,5-tetramethyl-1,3,2-dioxaborolan-2-yl)-9H-fluoren-2-yl)benzonitrile was used instead of 2-(4'-cyano-[1,1'-biphenyl]-4-yl)-4,4,5,5-tetramethyl-1,3,2-dioxaborolane.

[M+H]⁺=727

<Synthesis of Compound 2-5>

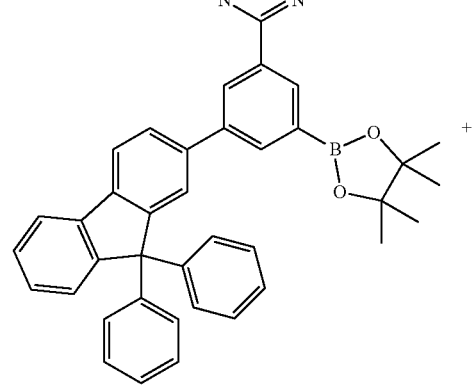

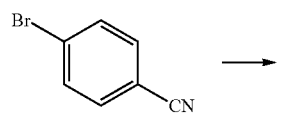

-continued

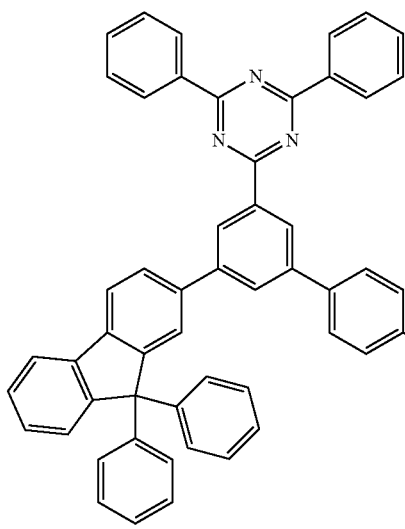

2-5

Compound 2-5 was prepared in the same manner as in Synthesis of Compound 2-1 except that 2-(3-(9,9-diphenyl-9H-fluoren-2-yl)-5-(4,4,5,5-tetramethyl-1,3,2-dioxaborolan-2-yl)phenyl)-4,6-diphenyl-1,3,5-triazine was used instead of 2-(4-(4-bromonaphthalen-1-yl)phenyl)-4,6-diphenyl-1,3,5-triazine, and 4-bromobenzonitrile was used instead of 2-(4'-cyano-[1,1'-biphenyl]-4-yl)-4,4,5,5-tetramethyl-1,3,2-dioxaborolane.

[M+H]$^+$=727

<Synthesis of Compound 2-6>

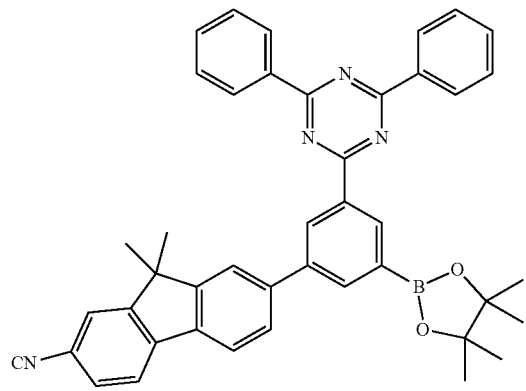

-continued

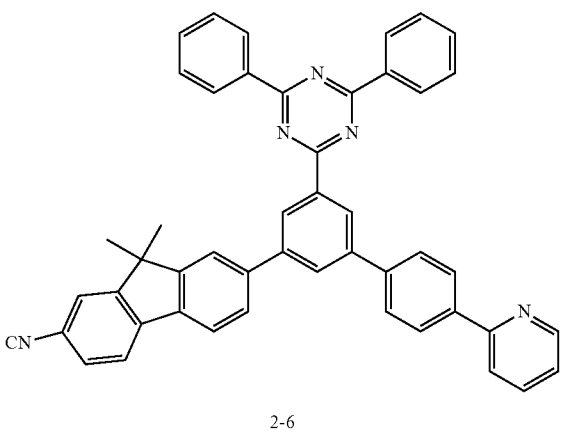

2-6

Compound 2-6 was prepared in the same manner as in Synthesis of Compound 2-1 except that 7-(3-(4,6-diphenyl-1,3,5-triazin-2-yl)-5-(4,4,5,5-tetramethyl-1,3,2-dioxaborolan-2-yl)phenyl)-9,9-dimethyl-9H-fluorene-2-carbonitrile was used instead of 2-(4-(4-bromonaphthalen-1-yl)phenyl)-4,6-diphenyl-1,3,5-triazine, and 2-(4-bromo-phenyl)pyridine was used instead of 2-(4'-cyano-[1,1'-biphenyl]-4-yl)-4,4,5,5-tetramethyl-1,3,2-dioxaborolane.

[M+H]$^+$=680

<Synthesis of Compound 2-7>

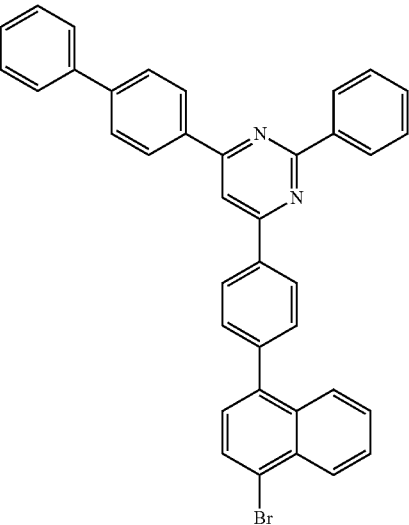

+

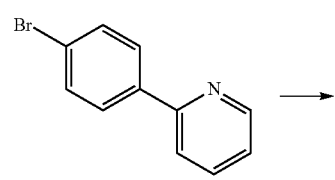

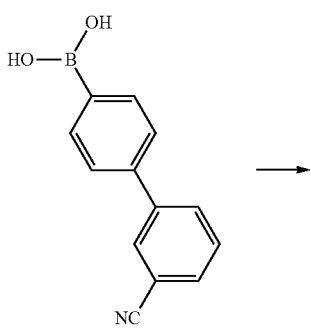

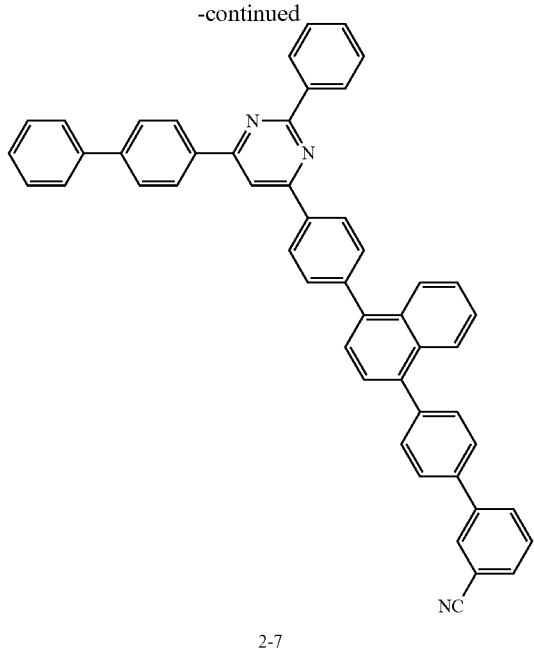

2-7

Compound 2-7 was prepared in the same manner as in Synthesis of Compound 2-1 except that 4-([1,1'-biphenyl]-4-yl)-6-(4-(4-bromonaphthalen-1-yl)phenyl)-2-phenylpyrimidine was used instead of 2-(4-(4-bromonaphthalen-1-yl)phenyl)-4,6-diphenyl-1,3,5-triazine, and (3'-cyano-[1,1'-biphenyl]-4-yl)boronic acid was used instead of 2-(4'-cyano-[1,1'-biphenyl]-4-yl)-4,4,5,5-tetramethyl-1,3,2-dioxaborolane.

[M+H]⁺=688

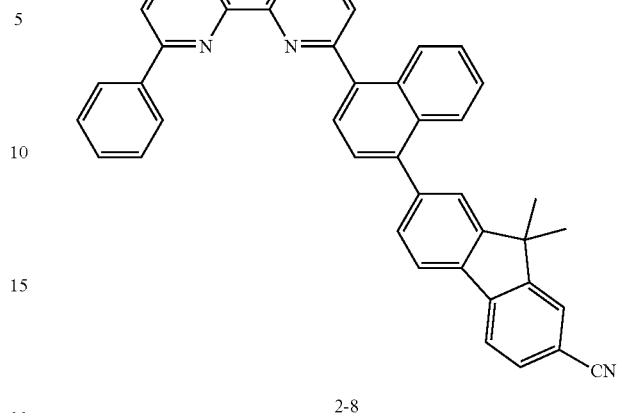

2-8

Compound 2-8 was prepared in the same manner as in Synthesis of Compound 2-1 except that 4-(9-phenyl-1,10-phenanthrolin-2-yl)naphthalen-1-yl 1,1,2,2,3,3,4,4,4-nonafluorobutane-1-sulfonate was used instead of 2-(4-(4-bromo-naphthalen-1-yl)phenyl)-4,6-diphenyl-1,3,5-triazine, and 9,9-dimethyl-7-(4,4,5,5-tetramethyl-1,3,2-dioxaborolan-2-yl)-9H-fluorene-2-carbonitrile was used instead of 2-(4'-cyano-[1,1'-biphenyl]-4-yl)-4,4,5,5-tetramethyl-1,3,2-dioxaborolane.

[M+H]⁺=600

<Synthesis of Compound 2-9>

<Synthesis of Compound 2-8>

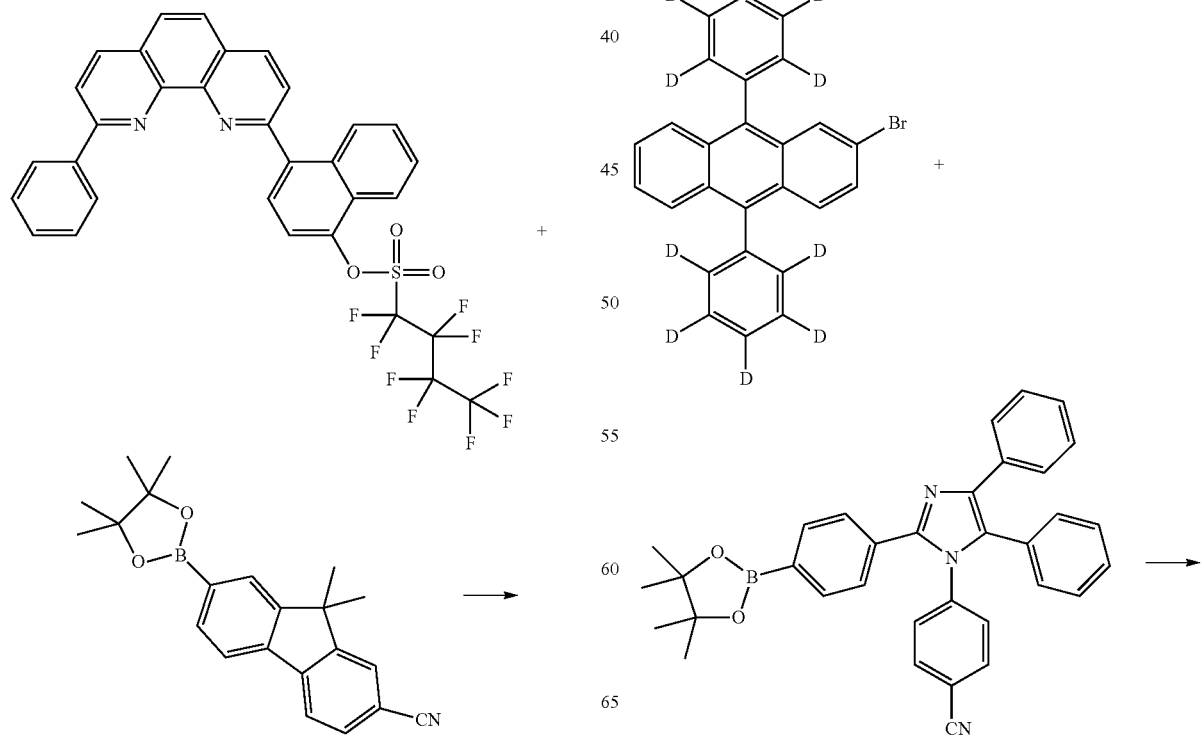

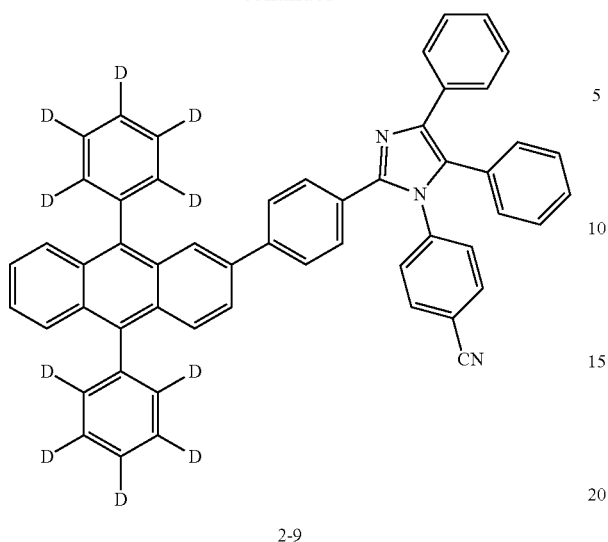

2-9

Compound 2-9 was prepared in the same manner as in Synthesis of Compound 2-1 except that 2-bromo-9,10-bis-(phenyl-d5)anthracene was used instead of 2-(4-(4-bromonaphthalen-1-yl)phenyl)-4,6-diphenyl-1,3,5-triazine, and 4-(4,5-diphenyl-2-(4-(4,4,5,5-tetramethyl-1,3,2-dioxaborolan-2-yl)phenyl)-1H-imidazol-1-yl)benzonitrile was used instead of 2-(4'-cyano-[1,1'-biphenyl]-4-yl)-4,4,5,5-tetramethyl-1,3,2-dioxaborolane.

[M+H]⁺=736

<Synthesis of Compound 2-10>

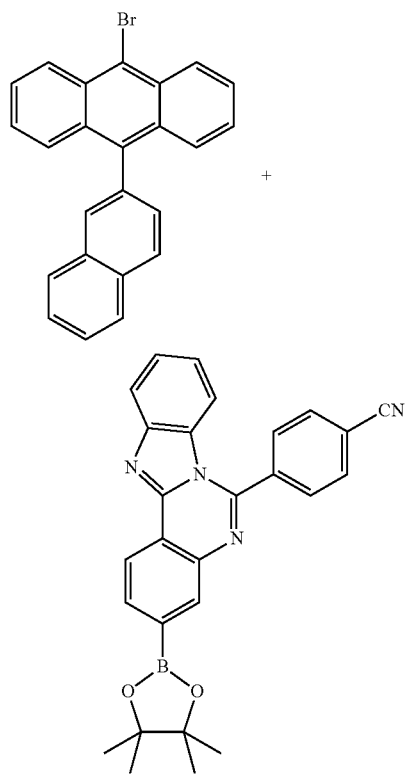

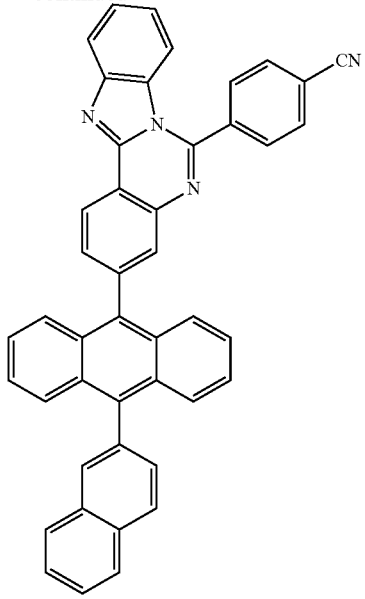

2-10

Compound 2-10 was prepared in the same manner as in Synthesis of Compound 2-1 except that 9-bromo-10-(naphthalen-2-yl)anthracene was used instead of 2-(4-(4-bromonaphthalen-1-yl)phenyl)-4,6-diphenyl-1,3,5-triazine, and 4-(3-(4,4,5,5-tetramethyl-1,3,2-dioxaborolan-2-yl)benzo[4,5]imidazo[1,2-c]quinazolin-6-yl)benzonitrile was used instead of 2-(4'-cyano-[1,1'-biphenyl]-4-yl)-4,4,5,5-tetramethyl-1,3,2-dioxaborolane.

[M+H]⁺=623

<Synthesis of Compound 2-11>

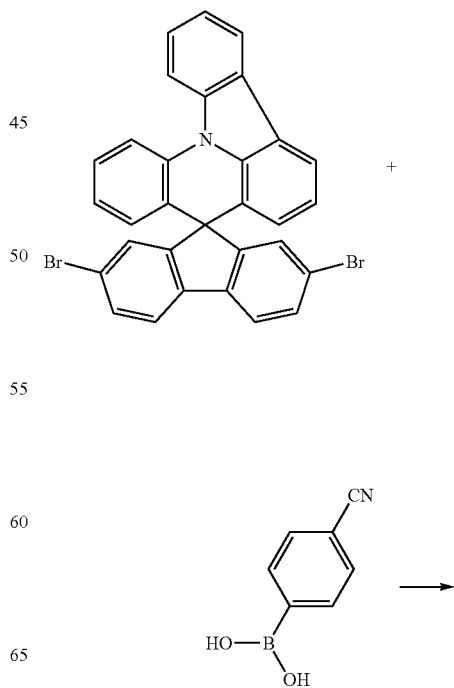

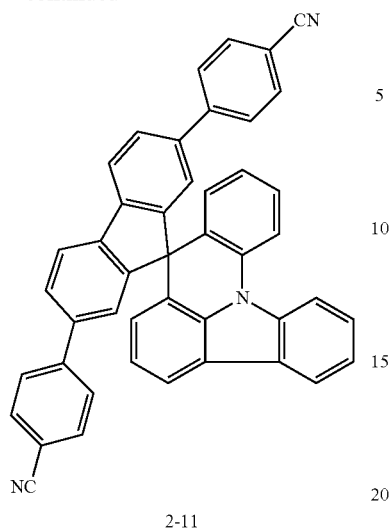

2-11

Compound 2-11 was prepared in the same manner as in Synthesis of Compound 2-1 except that 2,7-dibromospiro[fluorene-9,8'-indolo[3,2,1-de]acridine] was used instead of 2-(4-(4-bromonaphthalen-1-yl)phenyl)-4,6-diphenyl-1,3,5-triazine, and (4-cyanophenyl)boronic acid was used instead of 2-(4'-cyano-[1,1'-biphenyl]-4-yl)-4,4,5,5-tetramethyl-1,3,2-dioxaborolane.

$[M+H]^+=608$

<Synthesis of Compound 2-12>

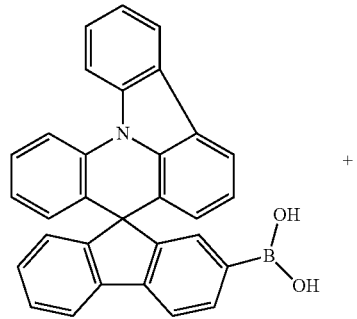

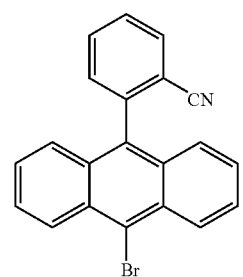

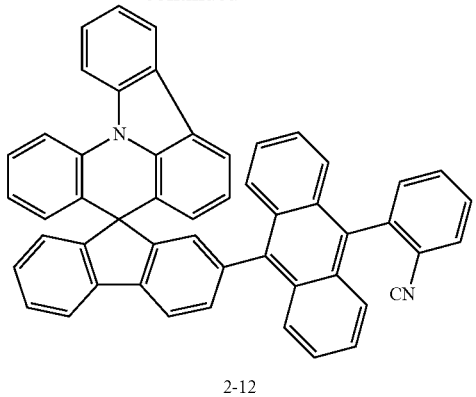

2-12

Compound 2-12 was prepared in the same manner as in Synthesis of Compound 2-1 except that 2-(10-bromoanthracen-9-yl)benzonitrile was used instead of 2-(4-(4-bromonaphthalen-1-yl)phenyl)-4,6-diphenyl-1,3,5-triazine, and spiro[fluorene-9,8'-indolo[3,2,1-de]acridin]-2-ylboronic acid was used instead of 2-(4'-cyano-[1,1'-biphenyl]-4-yl)-4,4,5,5-tetramethyl-1,3,2-dioxaborolane.

$[M+H]^+=683$

<Synthesis of Compound 2-13>

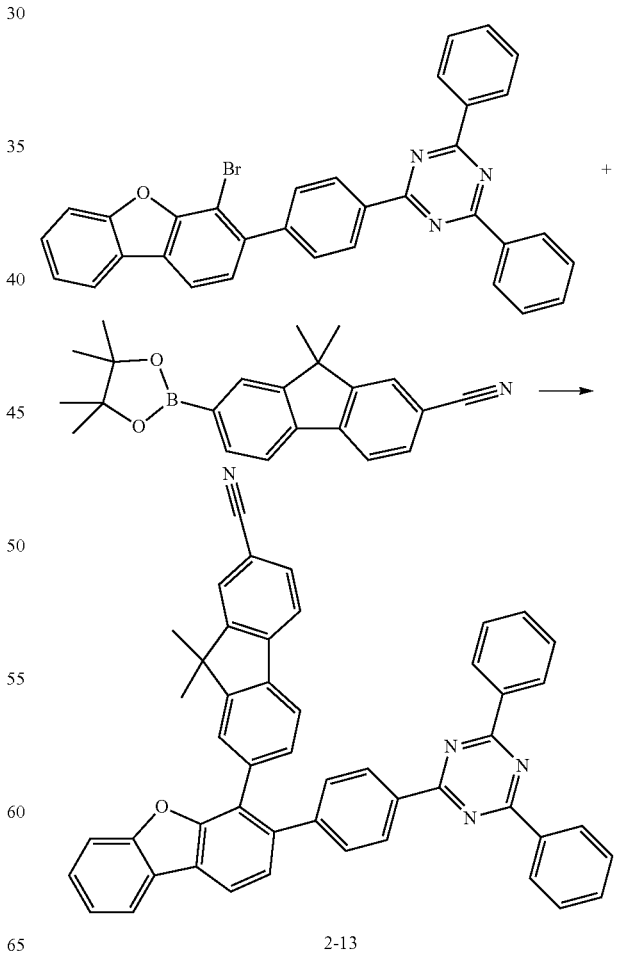

2-13

Compound 2-13 was prepared in the same manner as in Synthesis of Compound 2-1 except that 2-(4-(4-bromodibenzo-[b,d]furan-3-yl)phenyl)-4,6-diphenyl-1,3,5-triazine was used instead of 2-(4-(4-bromonaphthalen-1-yl)phenyl)-4,6-diphenyl-1,3,5-triazine, and 9,9-dimethyl-7-(4,4,5,5-tetramethyl-1,3,2-dioxaborolan-2-yl)-9H-fluorene-2-carbonitrile was used instead of 2-(4'-cyano-[1,1'-biphenyl]-4-yl)-4,4,5,5-tetramethyl-1,3,2-dioxaborolane.

[M+H]⁺=693

<Synthesis of Compound 2-14>

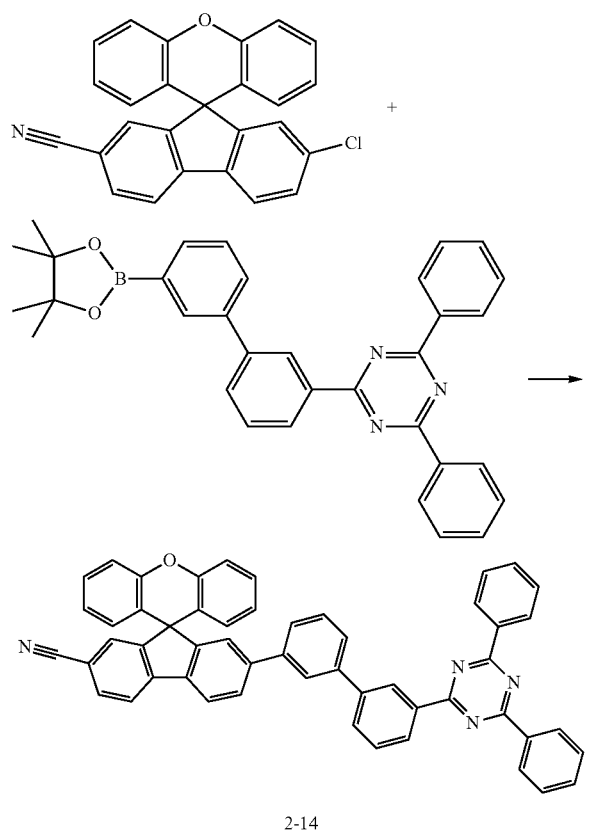

2-14

Compound 2-14 was prepared in the same manner as in Synthesis of Compound 2-1 except that 2,4-diphenyl-6-(3'-(4,4,5,5-tetramethyl-1,3,2-dioxaborolan-2-yl)-[1,1'-biphenyl]-3-yl)-1,3,5-triazine was used instead of 2-(4-(4-bromonaphthalen-1-yl)phenyl)-4,6-diphenyl-1,3,5-triazine, and 2-chlorospiro[fluorene-9,9'-xanthene]-7-carbonitrile was used instead of 2-(4'-cyano-[1,1'-biphenyl]-4-yl)-4,4,5,5-tetramethyl-1,3,2-dioxaborolane.

[M+H]⁺=741

<Synthesis of Compound 2-15>

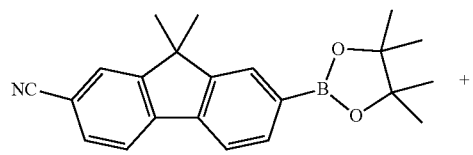

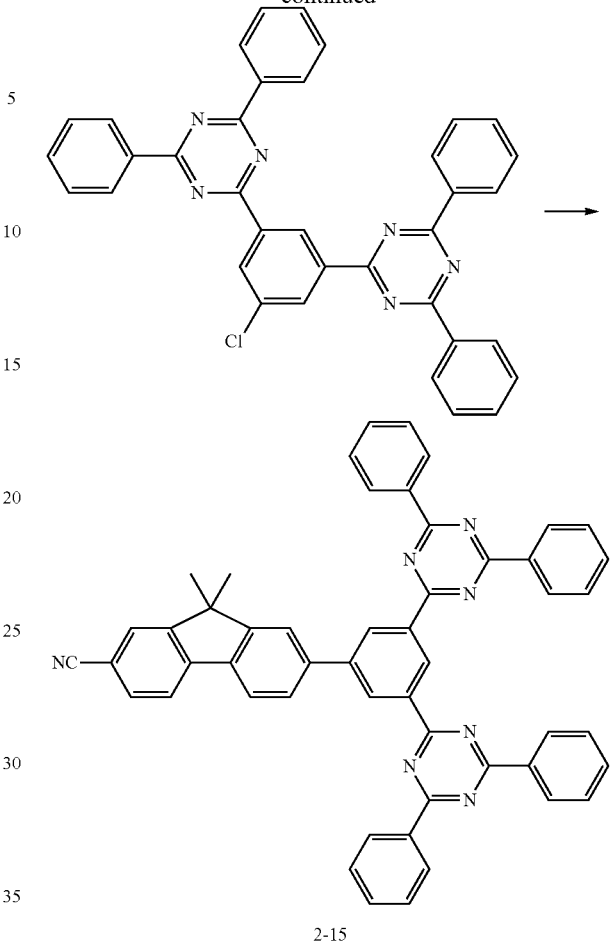

2-15

Compound 2-15 was prepared in the same manner as in Synthesis of Compound 2-1 except that 6,6'-(5-chloro-1,3-phenylene)bis(2,4-diphenyl-1,3,5-triazine) was used instead of 2-(4-(4-bromonaphthalen-1-yl)phenyl)-4,6-diphenyl-1,3, 5-triazine, and 9,9-dimethyl-7-(4,4,5,5-tetramethyl-1,3,2-dioxaborolan-2-yl)-9H-fluorene-2-carbonitrile was used instead of 2-(4'-cyano-[1,1'-biphenyl]-4-yl)-4,4,5,5-tetramethyl-1,3,2-dioxaborolane.

[M+H]⁺=758

<Synthesis of Compound 2-16>

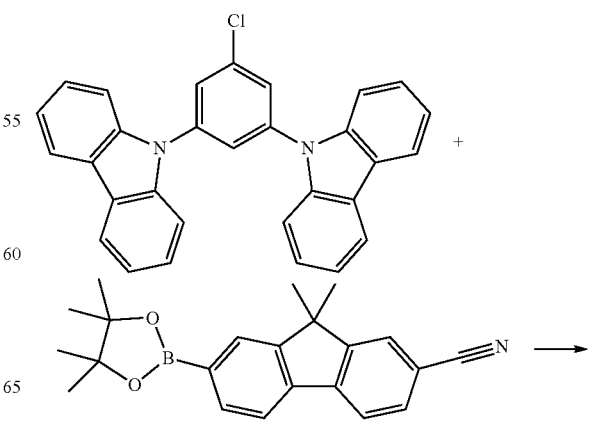

-continued

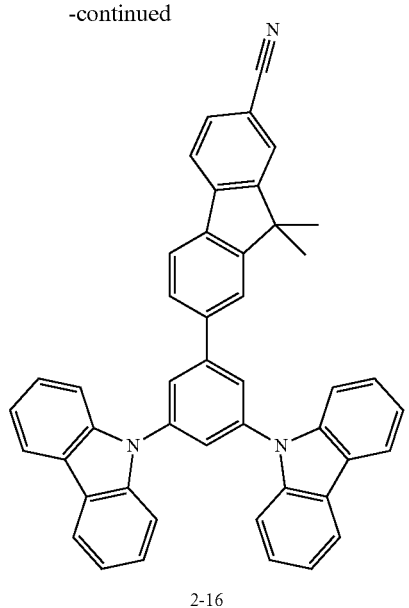

2-16

Compound 2-16 was prepared in the same manner as in Synthesis of Compound 2-1 except that 9,9'-(5-chloro-1,3-phenylene)bis(9H-carbazole) was used instead of 2-(4-(4-bromonaphthalen-1-yl)phenyl)-4,6-diphenyl-1,3,5-triazine, and 9,9-dimethyl-7-(4,4,5,5-tetramethyl-1,3,2-dioxaborolan-2-yl)-9H-fluorene-2-carbonitrile was used instead of 2-(4'-cyano-[1,1'-biphenyl]-4-yl)-4,4,5,5-tetramethyl-1,3,2-dioxaborolane.

[M+H]$^+$=626

<Synthesis of Compound 2-17>

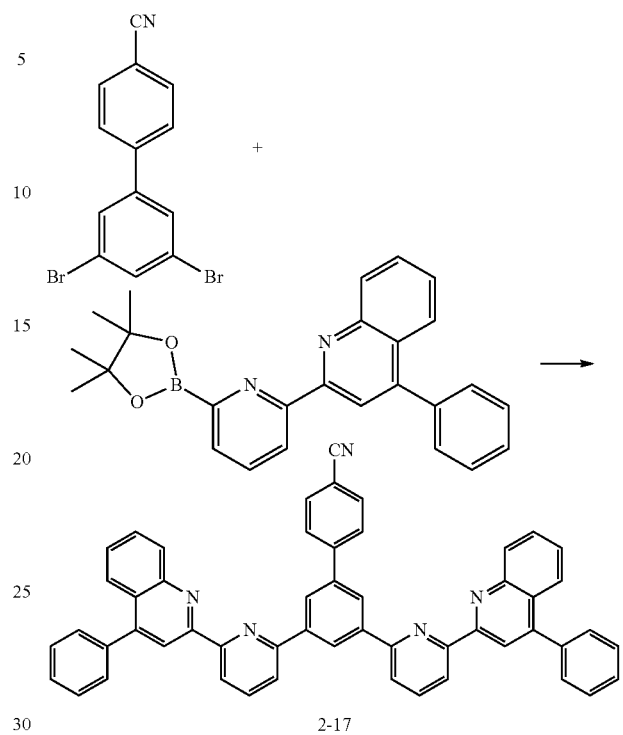

2-17

Compound 2-17 was prepared in the same manner as in Synthesis of Compound 2-1 except that 3',5'-dibromo-[1,1'-biphenyl]-4-carbonitrile was used instead of 2-(4-(4-bromonaphthalen-1-yl)phenyl)-4,6-diphenyl-1,3,5-triazine, and 4-phenyl-2-(6-(4,4,5,5-tetramethyl-1,3,2-dioxaborolan-2-yl)pyridin-2-yl)quinoline was used instead of 2-(4'-cyano-[1,1'-biphenyl]-4-yl)-4,4,5,5-tetramethyl-1,3,2-dioxaborolane.

[M+H]$^+$=740

<Synthesis of Compound 2-18>

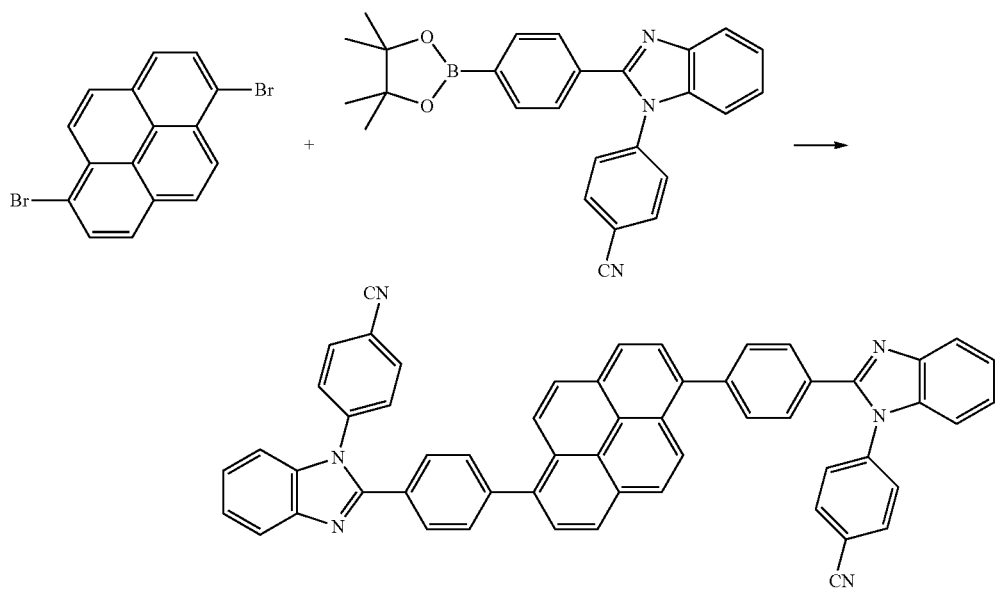

2-18
Compound 2-18

Compound 2-18 was prepared in the same manner as in Synthesis of Compound 2-1 except that 1,6-dibromopyrene was used instead of 2-(4-(4-bromonaphthalen-1-yl)phenyl)-4,6-diphenyl-1,3,5-triazine, and 4-(2-(4-(4,4,5,5-tetramethyl-1,3,2-dioxaborolan-2-yl)phenyl)-1H-benzo[d]imidazol-1-yl)-benzonitrile was used instead of 2-(4'-cyano-[1,1'-biphenyl]-4-yl)-4,4,5,5-tetramethyl-1,3,2-dioxaborolane.

[M+H]$^+$=789

Example 1

A glass substrate on which indium tin oxide (ITO) was coated as a thin film to a thickness of 100 nm was placed in distilled water containing dissolved detergent and ultrasonically cleaned. A product of Fischer Co. was used as the detergent, and as the distilled water, distilled water filtered twice with a filter manufactured by Millipore Co. was used. After the ITO was cleaned for 30 minutes, ultrasonic cleaning was repeated twice using distilled water for 10 minutes. After the cleaning with distilled water was finished, the substrate was ultrasonically cleaned with solvents of isopropyl alcohol, acetone and methanol, then dried, and then transferred to a plasma cleaner. The substrate was cleaned for 5 minutes using oxygen plasma, and then transferred to a vacuum depositor.

On the transparent ITO electrode prepared as above, a hole injection layer was formed by thermal vacuum depositing the following Compound HI-A to a thickness of 60 nm.

On the hole injection layer, a first hole transfer layer having a thickness of 5 nm was formed by vacuum depositing the following Compound HAT, and on the first hole transfer layer, a second hole transfer layer having a thickness of 50 nm was formed by vacuum depositing the following Compound HT-A.

Subsequently, a light emitting layer having a thickness of 20 nm was formed on the second hole transfer layer by vacuum depositing Compound 1-1 and Compound BD in a weight ratio of 25:1.

On the light emitting layer, an electron injection and transfer layer having a thickness of 35 nm was formed by vacuum depositing Compound 2-1 and the following Compound LiQ in a weight ratio of 1:1.

On the electron injection and transfer layer, a cathode was formed by depositing lithium fluoride (LiF) to a thickness of 1 nm and then subsequently depositing aluminum to a thickness of 100 nm, and as a result, an organic light emitting device was manufactured.

In the above-mentioned process, the deposition rates of the organic materials were maintained at 0.04 nm/sec to 0.09 nm/sec, the deposition rate of the lithium fluoride was maintained at 0.03 nm/sec, and the deposition rate of the aluminum was maintained at 0.2 nm/sec. The degree of vacuum during the deposition was maintained at 1×10$^{-7}$ torr to 5×10$^{-5}$ torr.

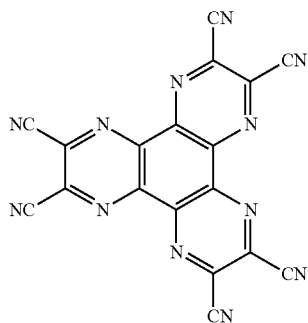

HAT

LiQ

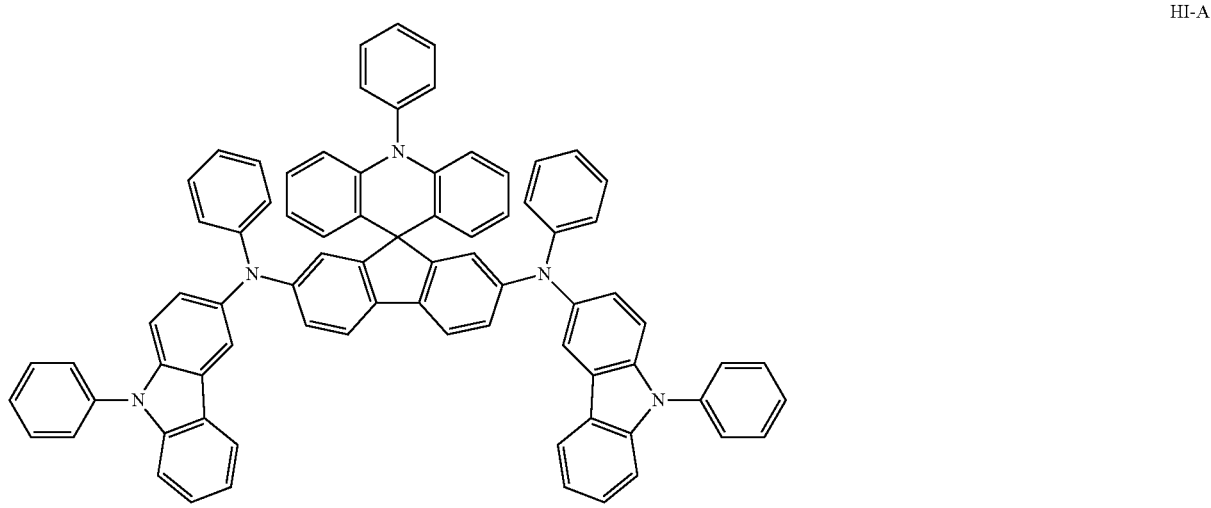

HI-A

HT-A
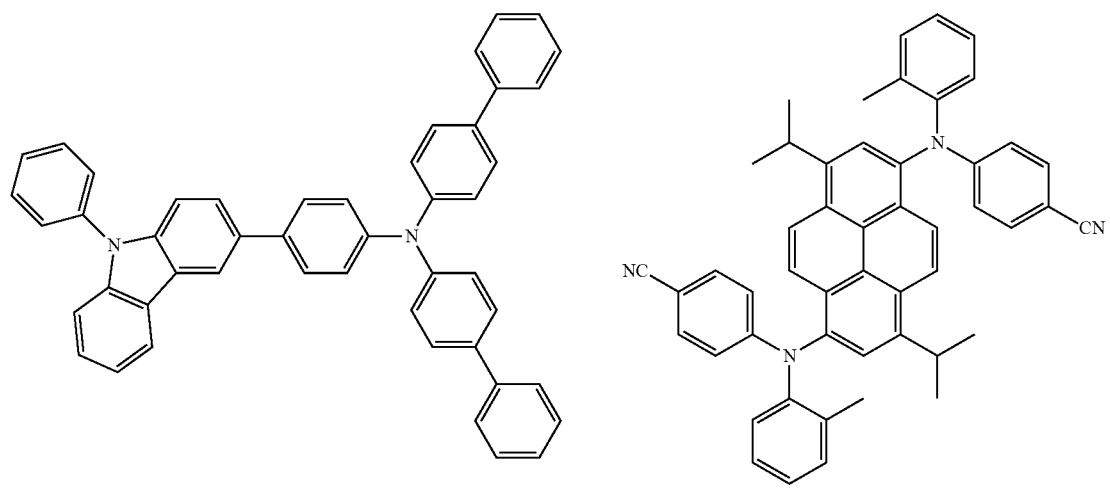
BD
Examples 2 to 18
Organic light emitting devices were manufactured in the same manner as in Example 1 except that compounds of the following Table 1 were used instead of Compound 1-1 and Compound 2-1.
1-1
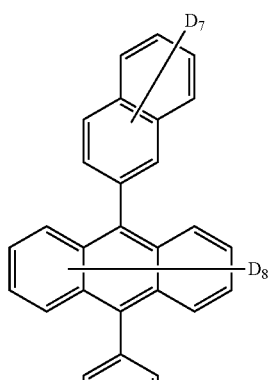
1-2
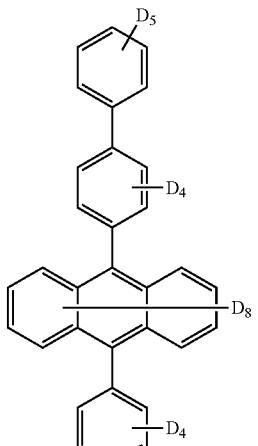
1-3
1-4
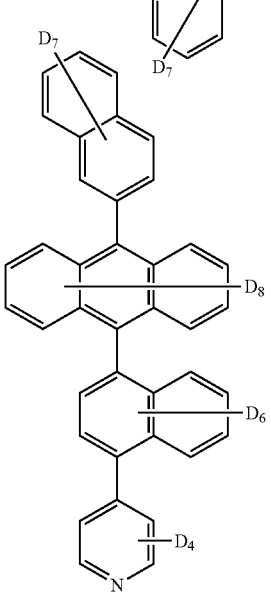

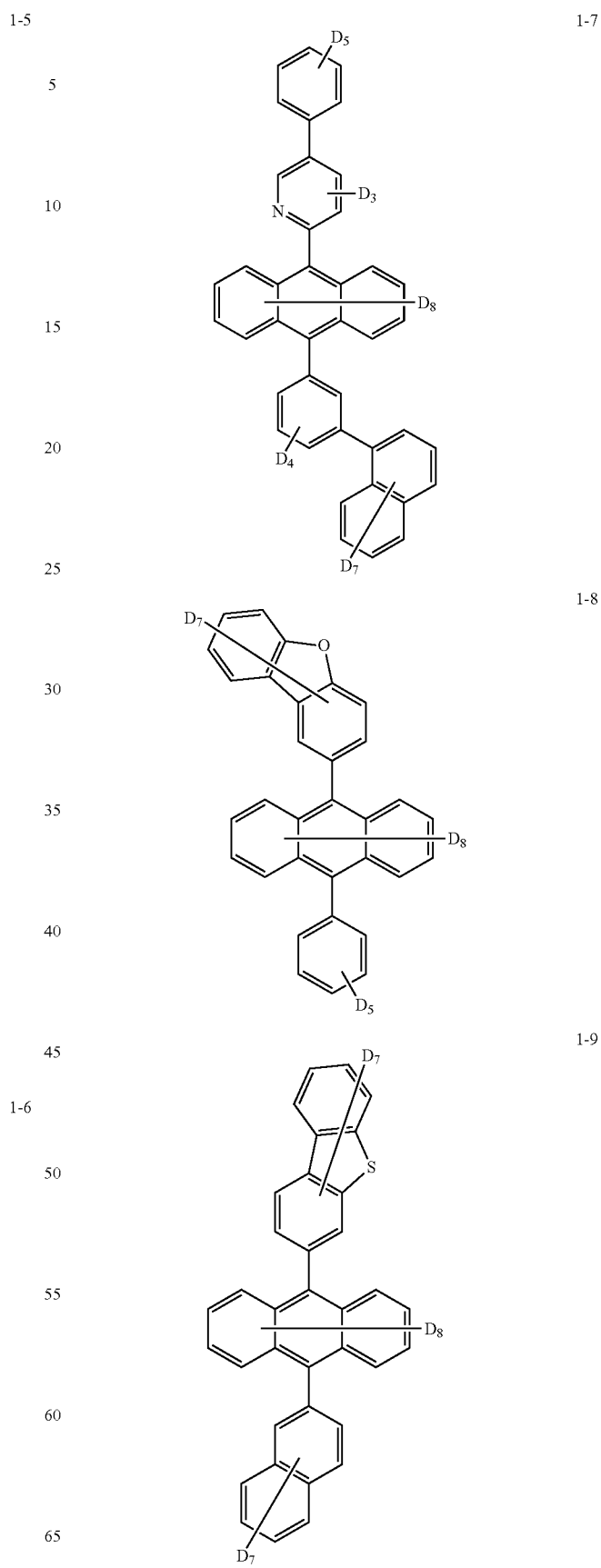

-continued

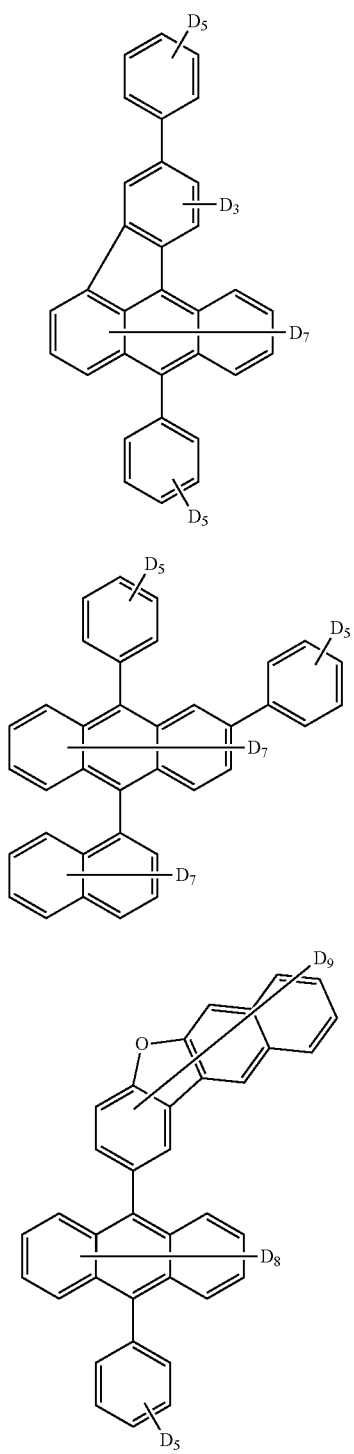

Comparative Examples 1 to 4

Organic light emitting devices were manufactured in the same manner as in Example 1 except that compounds of the following Table 1 were used instead of Compound 1-1 and Compound 2-1. As a reference, the electron injection and transfer layer of each of the devices of Comparative Examples 2 and 3 was formed to a thickness of 35 nm on the light emitting layer by vacuum depositing only Compound LiQ.

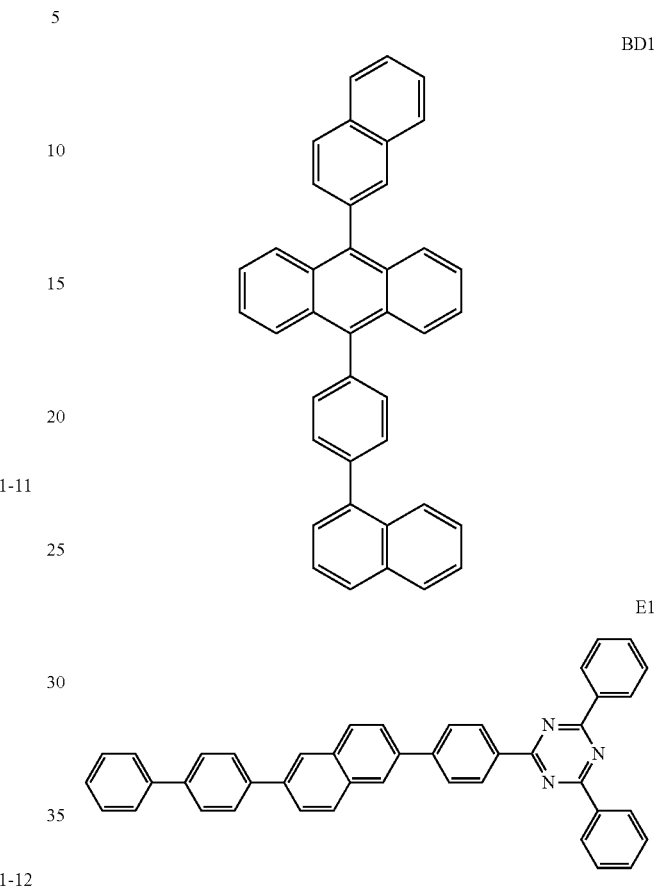

Voltage and efficiency of each of the organic light emitting devices of the examples and the comparative examples were measured under current density of 10 mA/cm$^2$, a lifetime (LT$_{90}$) was measured under current density of 20 mA/cm$^2$, and the results are shown in the following Table 1. Herein, LT$_{95}$ means time taken for luminance becoming 95% with respect to initial luminance. Color coordinate (x,y) means a CIE color coordinate.

TABLE 1

| | Light Emitting Layer | Electron Injection and Transfer Layer | Voltage | Efficiency | Color Coordinate (x, y) | LT$_{95}$ (h) |
|---|---|---|---|---|---|---|
| Example 1 | Compound 1-1 | Compound 2-1 | 4.02 | 4.93 | (0.142, 0.097) | 296 |
| Example 2 | Compound 1-1 | Compound 2-2 | 3.99 | 4.84 | (0.142, 0.097) | 258 |
| Example 3 | Compound 1-2 | Compound 2-3 | 4.07 | 4.95 | (0.142, 0.098) | 302 |
| Example 4 | Compound 1-4 | Compound 2-4 | 4.04 | 5.00 | (0.142, 0.096) | 279 |
| Example 5 | Compound 1-3 | Compound 2-5 | 4.13 | 4.89 | (0.142, 0.097) | 268 |
| Example 6 | Compound 1-6 | Compound 2-6 | 3.99 | 4.98 | (0.142, 0.096) | 288 |
| Example 7 | Compound 1-7 | Compound 2-7 | 4.07 | 5.02 | (0.142, 0.096) | 279 |
| Example 8 | Compound 1-5 | Compound 2-8 | 4.06 | 5.01 | (0.142, 0.097) | 283 |

TABLE 1-continued

| | Light Emitting Layer | Electron Injection and Transfer Layer | Voltage | Efficiency | Color Coordinate (x, y) | $LT_{95}$ (h) |
|---|---|---|---|---|---|---|
| Example 9 | Compound 1-8 | Compound 2-9 | 4.06 | 4.96 | (0.142, 0.097) | 257 |
| Example 10 | Compound 1-10 | Compound 2-10 | 4.14 | 5.05 | (0.142, 0.097) | 271 |
| Example 11 | Compound 1-11 | Compound 2-11 | 3.96 | 5.13 | (0.142, 0.096) | 287 |
| Example 12 | Compound 1-12 | Compound 2-12 | 3.97 | 5.08 | (0.142, 0.096) | 274 |
| Example 13 | Compound 1-9 | Compound 2-13 | 4.00 | 5.02 | (0.142, 0.096) | 280 |
| Example 14 | Compound 1-1 | Compound 2-14 | 4.02 | 5.01 | (0.142, 0.097) | 284 |
| Example 15 | Compound 1-8 | Compound 2-15 | 4.06 | 4.94 | (0.142, 0.096) | 288 |
| Example 16 | Compound 1-11 | Compound 2-16 | 4.08 | 4.85 | (0.142, 0.097) | 286 |
| Example 17 | Compound 1-2 | Compound 2-17 | 4.03 | 4.96 | (0.142, 0.096) | 276 |
| Example 18 | Compound 1-12 | Compound 2-18 | 4.11 | 5.00 | (0.142, 0.097) | 293 |
| Comparative Example 1 | Compound 1-1 | Compound E1 | 4.16 | 4.51 | (0.142, 0.097) | 101 |
| Comparative Example 2 | Compound 1-1 | Compound LiQ | 4.27 | 4.44 | (0.142, 0.096) | 98 |
| Comparative Example 3 | Compound 1-3 | Compound LiQ | 4.14 | 4.39 | (0.142, 0.097) | 106 |
| Comparative Example 4 | Compound BD1 | Compound 2-1 | 4.15 | 4.62 | (0.142, 0.097) | 92 |

From Table 1, it was identified that the device using the compound of Chemical Formula 1 of the present disclosure in the light emitting layer and the compound of Chemical Formula 2 in the organic material layer provided between the cathode and the light emitting layer had low driving voltage, high efficiency and excellent lifetime properties.

The invention claimed is:

1. An organic light emitting device, comprising:
an anode;
a cathode;
a light emitting layer provided between the anode and the cathode; and
an electron injection layer, an electron transfer layer, an electron injection and transfer layer, or an electron control layer provided between the cathode and the light emitting layer,
wherein the light emitting layer comprises a compound of the following Chemical Formula 1; and
the electron injection layer, the electron transfer layer, the electron injection and transfer layer, or the electron control layer provided between the cathode and the light emitting layer comprises a compound of the following Chemical Formula 2:

Chemical Formula 1

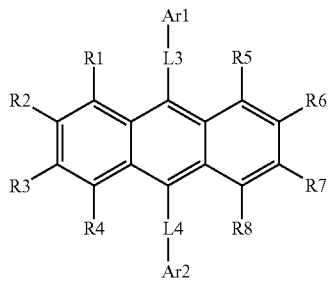

wherein in Chemical Formula 1:
L3 is a direct bond or a substituted or unsubstituted arylene group, or bonds to R1 to form a substituted or unsubstituted ring;
L4 is a direct bond or a substituted or unsubstituted arylene group;
Ar1 and Ar2 are the same as or different from each other, and each independently is hydrogen, deuterium, a substituted or unsubstituted aryl group, or a substituted or unsubstituted heteroaryl group;
R1 is hydrogen, deuterium, a substituted or unsubstituted alkyl group, —OR, —SiRaRbRc, —OSiRaRbRc, a substituted or unsubstituted aryl group, or —NRmRn, or bonds to L3 to form a substituted or unsubstituted ring;
R2 to R8 are the same as or different from each other, and each independently is hydrogen, deuterium, a substituted or unsubstituted alkyl group, —OR, —SiRaRbRc, —OSiRaRbRc, a substituted or unsubstituted aryl group, or —NRmRn;
R, Ra, Rb, Rc, Rm and Rn are the same as or different from each other, and each independently is hydrogen, deuterium, an alkyl group, or an aryl group; and
the compound of Chemical Formula 1 comprises at least one deuterium;

Chemical Formula 2

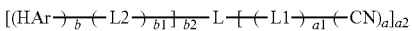

HAr is a substituted or unsubstituted nitrogen-containing heterocyclic group;
L2 is an unsubstituted phenylene group, a substituted or unsubstituted naphthylenylene group, a substituted or unsubstituted fluorenylene group, a substituted or unsubstituted anthracenylene group, a substituted or unsubstituted divalent spiro[fluorene-9,9'-xanthene] group, a substituted or unsubstituted divalent pyridinyl group, a substituted or unsubstituted divalent carbazole group, a substituted or unsubstituted divalent benzimidazole group, or a substituted or unsubstituted divalent dibenzofuranyl group;
L is a substituted or unsubstituted divalent to tetravalent naphthyl group, a substituted or unsubstituted divalent to tetravalent fluorenyl group, a substituted or unsubstituted divalent to tetravalent anthracenyl group, a substituted or unsubstituted divalent to tetravalent spiro[fluorene-9,9'-xanthene] group, a substituted or unsubstituted divalent to tetravalent carbazolyl group, a substituted or unsubstituted divalent to tetravalent benzimidazole group, or a substituted or unsubstituted divalent to tetravalent dibenzofuranyl group;
L1 is a substituted or unsubstituted phenylene group, a substituted or unsubstituted biphenylene group, a terphenylene group, a substituted or unsubstituted naphthylenylene group, a substituted or unsubstituted anthracenylene group, a substituted or unsubstituted divalent spiro[fluorene-9,9'-xanthene] group, a substituted or unsubstituted divalent carbazole group, a substituted or unsubstituted divalent benzimidazole group, a substituted or unsubstituted divalent dibenzofuranyl group, or a 9,9-diphenylfluorenyl group;

a1 is an integer of 1 to 3, and when a1 is 2 or greater, the L1s are the same as or different from each other;

b1 is an integer of 1 to 3, and when b1 is 2 or greater, the L2s are the same as or different from each other;

a is 1 or 2;

b is 1 or 2, and when b is 2, the HArs are the same as or different from each other;

a2 is 1 or 2, and b2 is 1 or 2;

when a2 is 2, the -[(L1)$_{a1}$-(CN)$_a$]s are the same as or different from each other; and when b2 is 2, the -[(L2)$_{b1}$-(HAr)$_b$]s are the same as or different from each other.

2. The organic light emitting device of claim 1, wherein at least one of R1 to R8 is deuterium.

3. The organic light emitting device of claim 1, wherein at least one of L3 and L4 is deuterated.

4. The organic light emitting device of claim 1, wherein at least one of Ar1 and Ar2 is deuterium or a deuterated aryl group.

5. The organic light emitting device of claim 1, wherein Ar1 and Ar2 are the same as or different from each other, and each independently is hydrogen, deuterium, a phenyl group that is unsubstituted or substituted with deuterium, a naphthylphenyl group that is unsubstituted or substituted with deuterium, a biphenyl group that is unsubstituted or substituted with deuterium, a naphthyl group that is unsubstituted or substituted with deuterium, a phenanthrenyl group that is unsubstituted or substituted with deuterium, a fluoranthenyl group that is unsubstituted or substituted with deuterium, a phenylpyridinyl group that is unsubstituted or substituted with deuterium, a dibenzofuranyl group that is unsubstituted or substituted with deuterium, a dibenzothiophenyl group that is unsubstituted or substituted with deuterium, or a benzonaphthothiophenyl group that is unsubstituted or substituted with deuterium.

6. The organic light emitting device of claim 1, wherein HAr is a substituted or unsubstituted pyrimidinyl group, a substituted or unsubstituted pyridinyl group, a substituted or unsubstituted triazinyl group, a substituted or unsubstituted carbazolyl group, a substituted or unsubstituted imidazolyl group, a substituted or unsubstituted benzimidazolyl group, a substituted or unsubstituted phenanthrolinyl group, a substituted or unsubstituted benzo[4,5]imidazo[1,2-c]quinazolinyl group, a substituted or unsubstituted benzo[4,5]imidazo[1,2f]-phenanthridinyl group, or a substituted or unsubstituted spiro[fluorene-9,8'-indolo[3,2,1-di]acridinyl] group.

7. The organic light emitting device of claim 1, wherein a is 2.

8. The organic light emitting device of claim 1, wherein b is 2.

9. The organic light emitting device of claim 1, wherein the compound of Chemical Formula 2 is any one compound selected from among the following compounds:

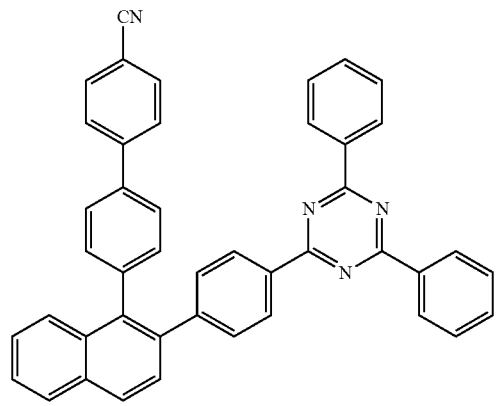

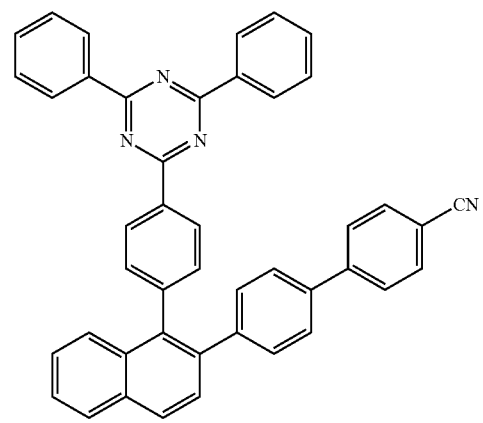

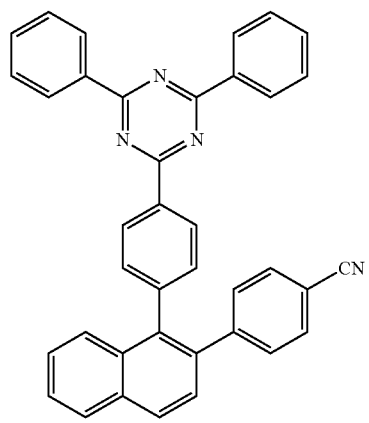

79
-continued
80
-continued
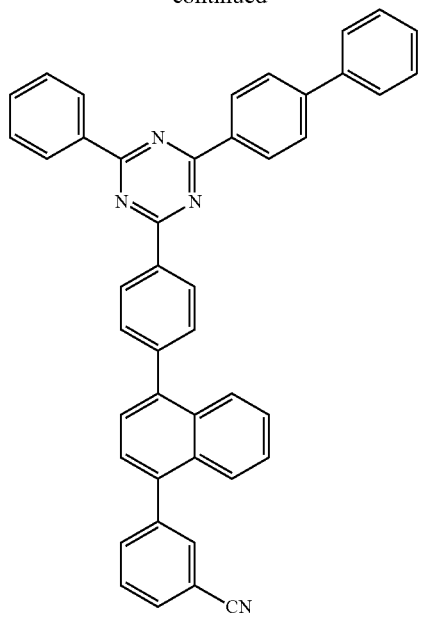
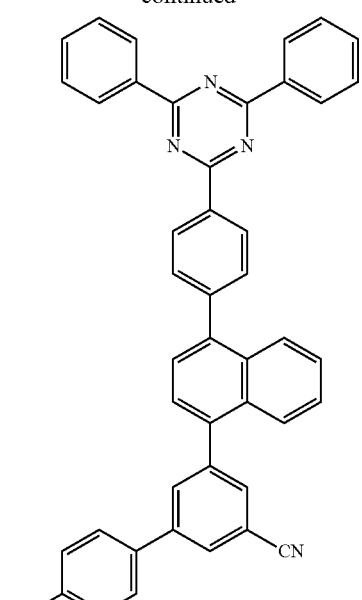
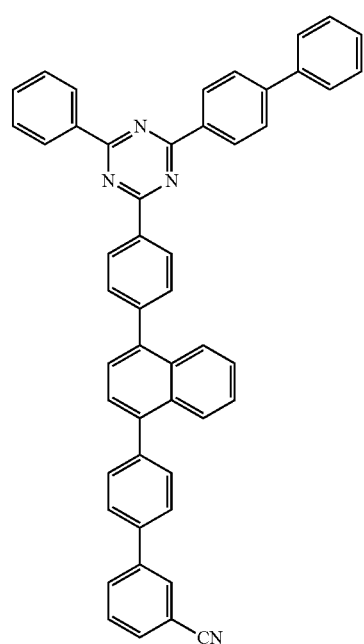
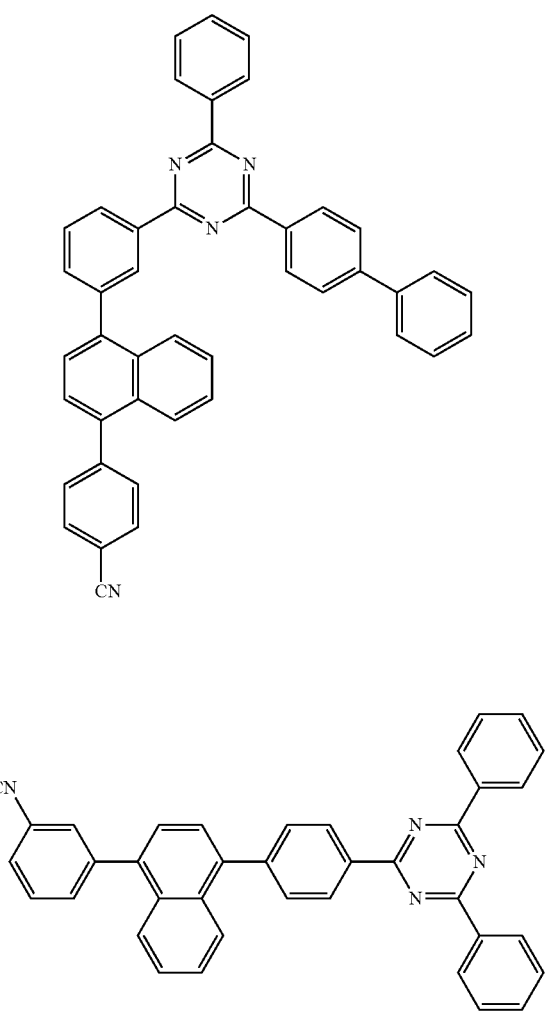

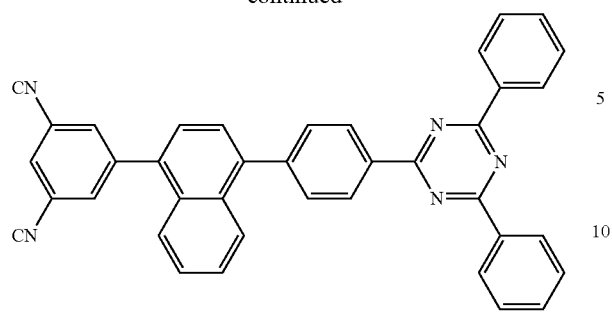
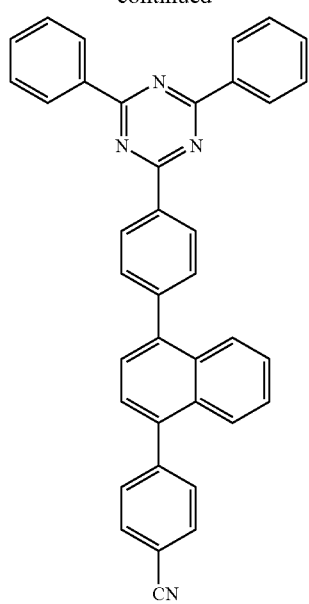
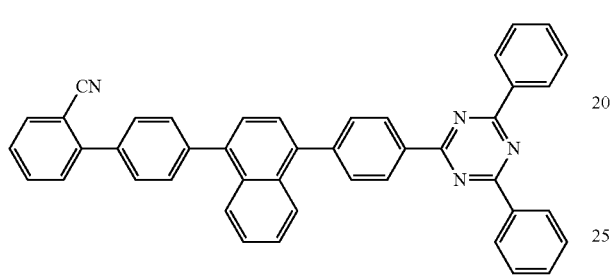
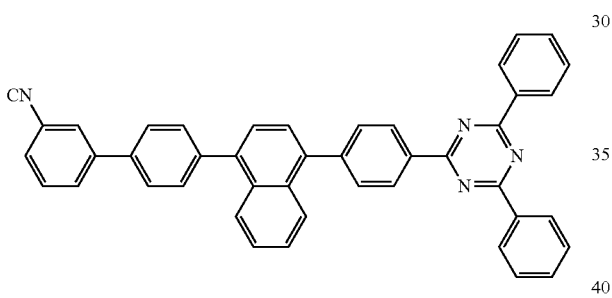
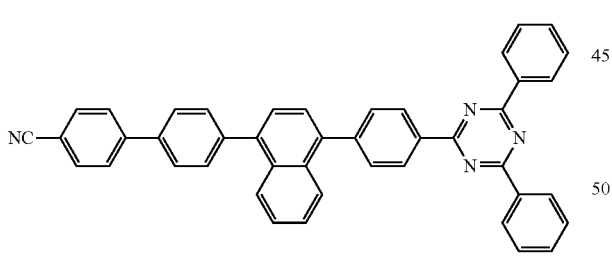
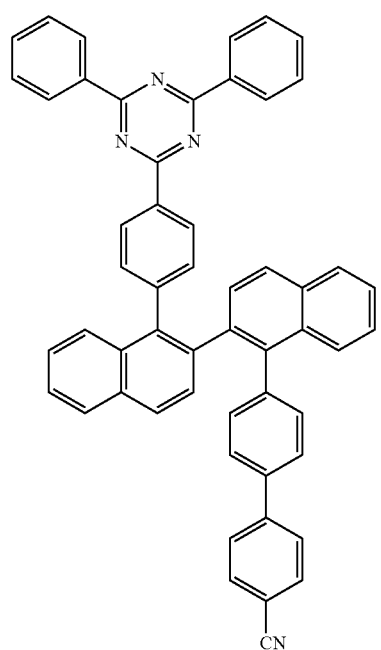
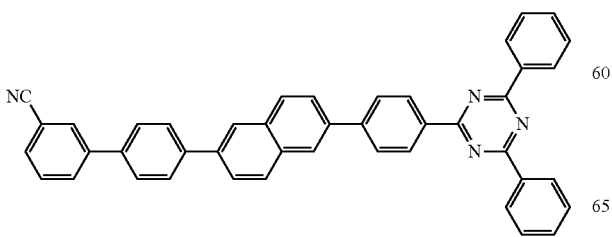

83
-continued
84
-continued
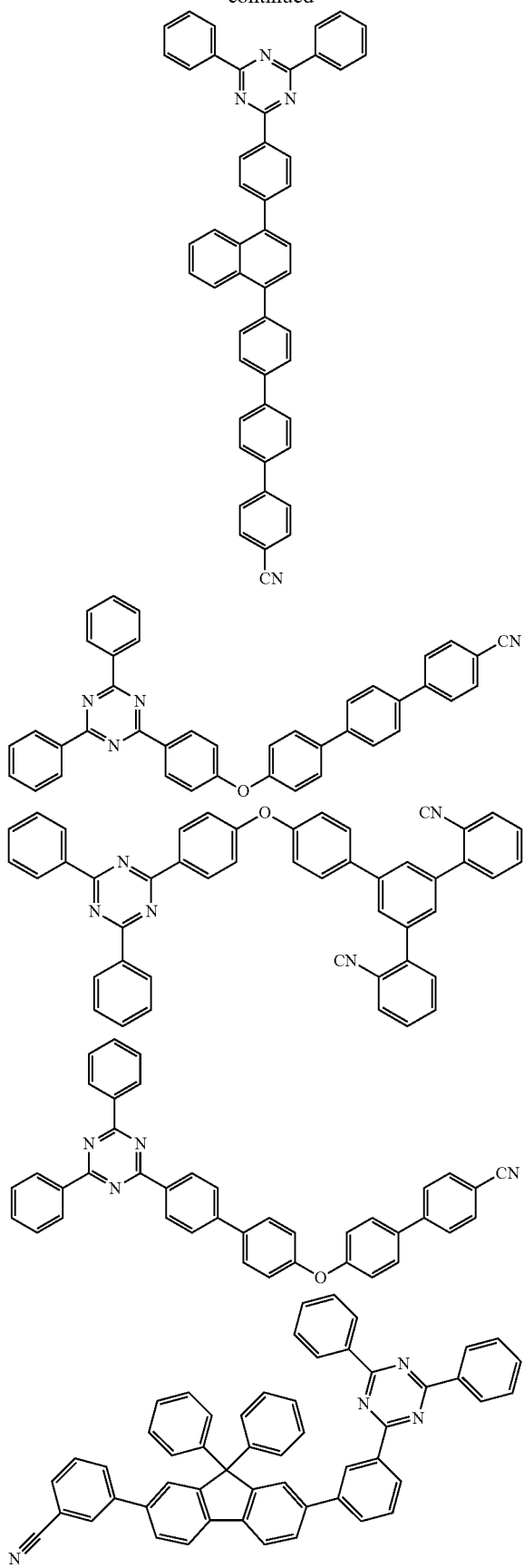
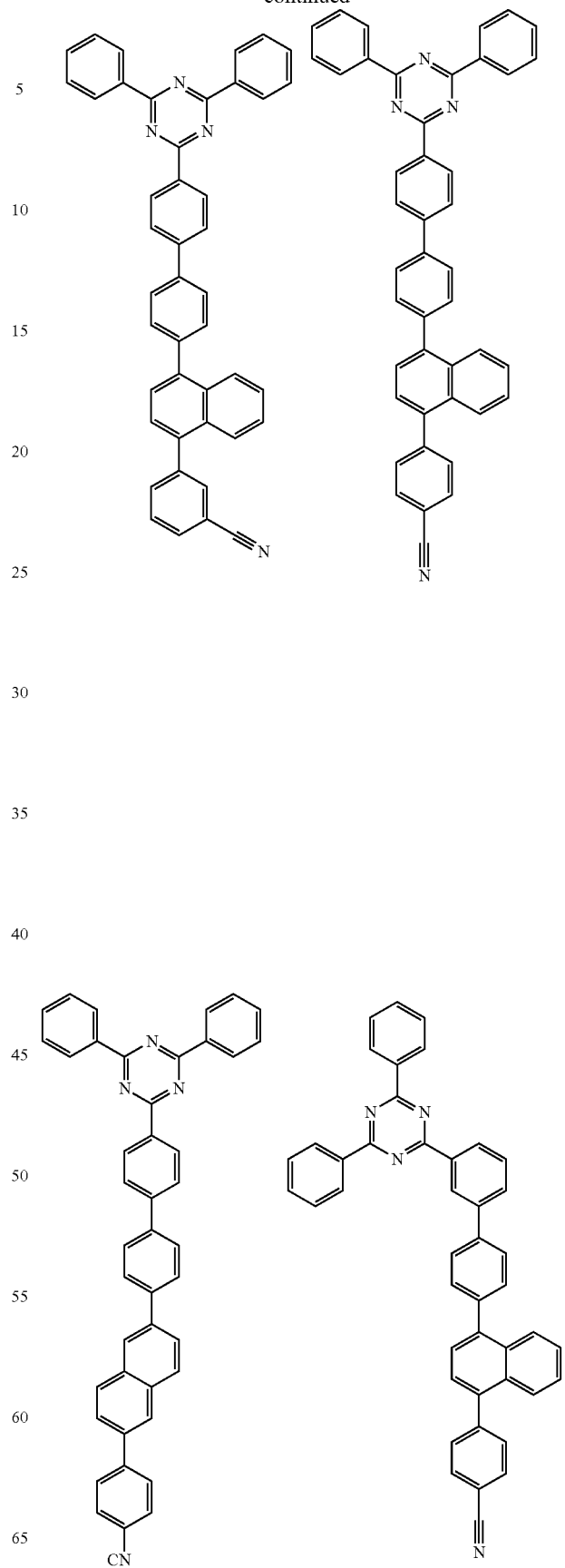

85
-continued
86
-continued
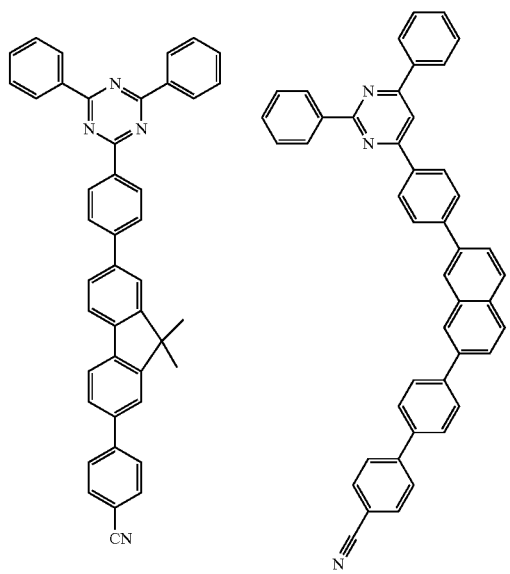
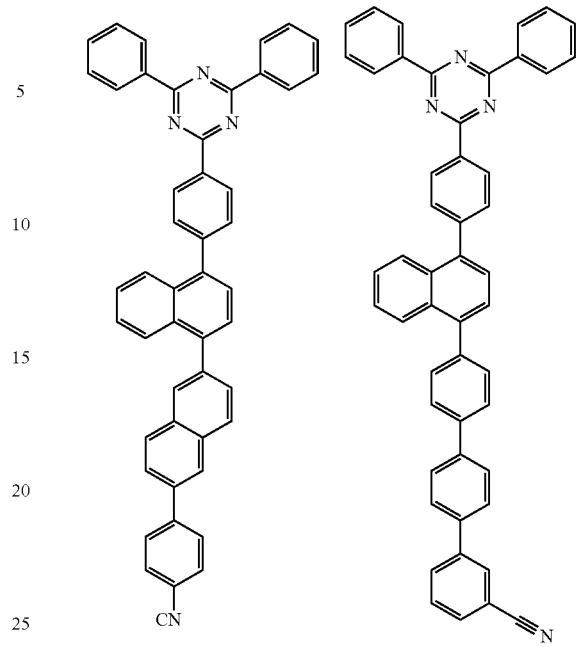
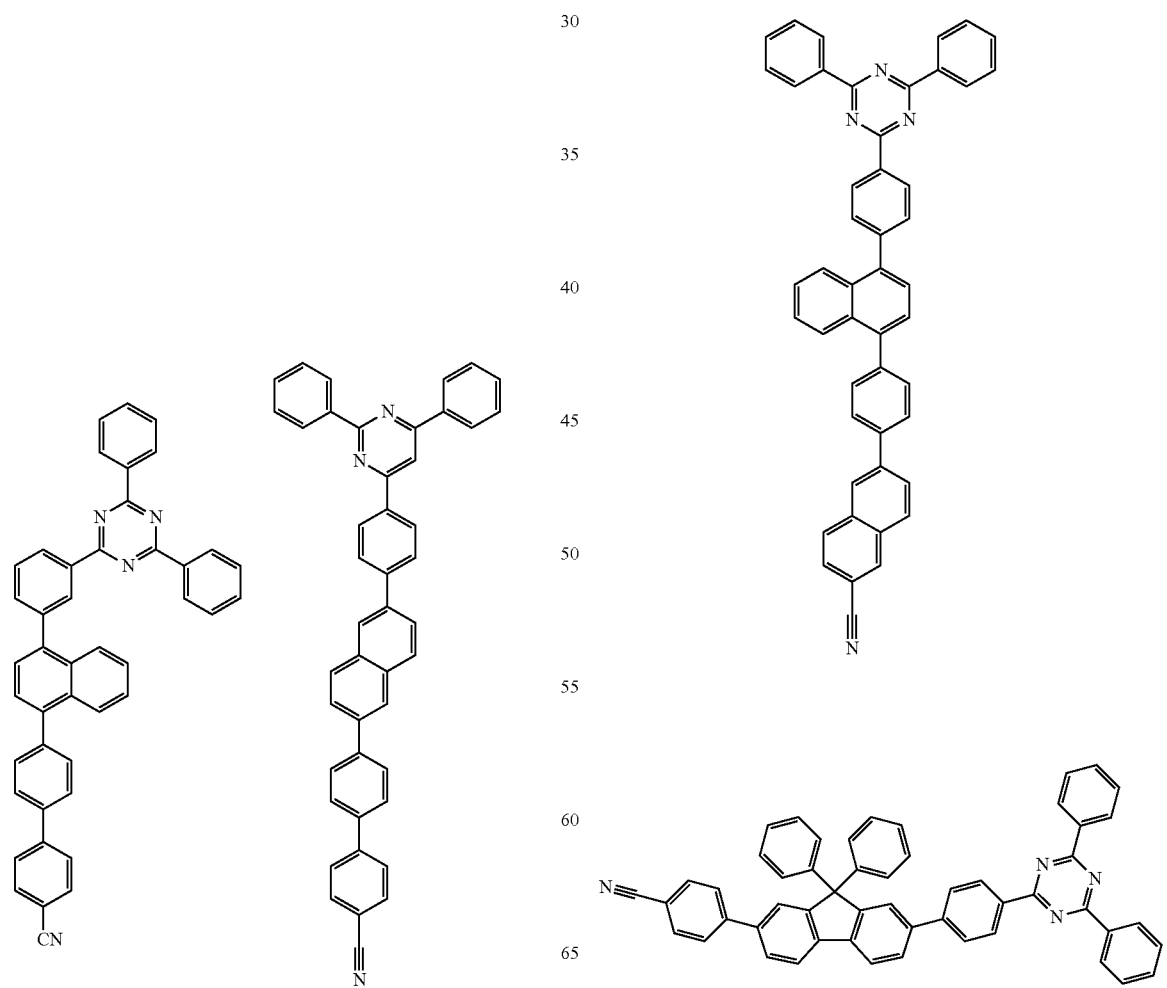

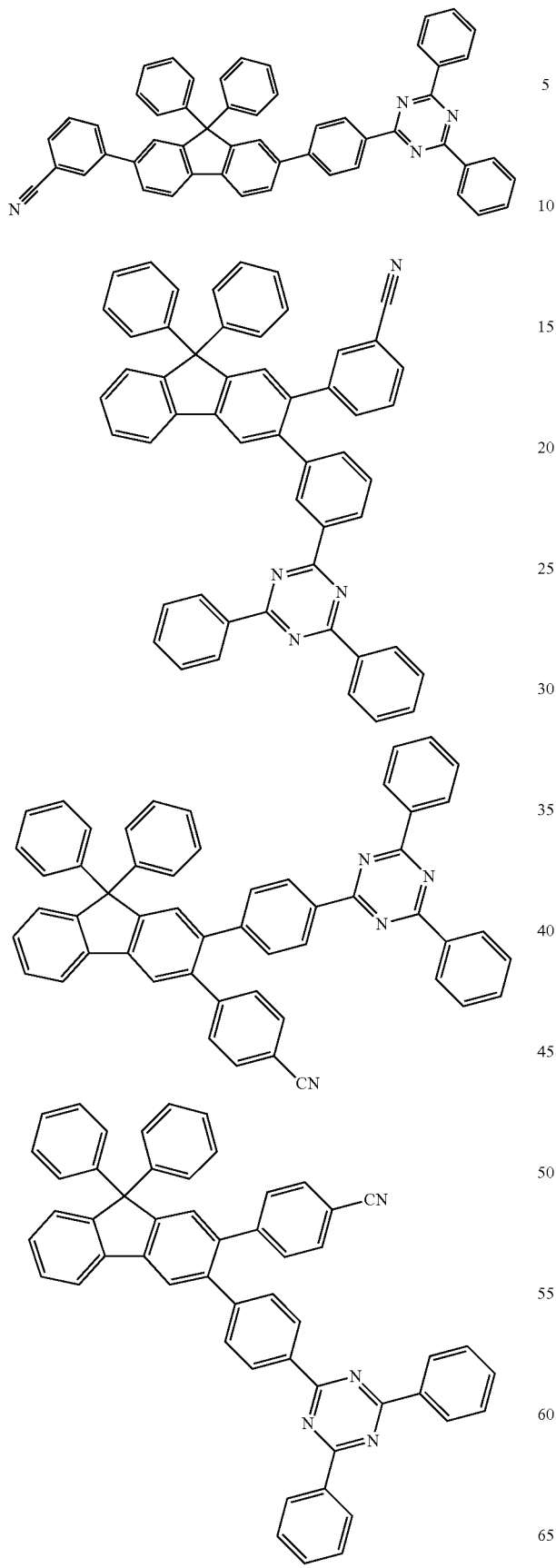
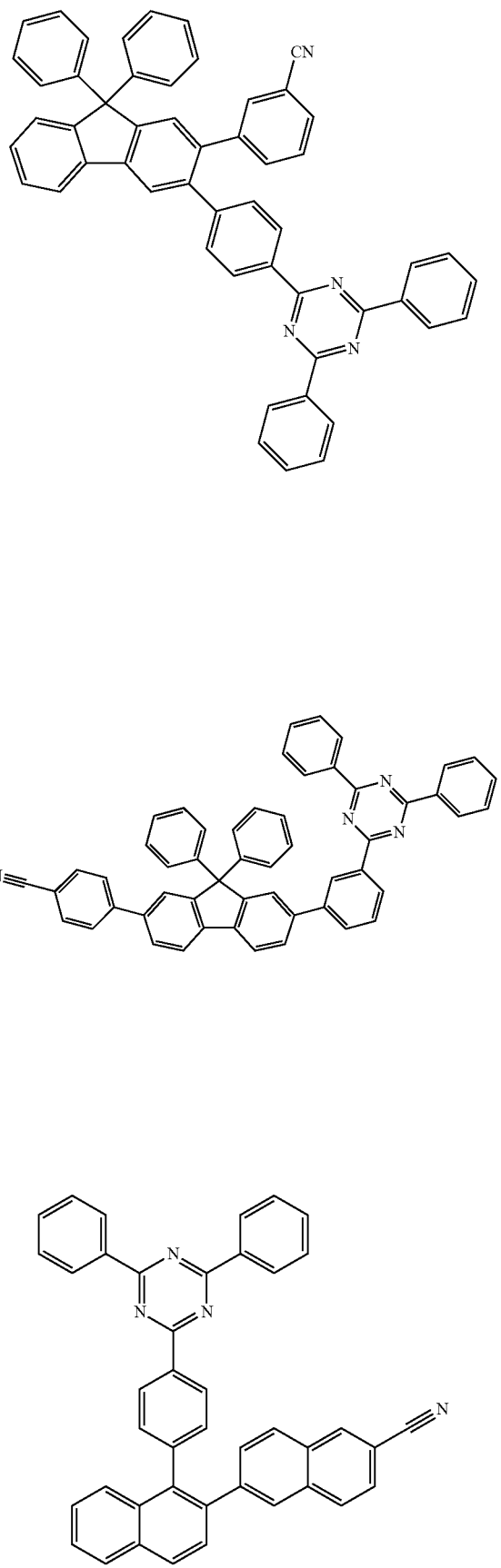

89
-continued
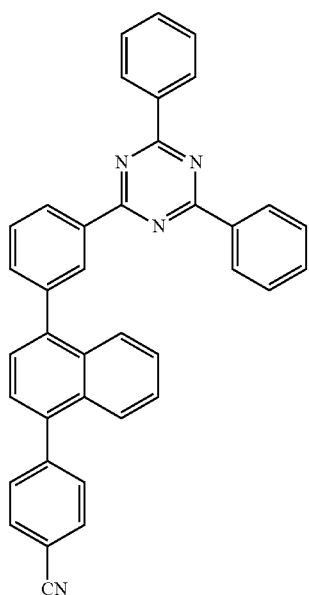
90
-continued
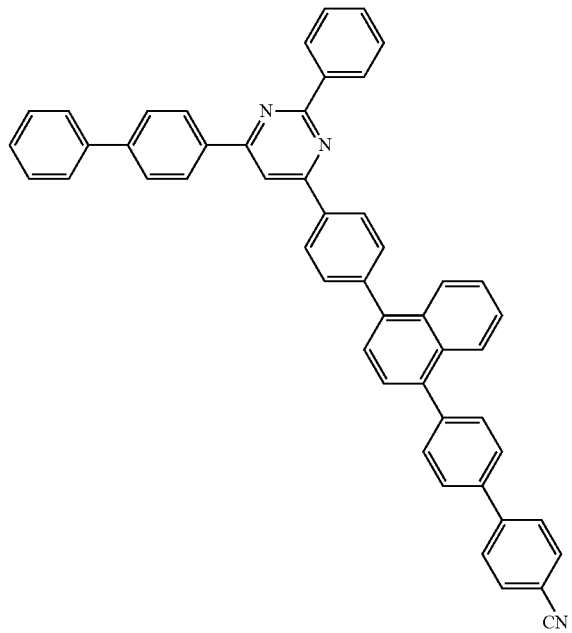
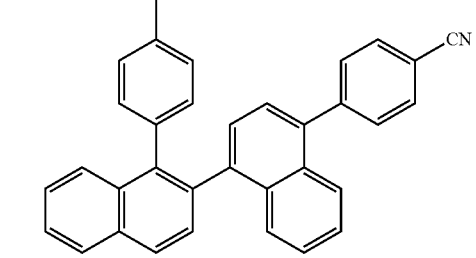
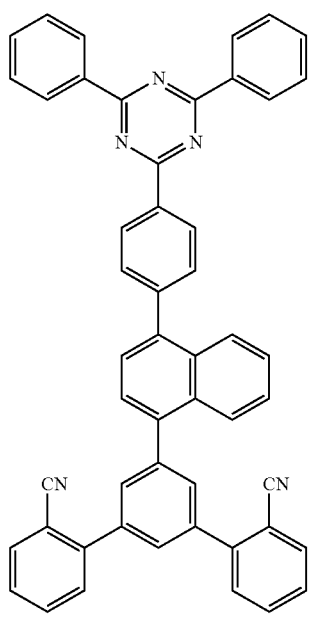
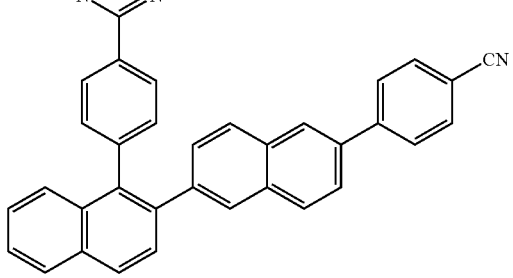

91
-continued
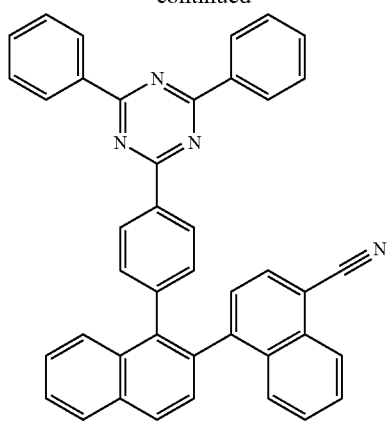
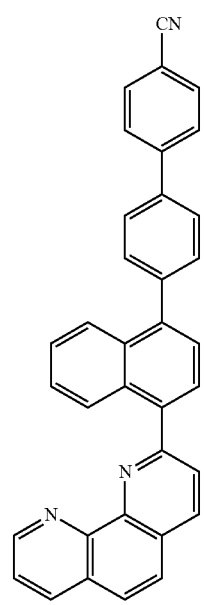
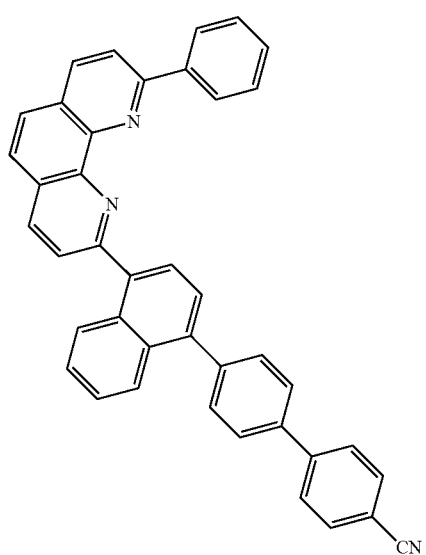
92
-continued
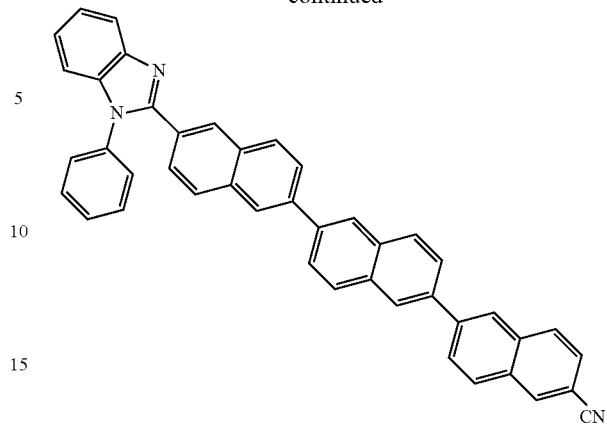
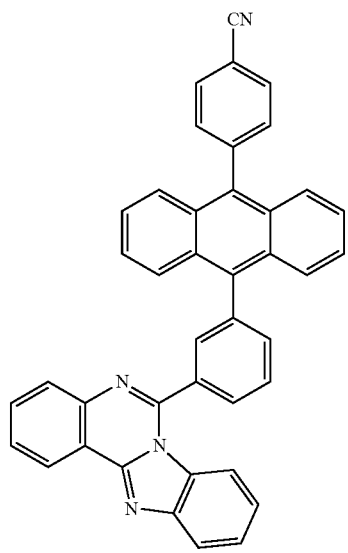
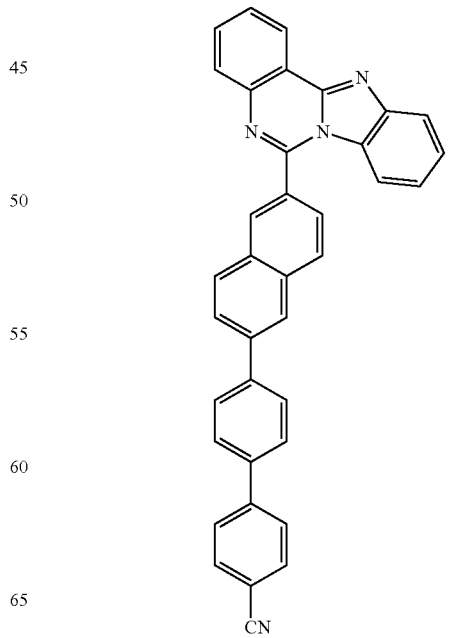

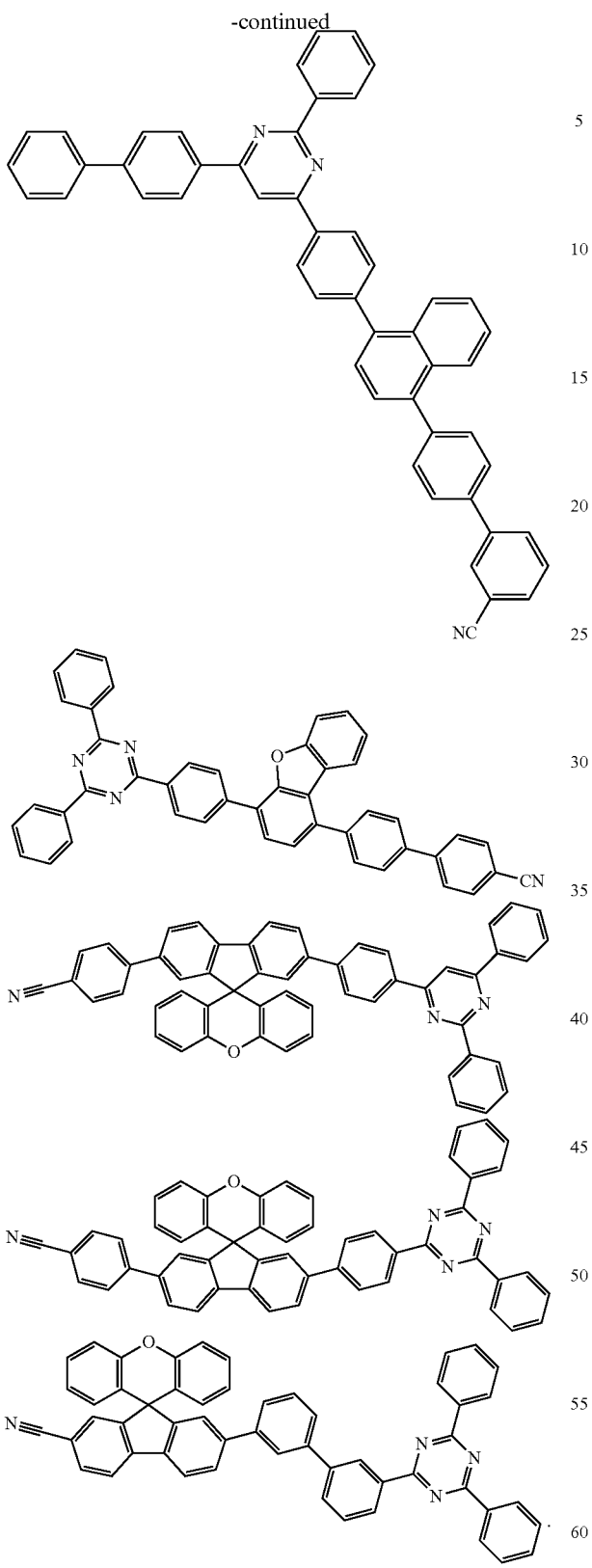

an electron injection layer, an electron transfer layer, an electron injection and transfer layer, or an electron control layer provided between the cathode and the light emitting layer, wherein the light emitting layer comprises a compound of the following Chemical Formula 1; and the electron injection layer, the electron transfer layer, the electron injection and transfer layer, or the electron control layer provided between the cathode and the light emitting layer comprises a compound of the following Chemical Formula 2:

Chemical Formula 1

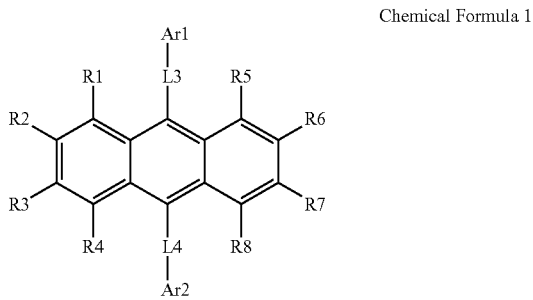

wherein in Chemical Formula 1:
L3 is a direct bond or a substituted or unsubstituted arylene group, or bonds to R1 to form a substituted or unsubstituted ring;
L4 is a direct bond or a substituted or unsubstituted arylene group;
Ar1 and Ar2 are the same as or different from each other, and each independently is hydrogen, deuterium, a substituted or unsubstituted aryl group, or a substituted or unsubstituted heteroaryl group;
R1 is hydrogen, deuterium, a substituted or unsubstituted alkyl group, —OR, —SiRaRbRc, —OSiRaRbRc, a substituted or unsubstituted aryl group, or —NRmRn, or bonds to L3 to form a substituted or unsubstituted ring;
R2 to R8 are the same as or different from each other, and each independently is hydrogen, deuterium, a substituted or unsubstituted alkyl group, —OR, —SiRaRbRc, —OSiRaRbRc, a substituted or unsubstituted aryl group, or —NRmRn;
R, Ra, Rb, Rc, Rm and Rn are the same as or different from each other, and each independently is hydrogen, deuterium, an alkyl group, or an aryl group; and
the compound of Chemical Formula 1 comprises at least one deuterium;

Chemical Formula 2

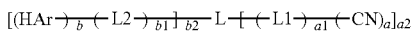

HAr is a substituted or unsubstituted carbazolyl group, a substituted or unsubstituted imidazolyl group, a substituted or unsubstituted benzimidazolyl group, a substituted or unsubstituted phenanthrolinyl group, a substituted or unsubstituted benzo[4,5]imidazo[1,2-c]quinazolinyl group, a substituted or unsubstituted benzo[4,5]imidazo[1,2-f]-phenanthridinyl group, or a substituted or unsubstituted spiro[fluorene-9,8'-indolo[3,2,1-di]acridinyl] group;

10. An organic light emitting device, comprising:
an anode;
a cathode;
a light emitting layer provided between the anode and the cathode; and L is a direct bond, —O—, a substituted or unsubstituted divalent to tetravalent aryl group, or a substituted or unsubstituted divalent to tetravalent heteroaryl group;

L1 and L2 are the same as or different from each other, and each independently is a direct bond, a substituted or unsubstituted arylene group, or a substituted or unsubstituted heteroarylene group;

a1 is an integer of 0 to 3, and when a1 is 2 or greater, the L1s are the same as or different from each other;

b1 is an integer of 0 to 3, and when b1 is 2 or greater, the L2s are the same as or different from each other;

a is 1 or 2;

b is 1 or 2, and when b is 2, the HArs are the same as or different from each other;

a2 is 1 or 2, and b2 is 1 or 2;

when a2 is 2, the -[(L1)$_{a1}$-(CN)$_a$]s are the same as or different from each other; and when b2 is 2, the -[(L2)$_{b1}$-(HAr)$_b$]s are the same as or different from each other.

11. The organic light emitting device of claim 10, wherein at least one of R1 to R8 is deuterium.

12. The organic light emitting device of claim 10, wherein at least one of L3 and L4 is deuterated.

13. The organic light emitting device of claim 10, wherein at least one of Ar1 and Ar2 is deuterium or a deuterated aryl group.

14. The organic light emitting device of claim 10, wherein Ar1 and Ar2 are the same as or different from each other, and each independently is hydrogen, deuterium, a phenyl group that is unsubstituted or substituted with deuterium, a naphthylphenyl group that is unsubstituted or substituted with deuterium, a biphenyl group that is unsubstituted or substituted with deuterium, a naphthyl group that is unsubstituted or substituted with deuterium, a phenanthrenyl group that is unsubstituted or substituted with deuterium, a fluoranthenyl group that is unsubstituted or substituted with deuterium, a phenylpyridinyl group that is unsubstituted or substituted with deuterium, a dibenzofuranyl group that is unsubstituted or substituted with deuterium, a dibenzothiophenyl group that is unsubstituted or substituted with deuterium, or a benzonaphthothiophenyl group that is unsubstituted or substituted with deuterium.

15. The organic light emitting device of claim 10, wherein:
a is 2; or
b is 2.

16. The organic light emitting device of claim 10, wherein the compound of Chemical Formula 2 is any one compound selected from among the following compounds:

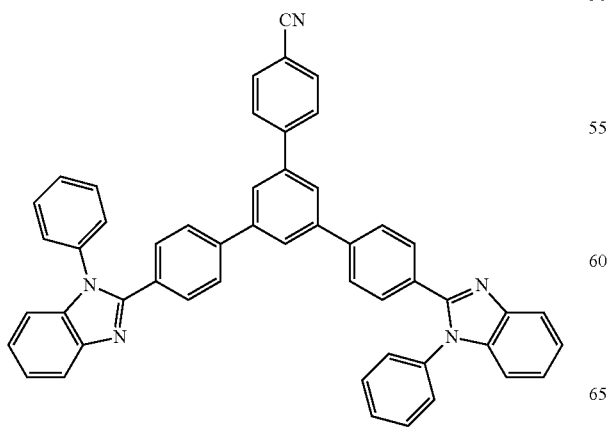

-continued

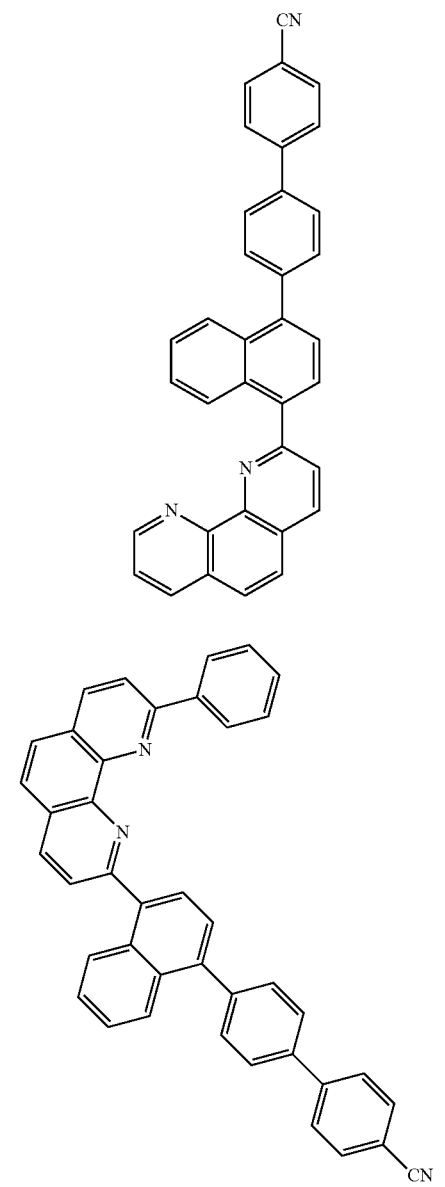

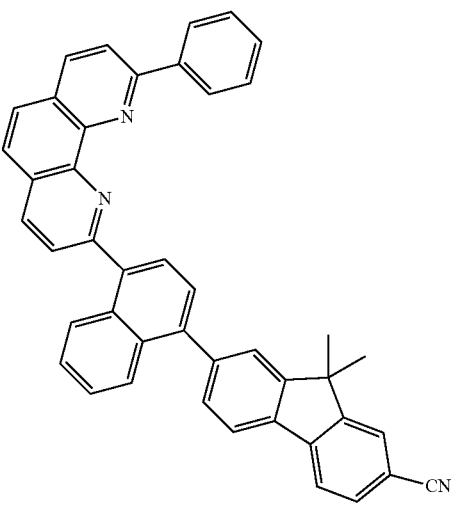

97
-continued
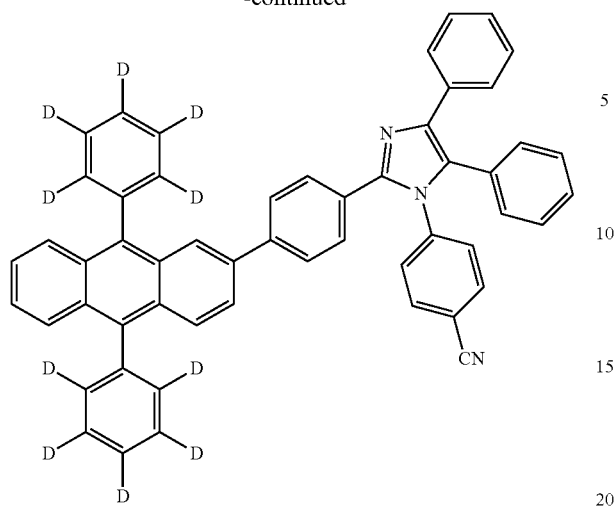
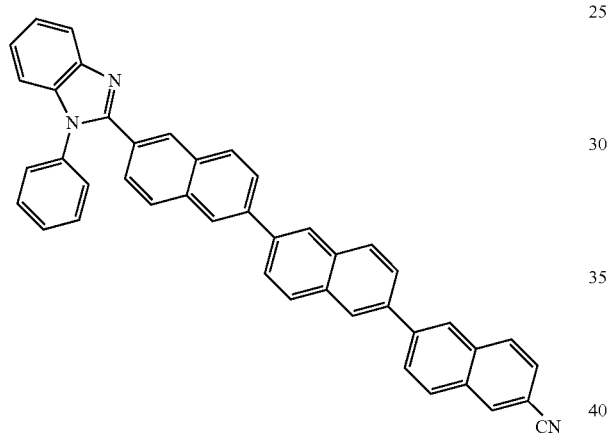
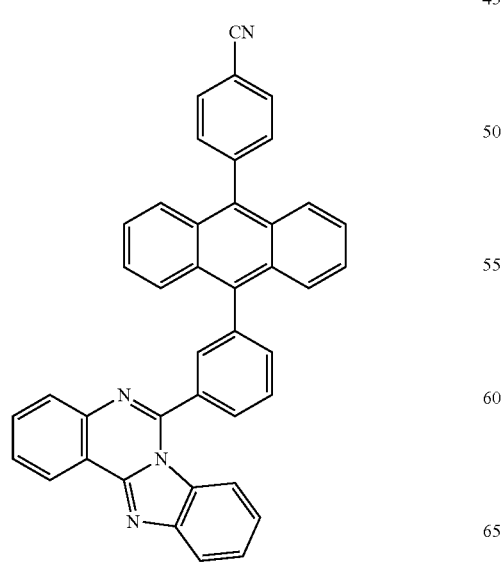
98
-continued
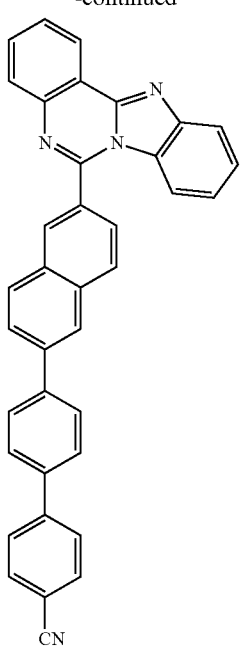
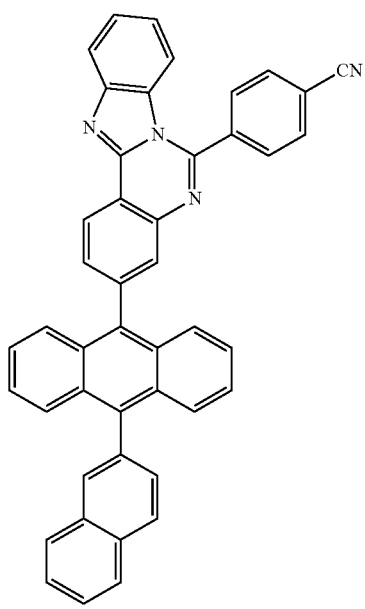

99
-continued
100
-continued
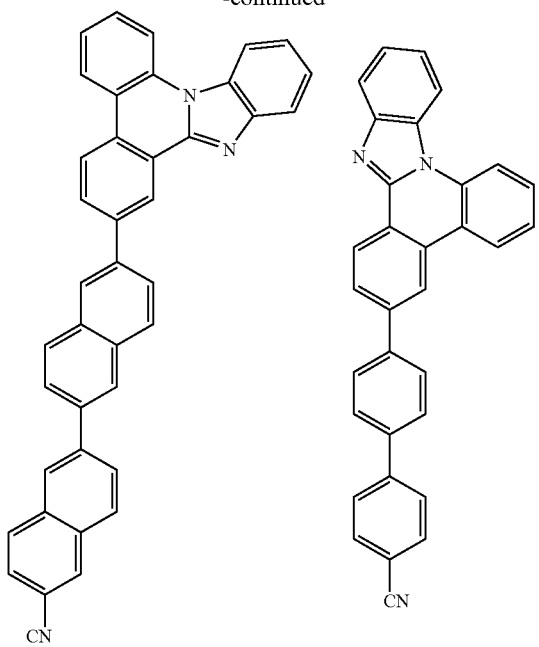
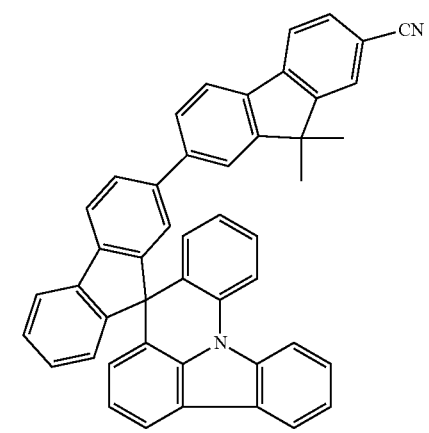
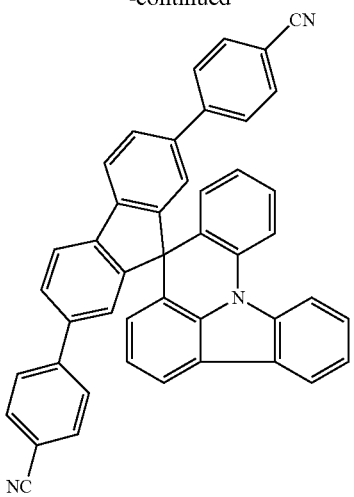
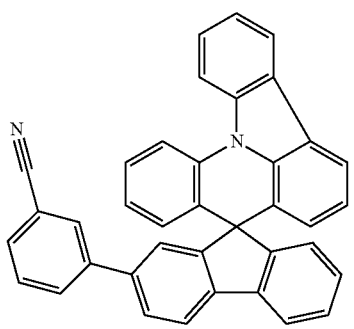
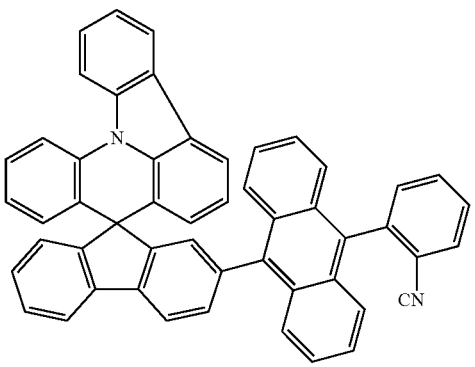
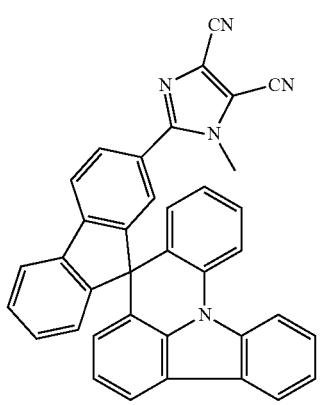

101
-continued
102
-continued
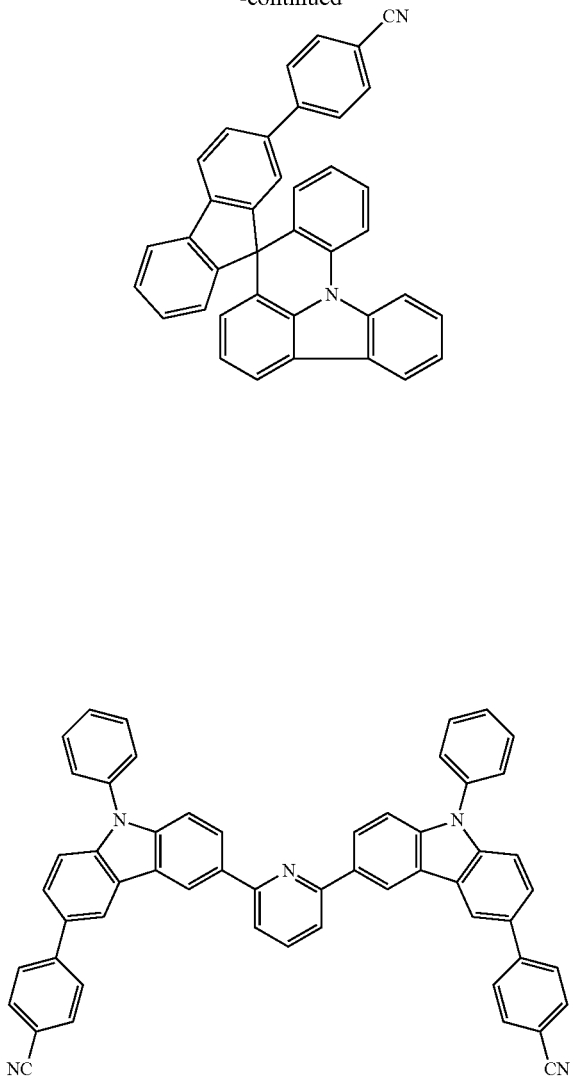
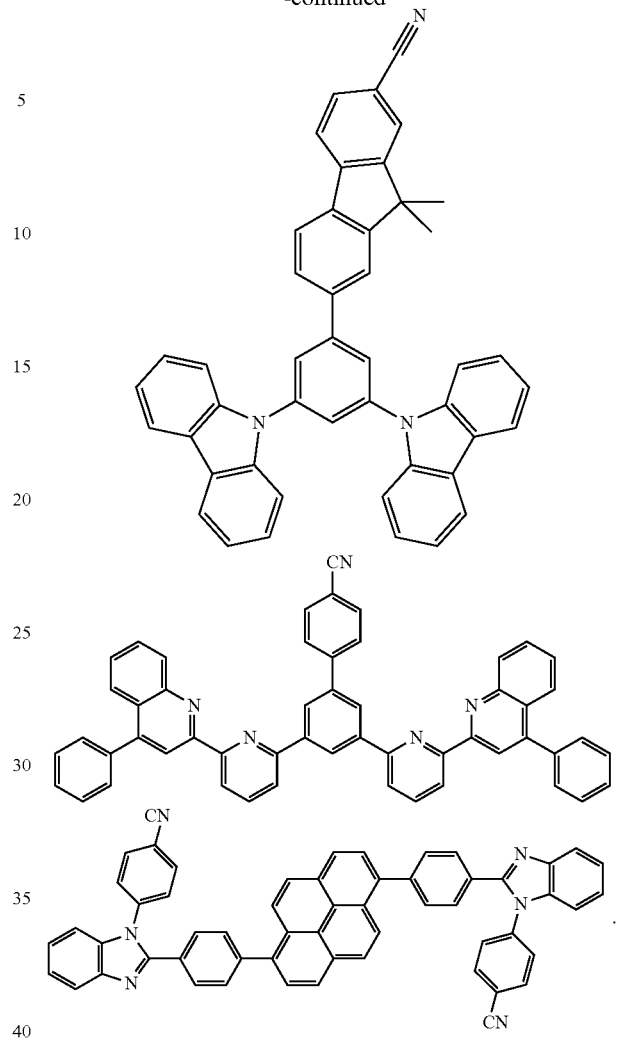
* * * * *